United States Patent [19]
Taniguchi et al.

[11] Patent Number: 5,828,260
[45] Date of Patent: Oct. 27, 1998

[54] OUTPUT BUFFER CIRCUIT

[75] Inventors: Hideki Taniguchi; Katsushi Asahina, both of Tokyo, Japan

[73] Assignee: Mitsubishi Denki Kabushiki Kaisha, Tokyo, Japan

[21] Appl. No.: 648,957

[22] Filed: May 16, 1996

[30] Foreign Application Priority Data

Jul. 12, 1995 [JP] Japan ................................. 7-176084
Dec. 25, 1995 [JP] Japan ................................. 7-337065

[51] Int. Cl.$^6$ .................................................. H03K 17/16
[52] U.S. Cl. ........................ 327/387; 327/391; 327/333
[58] Field of Search .................................. 327/198, 387, 327/388, 389, 391, 392, 398, 333

[56] References Cited

U.S. PATENT DOCUMENTS

| | | | |
|---|---|---|---|
| 4,506,164 | 3/1985 | Higuchi | 307/264 |
| 4,591,745 | 5/1986 | Shen | 327/392 |
| 5,422,592 | 6/1995 | Asahina | 327/427 |
| 5,650,742 | 7/1997 | Hirano | 327/391 |

FOREIGN PATENT DOCUMENTS 1 43464 9/1989 Japan .
5 335504 12/1993 Japan .

*Primary Examiner*—Timothy P. Callahan
*Assistant Examiner*—Jung Ho Kim
*Attorney, Agent, or Firm*—Oblon, Spivak, McClelland, Maier & Neustadt, P.C.

[57] ABSTRACT

A detecting penetration current causing logic part (12a) gives, when the logic is H level at both nodes (N15, N24), the logical product thereof H to a condition adding part (12b) as an activated detection signal. In the condition adding part (12b), it is confirmed that the activation of the detection signal is longer than a specified time, by a delay circuit (G21) and NAND gate (G22). Consequently, logic H is given to a forced logic presenting part (12c). In the forced logic presenting part (12c), NMOS transistors (Q13, Q14) are turned on, and logic L is given by force to both nodes (N15, N24) to get out of a state where a current would flow.

29 Claims, 42 Drawing Sheets

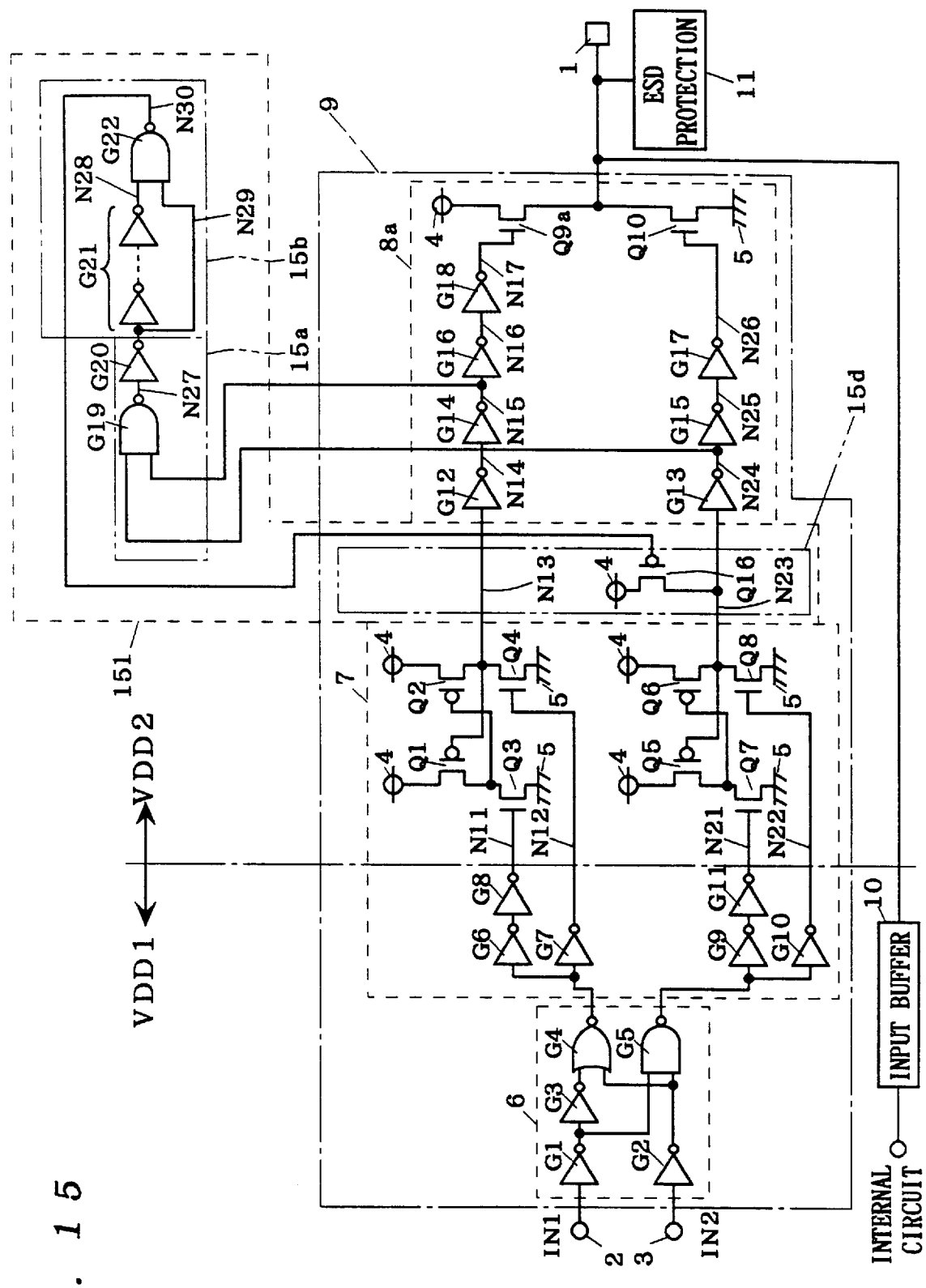
F I G. 15

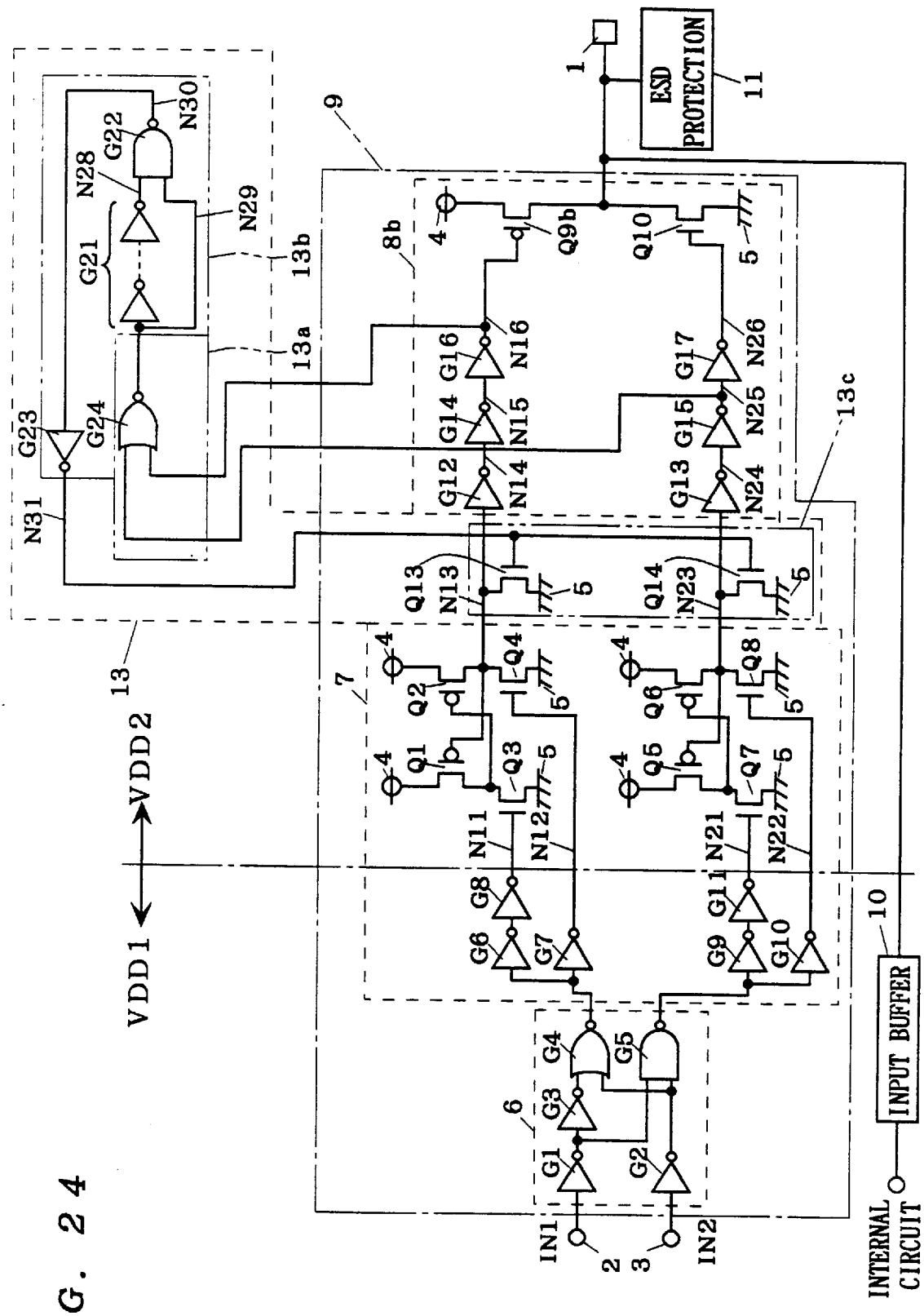
F I G. 2 4

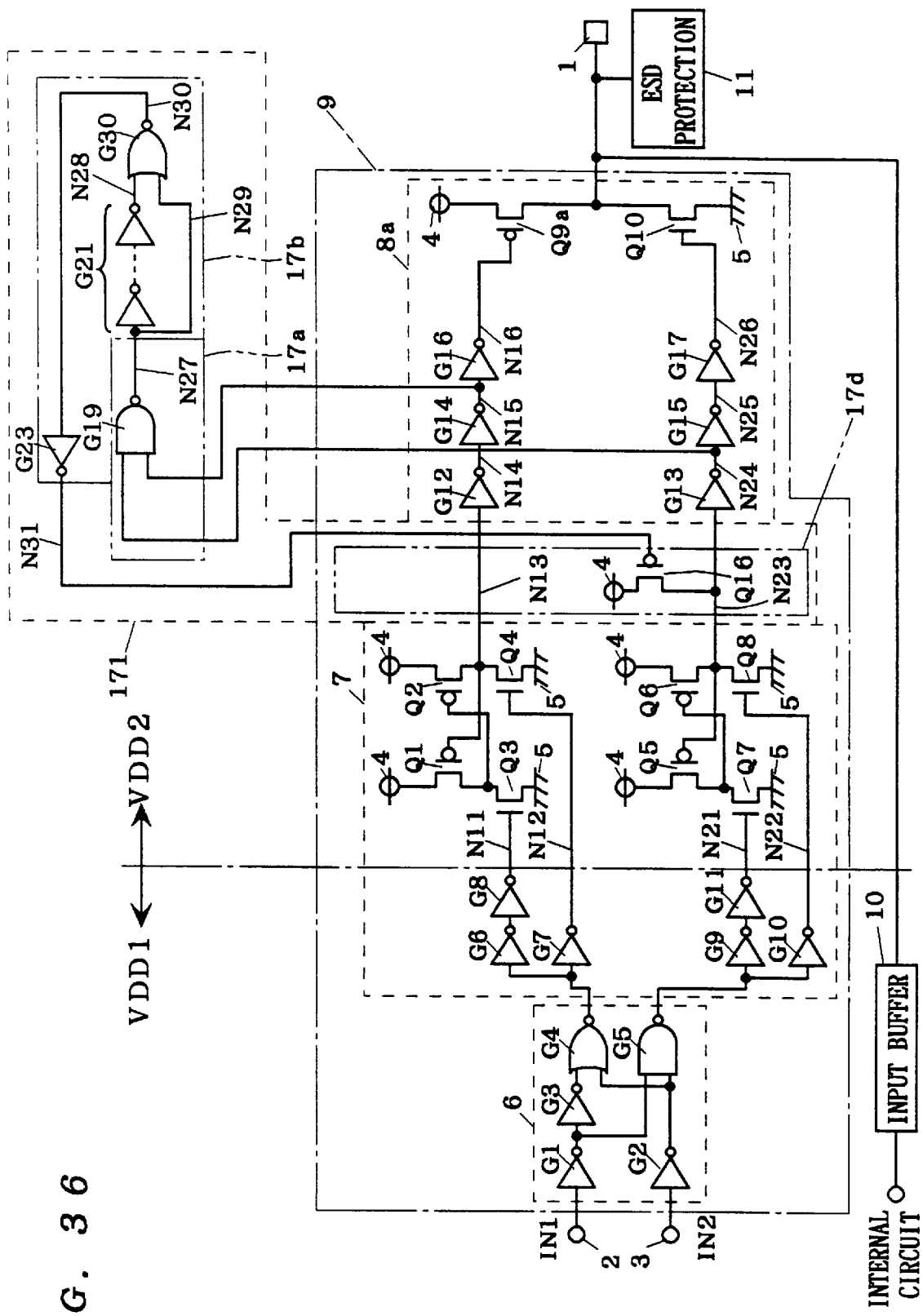
F I G. 3 6

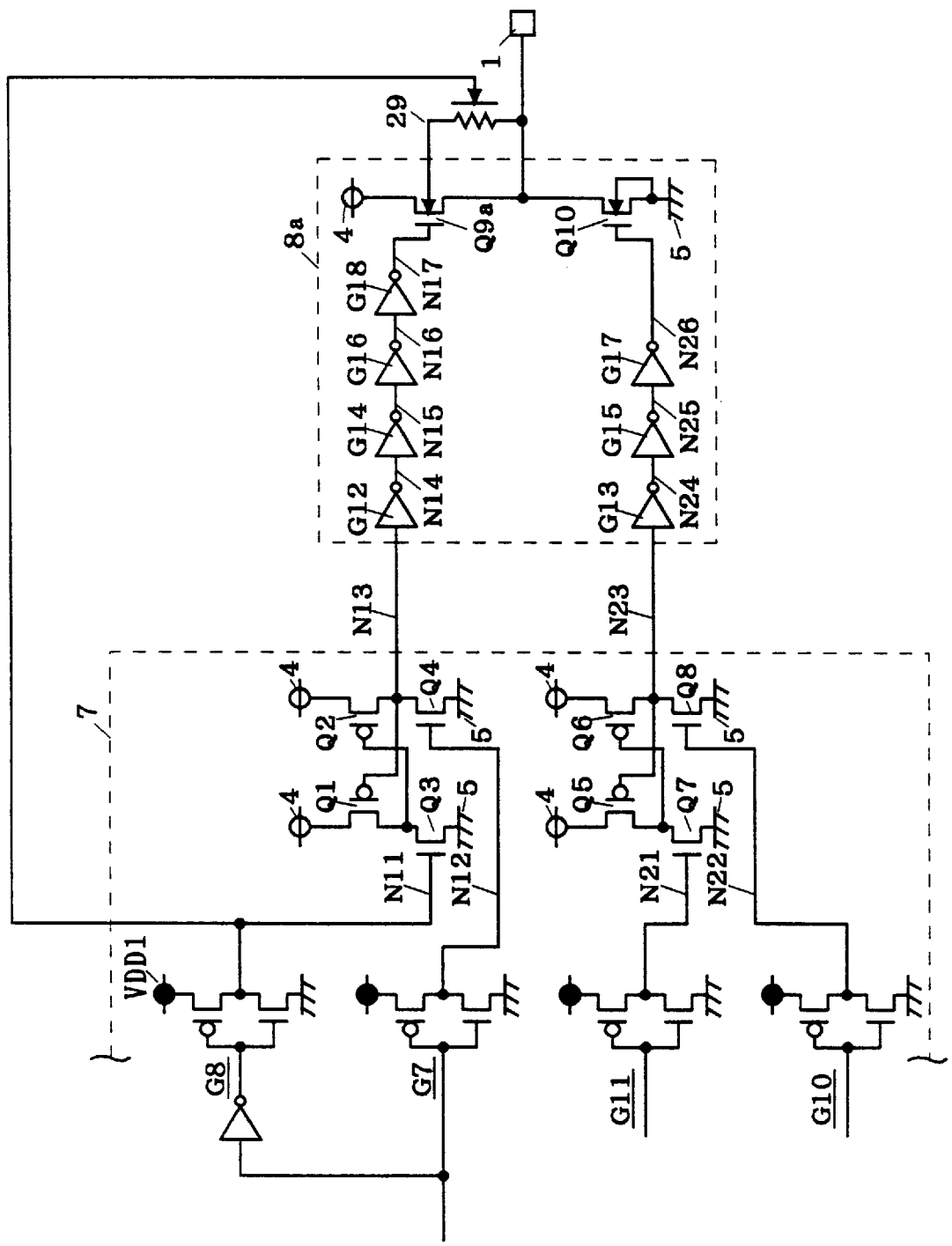
F I G. 4 3

5,828,260

1

OUTPUT BUFFER CIRCUIT

BACKGROUND OF THE INVENTION

1. Field of the Invention

The present invention relates to an output buffer having a pair of MOS transistors provided at a final stage.

2. Description of the Background Art

FIG. 44 is a circuit diagram showing an example of constitution of input and output circuits of a conventional semiconductor integrated circuit device with a signal level converting function.

A semiconductor integrated circuit with a signal level converting function is a semiconductor integrated circuit device having a function of converting the level of signal voltage supplied from a device operating by a supply voltage in the LSI, and outputting to an external circuit operating by a supply voltage different from the supply voltage of the circuit (internal circuit)in the LSI, and a function of converting the signal supplied by an external device of different supply voltage system into a signal level of an internal circuit, and transmitting inside.

To an input and output terminal 1, an internal circuit is connected through an input buffer 10. Through an output buffer circuit 9, the input and output terminal 1 is also connected with a control terminal 2 for receiving a control signal IN1 from the internal circuit, and an input terminal 3 for receiving an output signal IN2 from the internal circuit.

The output buffer circuit 9 comprises an input and output control circuit 6, a signal level converting circuit 7, and a buffer circuit 8a, and the control terminal 2 and input terminal 3 are connected to the input and output control circuit 6. The input and output control circuit 6 sends an output to the signal level converting circuit 7, and the signal level converting circuit 7 sends an output to the buffer circuit 8a through connection points N13, N23.

In the input and output control circuit 6 and a front half of the signal level converting circuit 7, a first supply potential VDD1 and a grounding potential GND which determine a supply voltage of the internal circuit, are applied to put them into action. On the other hand, in a rear half of the signal level converting circuit 7 and the buffer circuit 8a, a second supply potential VDD2 higher than the first supply potential VDD1 and grounding potential GND are applied to put them in action. The second supply potential VDD2 and grounding potential GND are supplied respectively from a supply potential point 4 and a grounding potential point 5.

When the control signal IN1 is at H level, the connection points N13 and N14 are respectively L level (grounding potential) and H level (second supply potential VDD2) by means of the signal level converting circuit 7, whether the output signal IN2 is at L level or H level. Consequently, both transistors Q9a and Q10 of the buffer circuit 8a are turned off, and the buffer circuit 8a comes in high impedance state relative to the input and output terminal 1. As a result, the signal from the outside given to the input and output terminal I is transmitted to the input buffer 10 without damage.

On the other hand, when the control signal IN1 is at L level, provided the output signal IN2 is at L level, the connection points N13 and N14 are both at L level by means of the signal level converting circuit 7. Consequently, the transistors Q9a and Q10 of the buffer circuit 8a are respectively turned off and on, so that L level is issued to the input and output terminal 1.

2

When the control signal IN1 is at L level and output signal IN2 is at H level, the connection points N13 and N14 are both at H level by means of the signal level converting circuit 7. Consequently, the transistors Q9a and Q10 of the buffer circuit 8a are respectively turned on and off, so that H level is issued to the input and output terminal 1.

FIG. 45 is a circuit diagram showing other example of constitution of input and output circuit of a conventional semiconductor integrated circuit device with signal level converting circuit. The constitution in FIG. 45 is similar to that in FIG. 44, except that the buffer circuit 8a is replaced by a buffer circuit 8b. In the buffer circuit 8b, inverter gate G18 and NMOS transistor Q9a in the buffer circuit 8a are replaced by a PMOS transistor Q9b.

In such constitution, too, it is evident that the operation as explained in relation to FIG. 44 is effected.

The conventional semiconductor integrated circuit devices with signal level converting function are thus constituted, and as far as the operation is normal, the set of potentials of the connection points N13 and N23 is any one of (H level and H level), (L level and L level), and (L level and H level).

However, when the first supply potential VDD1 is not applied in the initial state when the second supply potential VDD2 is turned on, the values of the parts of the signal level converting circuit 7 are not determined uniquely. For example, the set of potentials of the connection points N13 and N23 may be (H level and L level). Such status may give rise to a situation of turning on simultaneously the pair of transistors Q9a and Q10 (or Q9b and Q10), and hence flow of unnecessary current (penetration current) between the supply potential point 4 and grounding potential point 5 in the buffer circuit 8a (or 8b).

FIG. 46 is a schematic sectional view of structure of transistors Q9a, Q10 of the buffer circuit 8a. Both transistors Q9a and Q10 are of NMOS type, and are formed in P well provided with grounding potential GND.

Usually, in the NMOS transistor connected between a high potential and a low potential, the wiring is connected so that the potential of the well being formed (hereinafter called well potential) is at low potential.

However, when the well potential of the transistor Q9a is at the grounding potential GND, in the case the transistor Q9a is turned on, the potential of the source S climbs up, and a bias voltage is applied between the source S and well W.

In the absence of the bias voltage, in the case of the transistor Q9a of E (Enhancement) type, when the well potential is set to the grounding potential GND, the second supply potential VDD2 (V) is applied to the gate electrode G, and the second supply potential VDD2 (V) is applied to the drain D, the potential of the source S (input and output terminal 1) is (VDD2−VTN) (V), where VTN is the threshold voltage of the NMOS transistor Q9.

When the bias voltage is applied, on the other hand, the VTN is shifted to the positive direction to be VTN' (VTN'>VTN), and the drain current decreases. Therefore, the potential of the input and output terminal 1 becomes (VDD2−VTN') (V), and hence the output potential of H level is lower than that without the bias voltage.

FIG. 47 is a schematic sectional view showing the structure of transistors Q9b, Q10 of the buffer circuit 8b. The transistors Q9b and Q10 are respectively of PMOS type and NMOS type. Hence, the transistor Q9b is formed in the n-well provided with the second supply potential VDD2, and the well potential is set at the second supply potential VDD2. Hence, the problem caused in the transistor Q9a is avoided.

SUMMARY OF THE INVENTION

A first aspect of the present invention relates to an output buffer comprising (a) first and second potential points for applying first and second potentials respectively, (b) an output point, (c) a first conductive control element having a control end given a third potential corresponding to either binary logic, for conducting and not conducting between the first potential point and the output point, when the third potential corresponds to a first logic and its complementary second logic, respectively, (d) a second conductive control end having a control element given a fourth potential corresponding to either binary logic, for conducting and not conducting between the second potential and the output point, when the fourth potential corresponds to a third logic and its complementary fourth logic, respectively, (e) detecting penetration current causing logic means for outputting a penetration detection signal activated when the third and fourth potentials correspond to the first and third logics respectively, and (f) forced logic presenting means fulfilling at least either one of a first logic presenting function for presenting by force the second logic to the control end of the first conductive control element, and a second logic presenting function for presenting by force the fourth logic to the control end of the second conductive control element, on the basis of activation of the penetration detection signal.

A second aspect of the present invention relates to an output buffer circuit of the first aspect, further comprising (g) condition adding means for fulfilling a function of the forced logic presenting means only when the penetration detection circuit is activated for more than a specific time.

A third aspect of the present invention relates to an output buffer circuit comprising (a) first and second wells formed on a substrate of a first conductive type, both being of a second conductive type complementary to the first conductive type, (b) a first MOS transistor formed in the first well, having a drain and a source both of the first conductive type, a well electrode of the second conductive type for applying a potential to the first well, and a gate electrode, (c) a second MOS transistor formed in the second well, having a drain and source both of the first conductive type, a well electrode of the second conductive type for applying a potential to the second well, and a gate electrode, (d) an output terminal connected commonly to the source of the first MOS transistor, and the drain of the second MOS transistor, (e) a first potential point for applying a first potential to the drain of the first MOS transistor, and (f) a second potential point for applying a second potential different from the first potential, commonly to the source of the second MOS transistor and the well electrode of the second MOS transistor, wherein the well electrode of the first MOS transistor is connected to the output terminal.

A fourth aspect of the present invention relates to an output buffer circuit of the third aspect, wherein the well electrode of the first MOS transistor is connected to the output terminal through a current limiting element for limiting a current flowing in itself.

A fifth aspect of the present invention relates to an output buffer circuit of the fourth aspect, wherein the current limiting element has a variable resistance value, presenting a first resistance value when at least one of the first MOS transistor and second MOS transistor is turned on, and a second resistance value larger than the first resistance value when both the first MOS transistor and second MOS transistor are turned off.

According to the first aspect of the output buffer circuit of the present invention, the detecting penetration current causing logic means detects that such logic as to conduct both first and second conductive control elements is applied, and activates the penetration detection circuit. The forced logic presenting means applies by force a specific logic to the control end of the first and second conductive control elements, on the basis of activation of the penetration detecting circuit, and does not conduct at least any one of the first and second conductive control elements.

Therefore, penetration current is prevented from flowing between the first and second conductive control elements.

According to the second aspect of the output buffer circuit of the present invention, the condition adding means exhibits a function of forced logic presenting means, by the addition condition that the logic to conduct both the first and second conductive control elements continues for a specific time.

Therefore, the forced logic presenting means is prevented from functioning due to transient delay at the time of switching.

According to the third aspect of the output buffer circuit of the present invention, the well electrode of the first MOS transistor is connected to the output terminal, and hence a bias voltage is not applied between the well and source of the first MOS transistor if the first MOS transistor is turned on. Accordingly, it is free from phenomenon of elevation of threshold voltage of the first MOS transistor, such as the case of the well electrode of the first MOS transistor being connected to the second potential.

Therefore, as the first MOS transistor is turned on, the potential given to the output terminal is brought closer to the first potential, and the level difference of the potential at the output terminal can be increased.

According to the fourth aspect of the output buffer circuit of the present invention, a bias voltage may be applied to the substrate by applying a third potential closer to the second potential than the first potential. In such a circumstance, as the first MOS transistor is turned on, a potential near the first potential may be applied to the output terminal. In this case, the current flowing between the first well and substrate is limited by the current limiting element.

Therefore, unnecessary current may be suppressed.

According to the fifth aspect of the output buffer circuit of the present invention, the current limiting element may enhance the resistance between the first well and output terminal depending on the case.

Therefore, the output terminal may be kept in high impedance state when it is not necessary to connect either first potential point or second potential point to the output terminal.

To solve the problems, it is therefore an object of the present invention to provide an output buffer circuit capable of getting out of the status automatically when a potential corresponding to the logic for flowing penetration current is applied.

It is a further object of the invention to provide an output buffer circuit capable of expanding the potential difference corresponding to the complementary logic level.

These and other objects, features, aspects and advantages of the present invention will become more apparent from the following description of the present invention when taken in conjunction with the accompanying drawings.

BRIEF DESCRIPTION OF THE DRAWINGS

FIG. 15 is a circuit diagram showing a constitution of a modification of the fourth preferred embodiment of the invention.

FIG. 24 is a circuit diagram showing a constitution of an eighth preferred embodiment of the invention.

FIG. 36 is a circuit diagram showing a constitution of a modification of the twelfth preferred embodiment of the invention.

FIG. 43 is a circuit diagram showing a constitution of a nineteenth preferred embodiment of the invention.

DESCRIPTION OF THE PREFERRED EMBODIMENTS

First preferred embodiment

Figure 1:
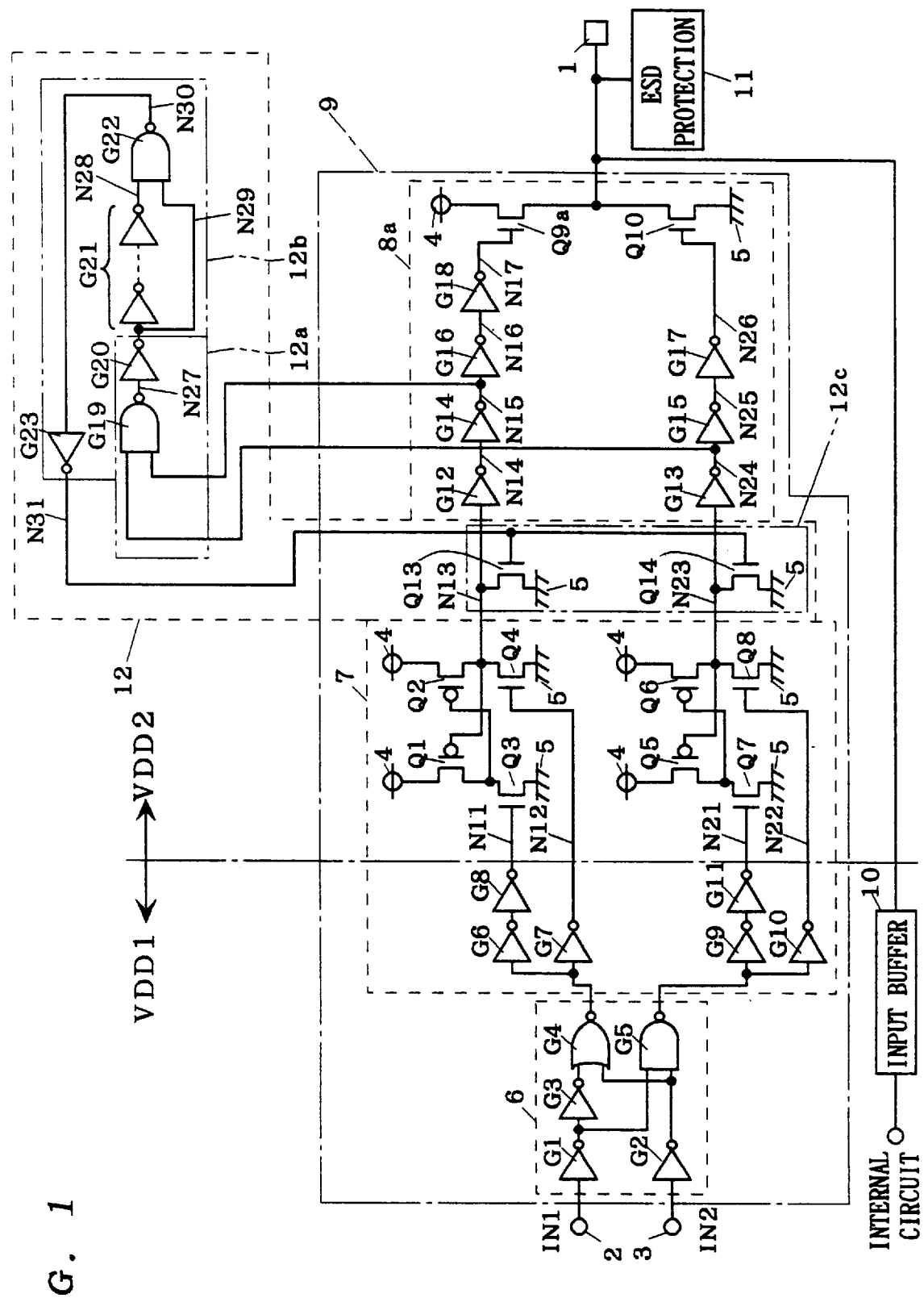
FIG. 1 is a circuit diagram showing a constitution of a first preferred embodiment of the invention.

FIG. 1 is a circuit diagram showing a constitution of an input and output circuit of a semiconductor integrated circuit device with signal level converting function according to a first preferred embodiment of the present invention.

To an input and output terminal 1, an internal circuit is connected through an input buffer 10. Through an output buffer circuit 9, the input and output terminal 1 is also connected with a control terminal 2 for receiving a control signal IN1 from the internal circuit, and an input terminal 3 for receiving an output terminal IN2 from the internal circuit. Further an ESD (Electro Static Discharge) protection 11 is connected to the input and output terminal 1.

The ESD (Electro Static Discharge) protection 11 is in low impedance state when an external input signal of excessively high potential is entered from the input and output terminal 1, and is in high impedance state when an external input signal of low potential or operating voltage is entered, thereby functioning to protect the input and output circuit from electrostatic breakdown. The ESD (Electro Static Discharge) protection 11 may be formed in a structure of combining resistance elements using junction diode, diffusion region, and polysilicon layer on a substrate.

In FIG. 1, "VDD1<-" indicates the range of the circuit driven by a first supply potential VDD1 which determines a supply voltage of the internal circuit, and "VDD2->-" indicates the range of the circuit driven by second supply potential VDD2. A supply potential point 4 feeds the second supply potential VDD2, and a grounding potential point 5 feeds a grounding potential GND. Herein, there is a relation of VDD2>VDD1>GND.

An input buffer circuit 10 is composed of a circuit for converting the signal level from an external input signal of which H level and L level are defined by the second supply potential VDD2 and grounding potential GND, into a signal of which H level and L level are defined by the first supply potential VDD1 and grounding potential GND, and an input driver circuit.

The output buffer circuit 9 is composed of an input and output control circuit 6, a signal level converting circuit 7, and a buffer circuit 8a, and the control terminal 2 and input terminal 3 are connected to the input and output control circuit 6.

The input and output control circuit 6 is composed of inverter gates G1, G2, G3, two-input NOR gate G4, and two-input NAND gate G5, and an input and output control circuit of tri-state type is composed.

The input ends of the inverter gates G1, G2 are respectively connected to the control terminal 2 and input terminal 3. The input end of the inverter gate G3 is connected to the output end of the inverter gate G1. The first and second input ends of the NOR gate G4 are connected respectively to the output end of the inverter gate G3 and the output end of the inverter gate G2. The first and second input ends of the NAND gate G5 are respectively connected to the output end of the inverter gate G1 and the output end of the inverter gate G2.

The signal level converting circuit 7 constitutes a latch type signal level converting circuit with inverter gates G6 to G11, PMOS transistors Q1, Q2, Q5, Q6, and NMOS transistors Q3, Q4, Q7, Q8.

The input ends of the inverter gates G6, G7 are both connected to the output end of the NOR gate G4, and the input end of the inverter gate G8 is connected to the output end of the inverter gate G6.

The input ends of the inverter gates G9, G10 are both connected to the output end of the NAND gate G5, and the input end of the inverter gate G11 is connected to the output end of the inverter gate G9.

The source electrode of the PMOS transistor Q1 is connected to the supply potential point 4, the gate electrode to the connection point N13, and the drain electrode to the drain electrode of the NMOS transistor Q3, respectively. The source electrode of the PMOS transistor Q2 is connected to the supply potential point 4, the gate electrode to the drain electrode of the NMOS transistor Q3, and the drain electrode to the connection point N13, respectively. The source electrode of the NMOS transistor Q3 is connected to the grounding potential point 5, the gate electrode to the output end of the inverter gate G8 through the connection point N11, and the drain electrode to the drain electrode of the PMOS transistor Q1, respectively. The source electrode of the NMOS transistor Q4 is connected to the grounding potential point 5, the gate electrode to the output end of the inverter gate G7 through the connection point N12, and the drain electrode to the connection point N13, respectively.

The source electrode of the PMOS transistor Q5 is connected to the supply potential point 4, the gate electrode to the connection point N23, and the drain electrode to the drain electrode of the NMOS transistor Q7, respectively. The source electrode of the PMOS transistor Q6 is connected to the supply potential point 4, the gate electrode to the drain electrode of the NMOS transistor Q7, and the drain electrode to the connection point N23, respectively. The source electrode of the NMOS transistor Q7 is connected to the grounding potential point 5, the gate electrode to the output end of the inverter gate G11 through the connection point N21, and the drain electrode to the drain electrode of the PMOS transistor Q5, respectively. The source electrode of the NMOS transistor Q8 is connected to the grounding potential point 5, the gate electrode to the output end of the inverter gate G10 through the connection point N22, and the drain electrode to the connection point N23, respectively.

The input and output control circuit 6 and the front half of the signal level converting circuit 7 (the portion composed of inverter gates G6 to G11) are provided with the first supply potential VDD1 and grounding potential GND, and then put into operation. On the other hand, the rear half of the signal level converting circuit 7 (the portion composed of MOS transistors Q1 to Q8) and the buffer circuit 8a are provided with second supply potential VDD2 and grounding potential GND, and then put into operation.

The inverter gates G1 to G3, and G6 to G11 have CMOS structure, and are driven by the first supply potential VDD1 and grounding potential GND. The MOS transistors Q1 to Q8 are driven by the second supply potential VDD2 and grounding potential GND. To avoid insulation breakdown, the gate insulation film of the MOS transistors Q1 to Q8 is thicker than the gate insulation film of the MOS transistors for composing the inverter gates G1 to G3, G6 to G11.

The buffer circuit 8a is composed in push-pull circuit having inverter gates G12 to G18 possessing CMOS structure, and a final stage composed of NMOS transistors Q9a, Q10.

The input end of the inverter gate G12 is connected to the signal level converting circuit 7 through the connection point N13. The input end of the inverter gate G14 is connected to the output end of the inverter gate G12 through the connection point N14. The input end of the inverter gate G16 is connected to the output end of the inverter gate G14 through the connection point N15. The input end of the inverter gate G18 is connected to the output end of the inverter gate G16 through the connection point N16. The output end of the inverter gate G18 is connected to the gate electrode of the NMOS transistor Q9a. That is, even-number stages of inverter gates are interposed between the connection point N13 and the gate electrode of the NMOS transistor Q9a, and a potential corresponding to the same logic as the logic corresponding to the potential given to the connection point N13 is applied to the gate electrode of the NMOS transistor Q9a.

The input end of the inverter gate G13 is connected to the signal level converting circuit 7 through the connection point N23. The input end of the inverter gate G15 is connected to the output end of the inverter gate G13 through the connection point N24. The input end of the inverter gate G17 is connected to the output end of the inverter gate G15 through the connection point N25. The output end of the inverter gate G17 is connected to the gate electrode of the NMOS transistor Q10. That is, odd-number stages of inverter gates are interposed between the connection point N23 and the gate electrode of the NMOS transistor Q10, and a potential corresponding to the complementary logic to the logic corresponding to the potential applied to the connection point N23 is applied to the gate electrode of the NMOS transistor Q10.

The final stage of the buffer circuit 8a is composed of NMOS push-pull buffer. The source electrode of the NMOS transistor Q9a is connected to the input and output terminal 1, the gate electrode to the connection point N17, and the drain electrode to the supply potential point 4, respectively. The source electrode of the NMOS transistor Q10 is connected to the grounding potential point 5, the gate electrode to the connection point N26, and the drain electrode to the input and output terminal 1, respectively.

To avoid insulation breakdown, the gate insulation film of the MOS transistors for composing the inverter gates G12 to G18 and the MOS transistors Q9a, Q10 is thicker than the gate insulation film of the MOS transistors for composing the inverter gates G1 to G3 and G6 to G11.

A reset circuit 12 is composed of a detecting penetration current causing logic part 12a, condition adding part 12b, and forced logic presenting part 12c.

The detecting penetration current causing logic part 12a comprises a NAND gate G19 of which first input end is connected to the connection point N15 and second input end is connected to the connection point N24, and an inverter gate G20 connected to the output end of the NAND gate G19.

The condition adding part 12b comprises a delay circuit G21 composed of even-number stages of inverter gates connected to the output end of the inverter gate G20, a NAND gate G22 of which first input end is connected to the output end of the inverter gate G20 and second input end is connected to the output end of the delay circuit G21, and an inverter gate G23 connected to the output end of the NAND gate G22.

The forced logic presenting part 12c comprises NMOS transistors Q13 and Q14. The NMOS transistor Q13 has its source electrode connected to the grounding potential point 5, its gate electrode receives the output of the condition adding part 12b, and its drain electrode is connected to the connection point N13 to which the output of the signal level converting circuit 7 is applied. The NMOS transistor Q14 has its source electrode connected to the grounding potential point 5, its gate electrode receives the output of the condition adding part 12b, and its drain electrode is connected to the connection point N23 to which the output of the signal level converting circuit 7 is applied.

The reset circuit 12 is composed of MOS transistors, and the gate insulation film of each transistor is thicker than the gate insulation film of the MOS transistors for composing the inverter gates G1 to G11.

In thus constituted circuit, the operation is described below. The semiconductor integrated circuit device shown in FIG. 1 transmits a signal from the internal circuit of LSI into a device outside the LSI, while converting the signal level. That is, the signal supplied from the internal circuit of the LSI operating in the first power source level system in which the first supply potential VDD1 and grounding potential GND are supplied is converted in level, and is supplied into the device outside the LSI operating in the second power source system in which the second supply potential VDD2 and grounding potential GND are supplied.

Figure 4:
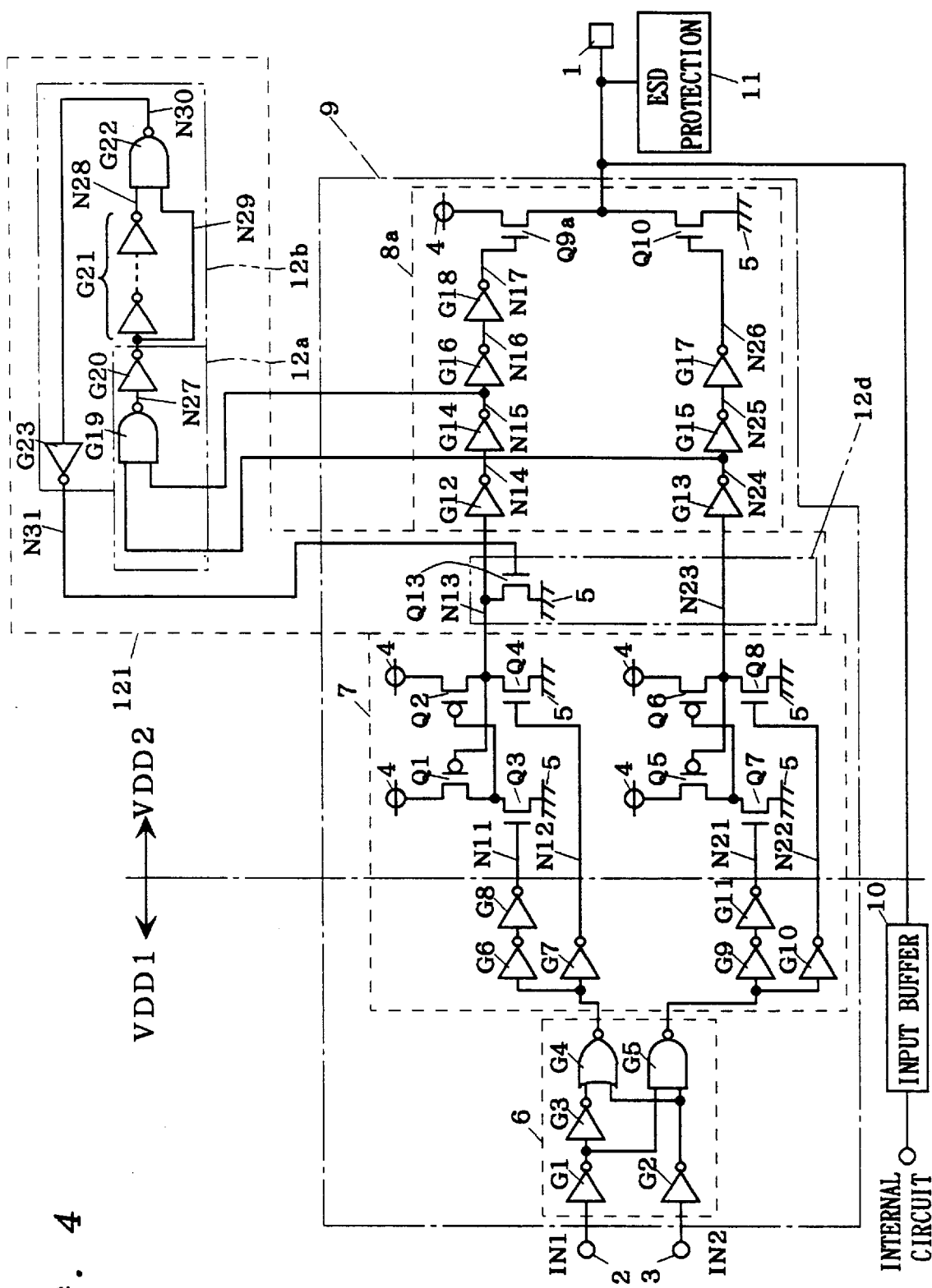
FIGS. 4 to 6 are circuit diagrams showing constitutions of modifications of the first preferred embodiment of the invention.

In ordinary operating state, both the first supply potential VDD1 and second supply potential VDD2 are applied. The operation of the circuit shown in FIG. 4 is sequentially as follows.

First suppose the control signal IN1 is at L level. When the output signal IN2 is at L level, the NOR gate G4 and NAND gate G5 of the input and output control circuit 6 both output L level. Therefore, NMOS transistors Q3, Q7 are turned off, and the NMOS transistors Q4, Q8 are turned on. Accordingly, the PMOS transistor Q1 is turned on, the PMOS transistor Q2 is turned off, the PMOS transistor Q5 is turned on, and the PMOS transistor Q6 is turned off.

By the on/off action of these transistors, L level is applied to the connection points N13, N23. Therefore, L level and H level are respectively given to the connection points N17, N26, and the NMOS transistor Q9a is turned off, the NMOS transistor Q10 is turned on, so that L level is applied to the input and output terminal 1.

In this case, L level and H level are respectively applied to the connection points N15, N24, and the detecting penetration current causing logic part 12a transmits the L level to the condition adding part 12b. Since the logic level of the connection point N29 is L, the logic levels of the connection points N30, N31, are respectively H and L. Hence, the NMOS transistors Q13, Q14 of the forced logic presenting part 12c are both turned off, and hence have no effect on the above operation.

Next, suppose the control signal IN1 is at L level, and the output signal IN2 at H level. The NOR gate G4 and NAND gate G5 of the input and output control circuit 6 both output H level. Therefore, the NMOS transistors Q3, Q7 are turned on, and the NMOS transistors Q4, Q8 are turned off. As a result, the PMOS transistor Q1 is turned off, the PMOS transistor Q2 is turned on, the PMOS transistor Q5 is turned off, and the PMOS transistor Q6 is turned on.

By the on/off action of these transistors, H level is given to both connection points N13, N23. Therefore, H level and L level are given respectively to the connection points N17, N26, and the NMOS transistor Q9a is turned on, the NMOS transistor Q10 is turned off, so that H level is applied to the input and output terminal 1.

In this case, H level and L level are given respectively to the connection points N15, N24, and the detecting penetration current causing logic part 12a transmits L level to the condition adding part 12b. Since the logic level of the connection point N29 is L, the logic levels of the connection points N30, N31 are respectively H and L. Hence, the NMOS transistors Q13, Q14 of the forced logic presenting part 12c are both turned off, and have no effect on the above operation.

In this way, when the control signal IN1 is at L level, the same logic level as the output signal IN2 is outputted to the input and output terminal 1.

On the other hand, when the control signal IN1 is at H level, whether the output signal IN2 is at H level or L level, the NOR gate G4 and NAND gate G5 of the input and output control circuit 6 respectively output L level and H level. Therefore, the NMOS transistors Q4, Q7 are turned on, and the NMOS transistors Q3, Q8 are turned off. Accordingly, the PMOS transistor Q1 is turned on, the PMOS transistor Q2 is turned off, the PMOS transistor Q5 is turned off, and the PMOS transistor Q6 is turned on.

By the on/off action of these transistors, L level and H level are respectively applied to the connection points N13, N23. Therefore, L level is given to both connection points N17, N26, and the NMOS transistors Q9a, Q10 are both turned off, and the input and output terminal 1 is set in high impedance state as seen from the external circuit.

If the second supply potential VDD2 is turned on without turning on the first supply potential VDD1, the logic level of the input and output control circuit 6 and the front half of the signal level converting circuit 7 operating in the first power source system is not determined, but the rear half of the signal level converting circuit 7 operating in the second power source level system transmits the logic level to the buffer circuit 8a.

At this time, there is no problem if the set of logic levels given to the connection points N13, N23 is any one of (H and H), (L and L), and (L and H), but it is possible to have (H and L), which causes the problem of flow of penetration current as mentioned above. The reset circuit 12 detects such state, and gives the logic level of (L and L) by force to the connection points N13, N23.

Figure 2:
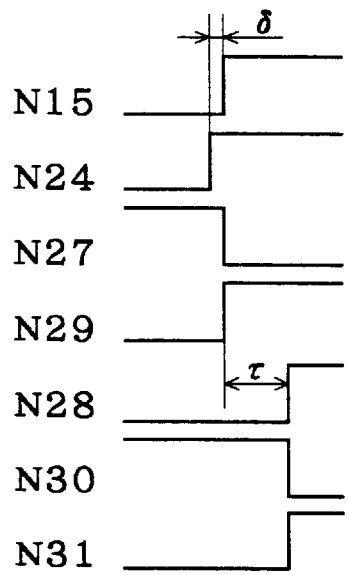
FIGS. 2 and 3 are timing charts showing the operation of the first preferred embodiment of the invention.

FIG. 2 is a timing chart showing the operation of the circuit when the logic levels given to the connection points N13, N23 at the time of turning on the second supply potential VDD2 are respectively H and L. In both connection points N15 and N24, H level is applied. In FIG. 2, considering there are two inverter gates existing from the connection point N13 to connection point N15, and one inverter gate existing from the connection point N23 to connection point N24, the transition of logic level of the connection point N15 is delayed by δ from the transition of logic level of the connection point N24.

Since H level is given to both connection points N15 and N24, the detecting penetration current causing logic part 12a transmits the penetration detection signal of H level to the condition adding part 12b. Since the delay circuit G21 is composed of even-number stages of inverter gates, after the specified delay time τ, the connection points N28, N29 are equalized in logic level to H. Hence, the logic levels of the connection points N30, N31 are respectively L and H, and the NMOS transistors Q13, Q14 of the forced logic presenting part 12c are both turned on. The grounding potential GND corresponding to logic L is applied to both sources of NMOS transistors Q13, Q14, and hence the logic level of the connection points N13, N23 is both forced to be L. Hence, the NMOS transistors Q9a, Q10 are respectively turned off and on, and the input and output terminal 1 is given L level. Therefore, penetration current does not flow.

FIG. 4 is a circuit diagram showing a modified constitution of this embodiment. In the diagram, as compared with FIG. 1, the reset circuit 12 is replaced by a reset circuit 121. The reset circuit 121 has the forced logic presenting part 12d replacing a forced logic presenting part 12c. The forced logic presenting part 12d is composed by omitting the NMOS transistor Q14 from the forced logic presenting part 12c.

The logic presented by the reset circuit 12 to the connection point N23 by force is L, in the case that penetration current would flow, however, the connection point N23 has been already provided with logic L before actuation of the reset circuit 12. Therefore, conduction or non-conduction of the NMOS transistor Q14 has no effect on the operation of the NMOS transistor Q10, and hence it can be omitted.

The condition adding part 12b has a function of adding a condition of "applying H level to the connection points N15, N24 continuously for more than delay time τ," aside from the condition of "applying H level to both connection points N15, N24," as the condition of applying H level to the connection point N31.

Figure 3:
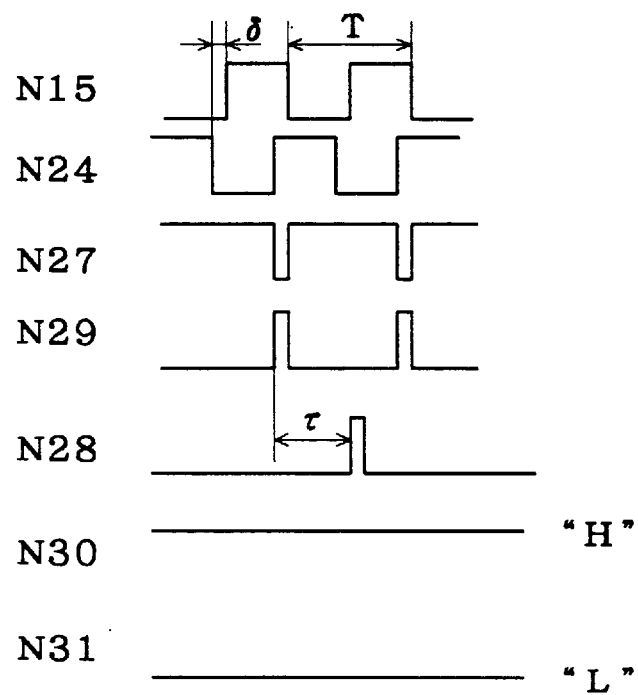

FIG. 3 is a timing chart showing the operation in ordinary running state in which both first supply potential VDD1 and second supply potential VDD2 are applied. In this case, the control signal IN1 is L, and the output signal IN2 is changing repeatedly to H level and L level in period T.

Herein, the logic level in the connection points N13, N23 repeats H level and L level in period T, and changes almost simultaneously. Therefore, at the connection points N15, N24, too, H level and L level are changed repeatedly in period T. However, the transition of logic at the connection point N15 is delayed by δ from the transition of logic at the connection point N24. Accordingly, in spite of normal operation, a pulse of width δ occurs at the connection point N27 due to transient switching.

This pulse, however, reaches the connection point N28 as being delayed by delay time τ by the delay circuit G21, and if the pulse width δ is shorter than the delay time τ, the logic levels of the connection points N30, N31 remain at H and L, respectively. That is, a slight gate delay that may possibly occur in ordinary operation can be ignored by the reset circuit 12. Therefore, it is not required to present forced logic unnecessarily.

To realize such desired action, it is preferred to set the delay time τ greater than the pulse width δ (this is the delay time derived from the gate delay). On the other hand, it is also preferred to set smaller than the period T. Otherwise, the logical product with the next pulse transmitted to the connection point N29 becomes H.

When a second supply potential VDD2 is applied while the first supply potential VDD1 is not applied, a logic level of (L, H) is presented by force to the connection points N13, N23 in the case the set of logic levels presented to the connection points N13, N23 is (H, L), and both NMOS transistors Q9a, Q10 can be turned off, so that the input and output terminal 1 may be held in high impedance state.

Figure 5:
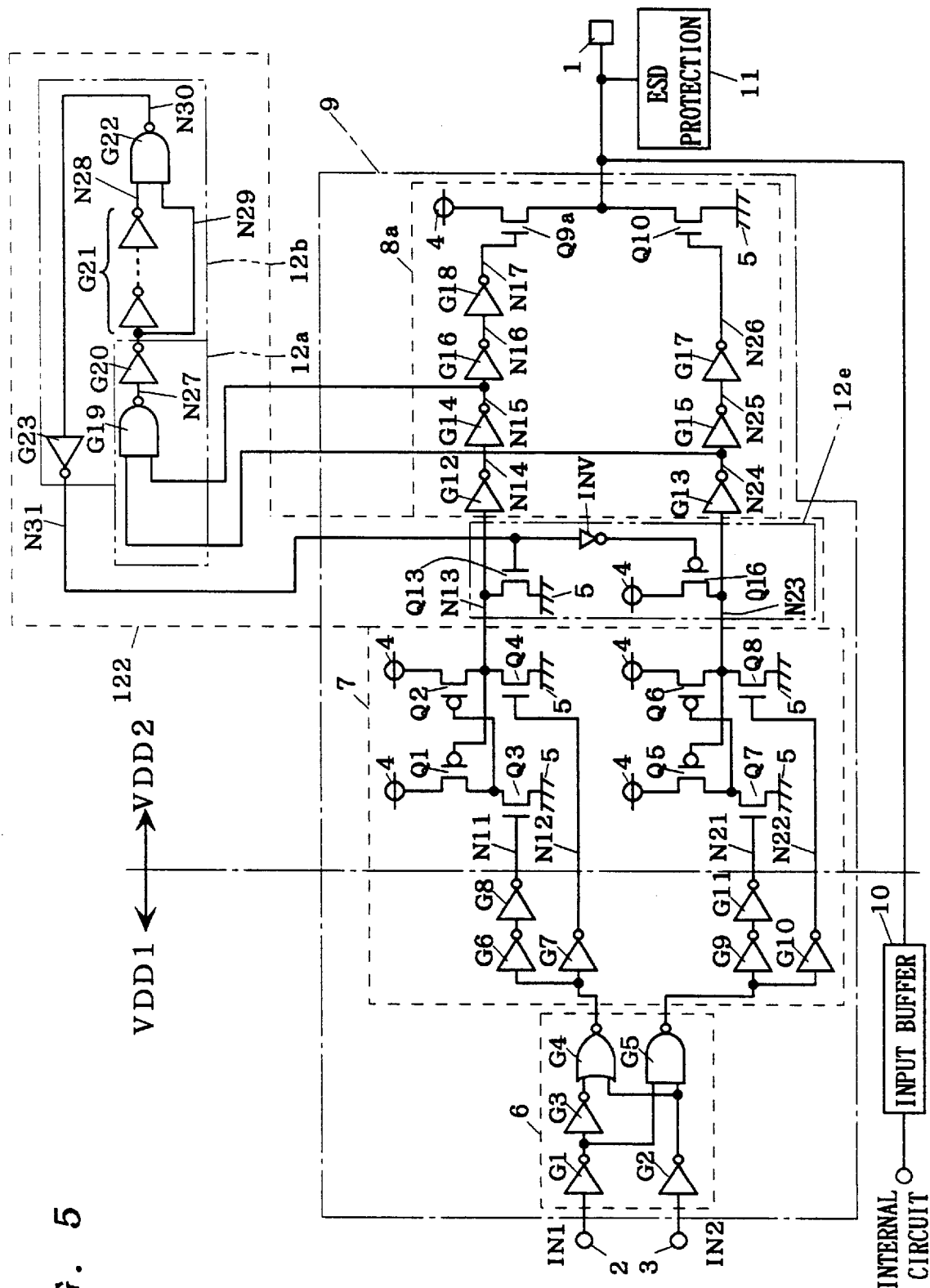

FIG. 5 is a circuit diagram showing a modified constitution of the embodiment for realizing this action. In the diagram, as compared with FIG. 1, the reset circuit 12 is replaced by a reset circuit 122. The reset circuit 122 has the forced logic presenting part 12e replacing a forced logic presenting part 12c. The forced logic presenting part 12e is composed by replacing the NMOS transistor Q14 of the forced logic presenting part 12c with a PMOS transistor Q16 and an inverter INV.

A connection point N31 is connected to the input end of the inverter gate INV, and the gate electrode of the PMOS transistor Q16 is connected to its output end. The source electrode of the PMOS transistor Q16 is connected to the supply potential point 4, and the drain electrode to the connection point N23, respectively.

When the NMOS transistor N13 is turned on, the PMOS transistor Q16 is also turned on. Therefore, if the second supply potential VDD2 is applied while the first supply potential VDD1 is not applied and the set of the logic levels applied to the connection points N13, N23 is (H, L), the reset circuit 122 maintains the input and output terminal 1 in high impedance state. Of course, penetration current does not flow.

Figure 6:
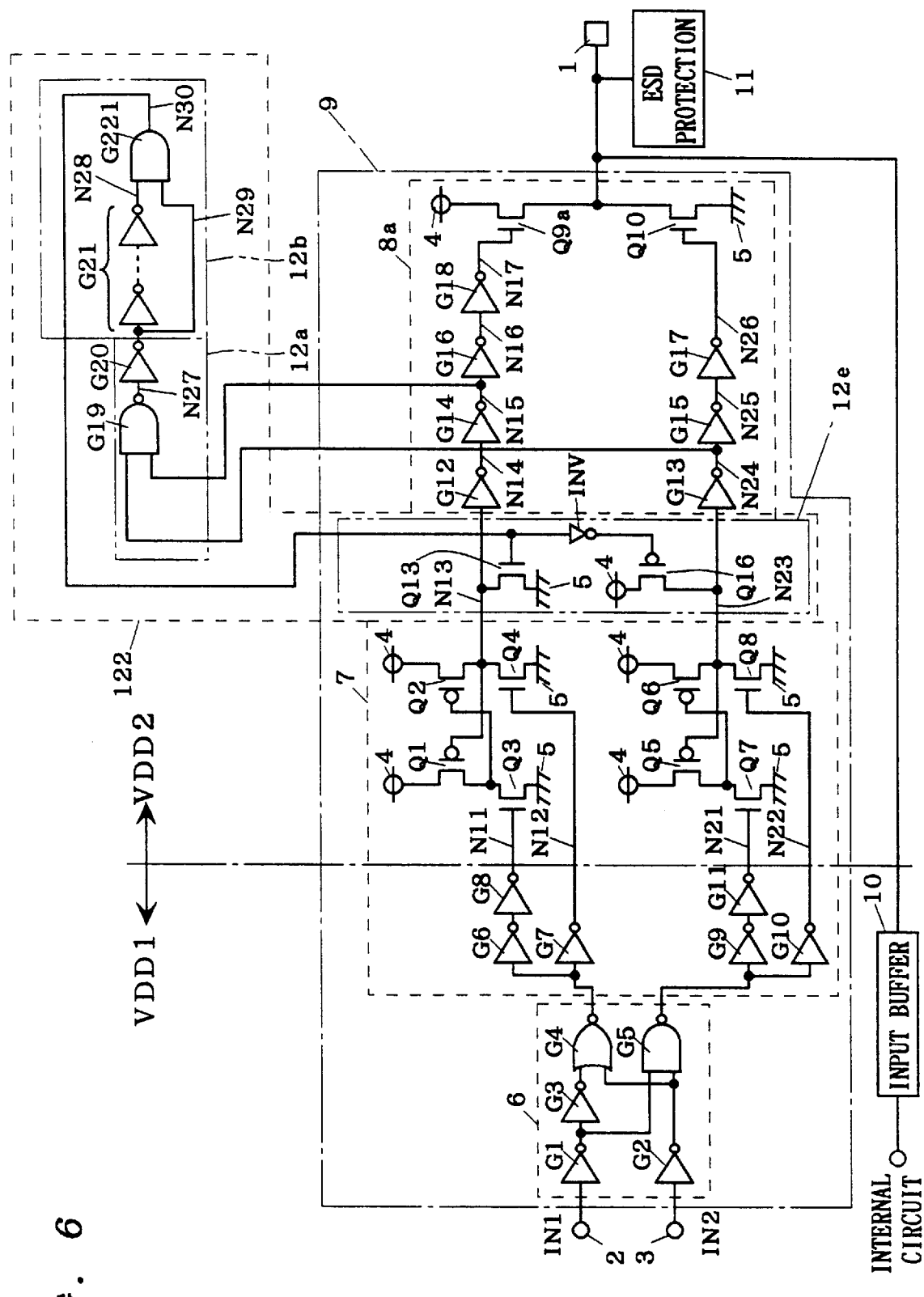

FIG. 6 shows a modified example of the circuit shown in FIG. 5. The series connection of the NAND gate G22 and inverter gate G23 in the condition adding part 12b is replaced by an AND gate G221.

Second preferred embodiment

Figure 7:
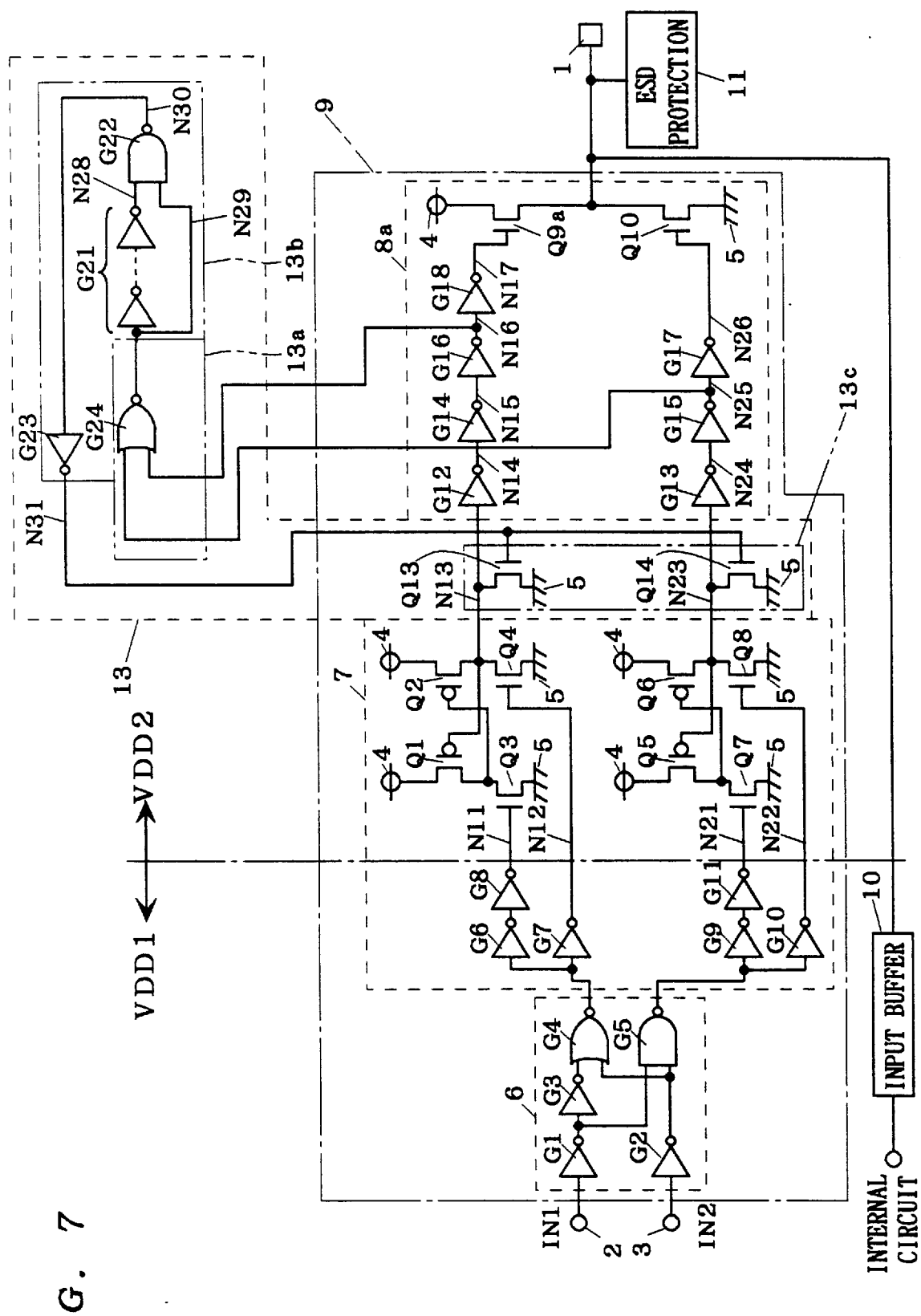
FIG. 7 is a circuit diagram showing a constitution of a second preferred embodiment of the invention.

FIG. 7 is a circuit diagram showing the constitution of input and output circuit of a semiconductor integrated circuit device with signal level converting function in a second preferred embodiment of the present invention. In the circuit shown herein, the reset circuit 12 of the circuit shown in the first preferred embodiment is replaced by a reset circuit 13.

The reset circuit 13 comprises a detecting penetration current causing logic part 13a, a condition adding part 13b, and a forced logic presenting part 13c. The condition adding part 13b and forced logic presenting part 13c are identical with the condition adding part 12b and forced logic presenting part 12c in the first preferred embodiment.

However, the detecting penetration current causing logic part 13a is composed of a NOR gate G24 having two input ends connected respectively to connection points N16, N25. By the function of the inverter gate G16, a complementary (that is, inverted) logic to the logic given to the connection point N15 is given to the connection point N16. Also by the function of the inverter gate G15, a complementary logic to the logic given to the connection point N24 is given to the connection point N25.

Therefore, the logic level given to the condition adding part 13b changes depending on the operation explained in the first preferred embodiment. Therefore, in the second preferred embodiment, too, the same effects as in the first preferred embodiment are obtained.

Incidentally, the gate insulation films of the MOS transistors for composing the NOR gate G24 are thicker than the gate insulation film of the MOS transistors for composing the inverter gates G1 to G3 and G6 to G11.

Figure 8:
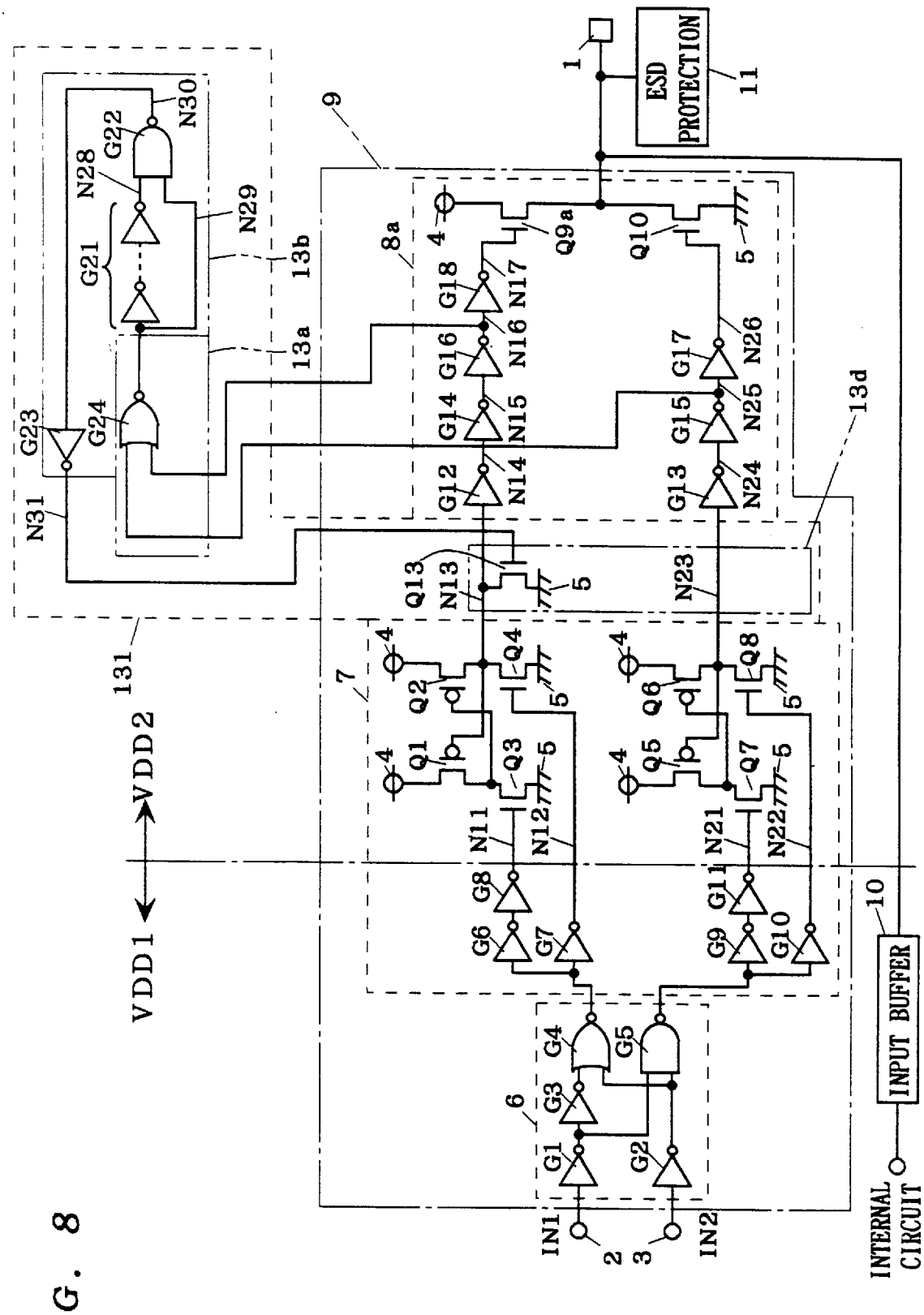
FIGS. 8 to 10 are circuit diagrams showing constitutions of modifications of the second preferred embodiment of the invention.
Figure 9:
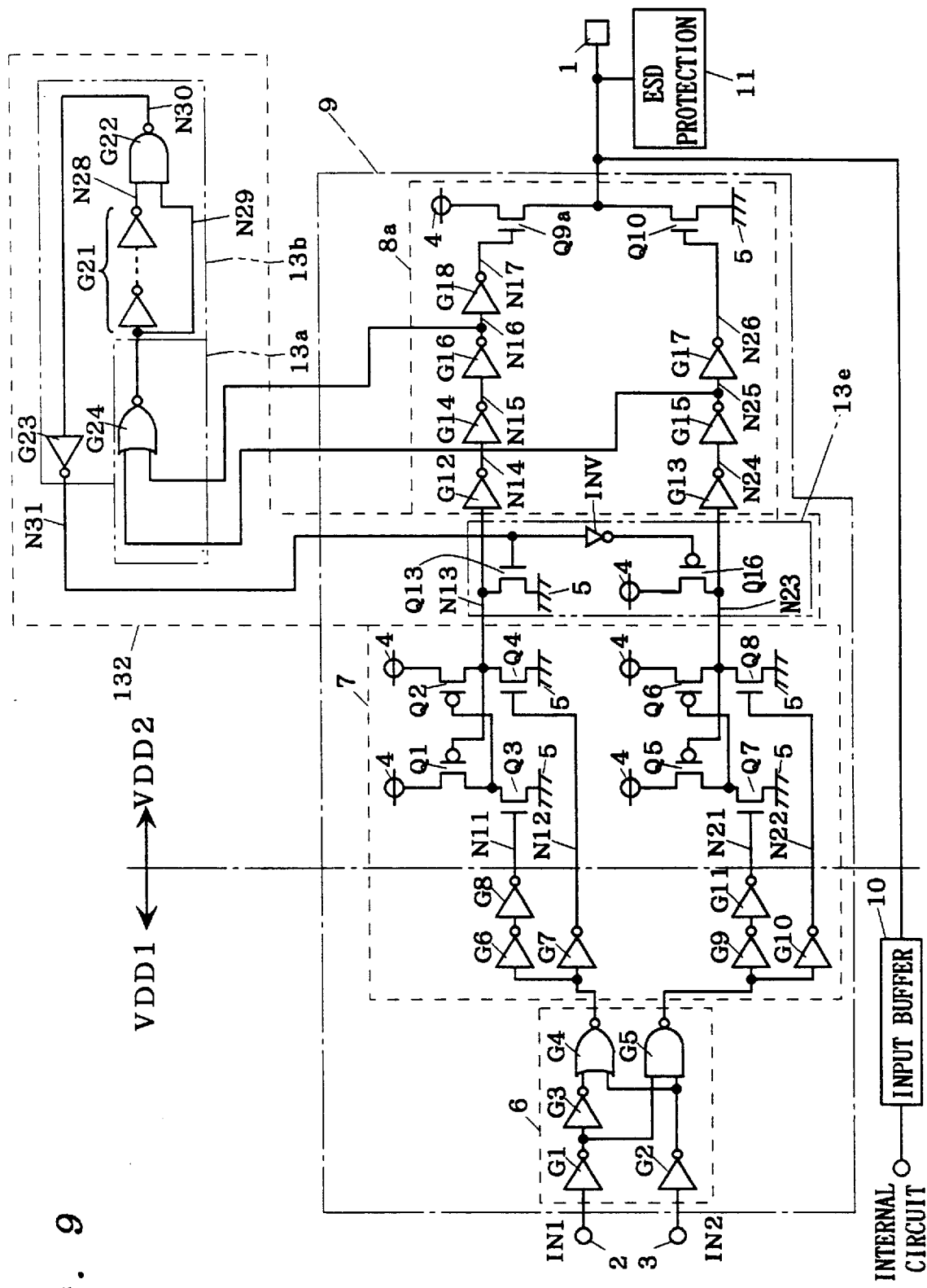
Figure 10:
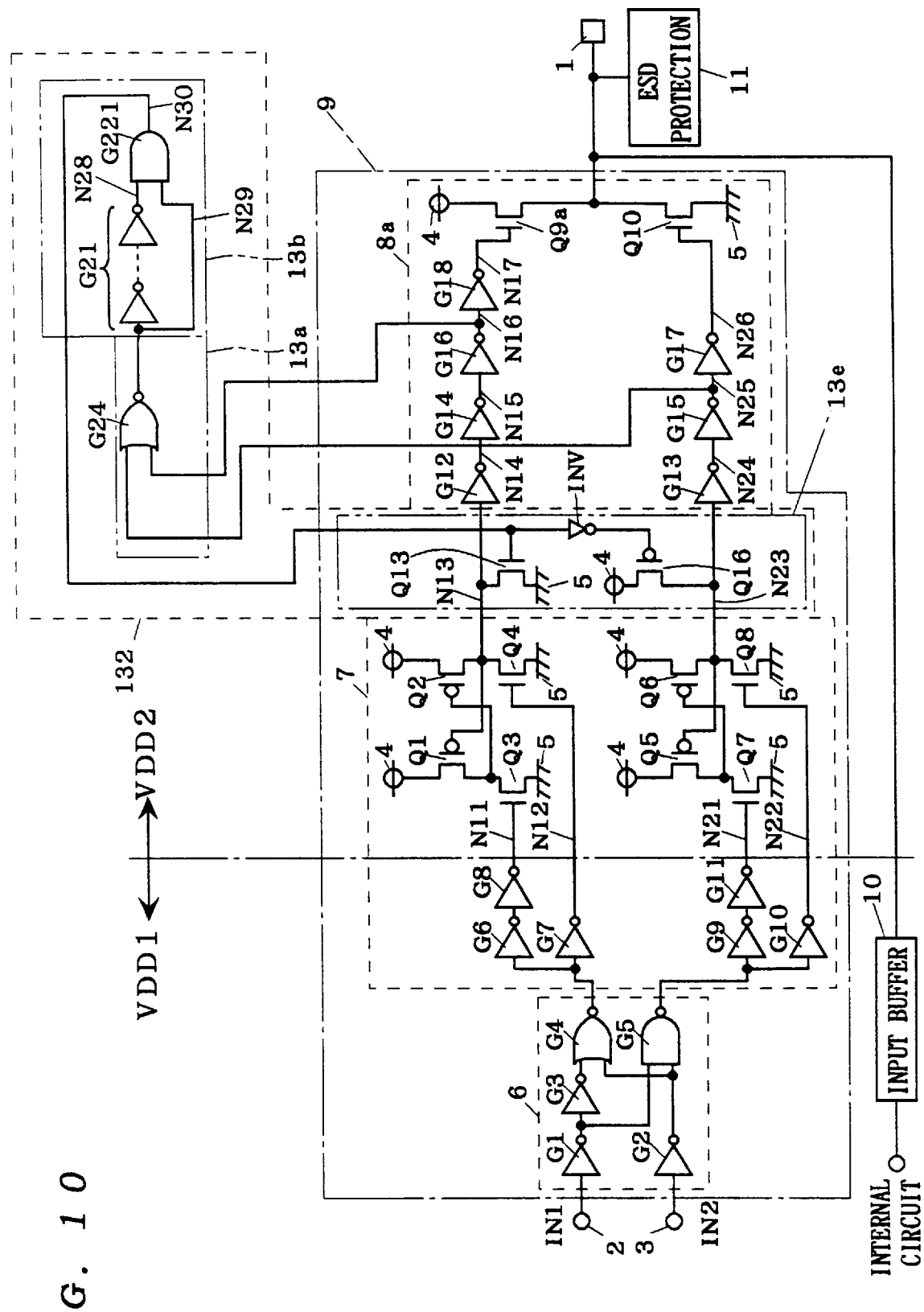

FIG. 8 to FIG. 10 show constitutions of modifications by the same concept as in the modifications shown in FIG. 4 to FIG. 6 executed also in this embodiment.

FIG. 8 shows a constitution in which the reset circuit 13 is replaced by a reset circuit 131, as compared with FIG. 7.

The reset circuit 131 has the forced logic presenting part 13d replacing a forced logic presenting part 13c. The forced logic presenting part 13d is composed by omitting the NMOS transistor Q14 from the forced logic presenting part 13c.

FIG. 9 shows a constitution in which the reset circuit 13 is replaced by a reset circuit 132, as compared with FIG. 7. The reset circuit 132 has the forced logic presenting part 13e replacing a forced logic presenting part 13c. The forced logic presenting part 13e is composed by replacing the NMOS transistor Q14 of the forced logic presenting part 13c with a PMOS transistor Q16 and an inverter gate INV.

FIG. 10 shows a modified example of the circuit shown in FIG. 9. In the condition adding part 13b, the series connection of the NAND gate 22 and inverter gate G23 is replaced by an AND gate G221.

Hence, in the modified examples of the second preferred embodiment, the same effects as in the modified examples of the first preferred embodiment may be obtained.

Third preferred embodiment

Figure 11:
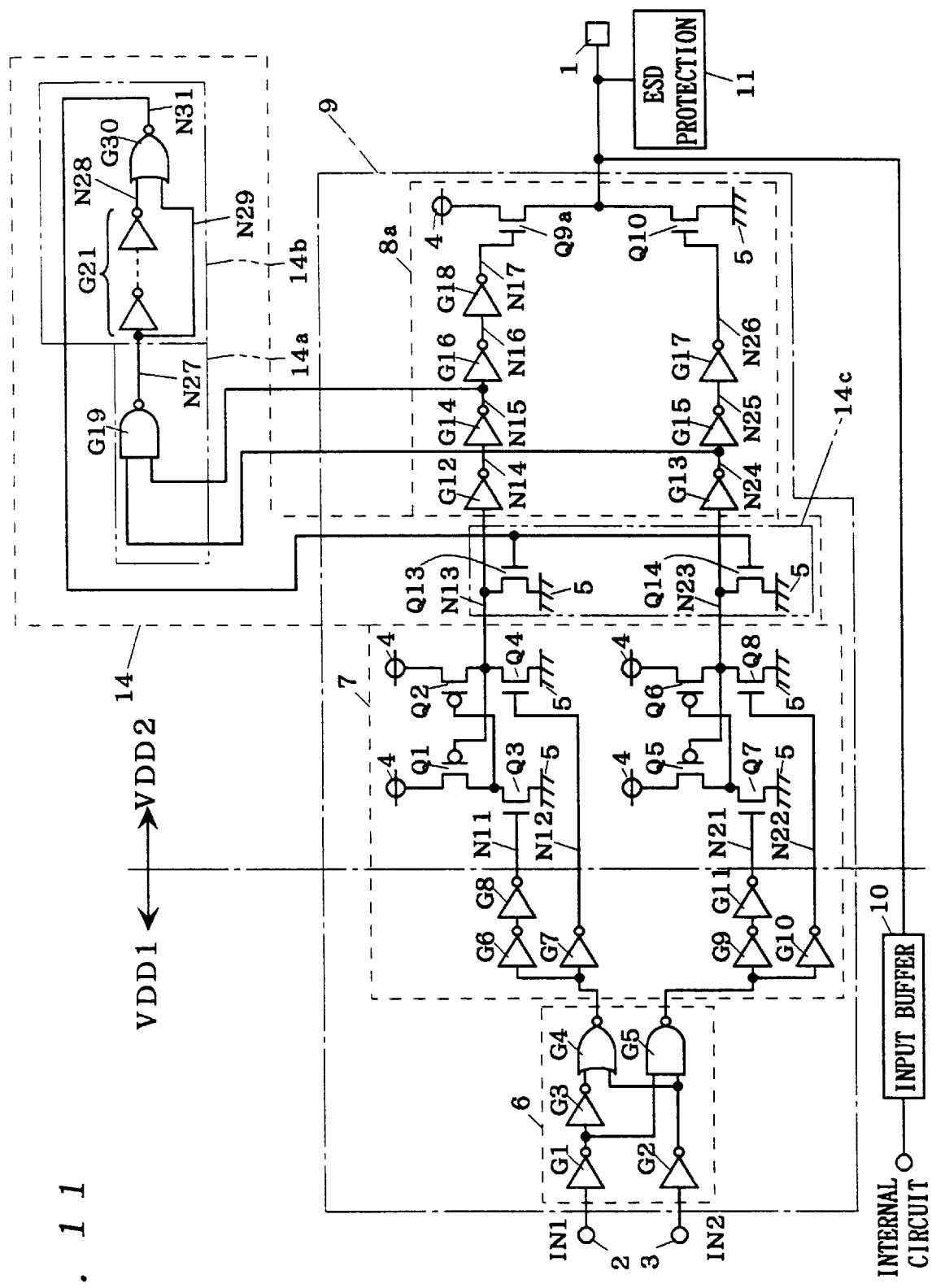
FIG. 11 is a circuit diagram showing a constitution of a third preferred embodiment of the invention.

FIG. 11 is a circuit diagram showing the constitution of input and output circuit of a semiconductor integrated circuit device with signal level converting function in a third preferred embodiment of the present invention. In the circuit shown herein, the reset circuit 12 shown in the first preferred embodiment is replaced by a reset circuit 14.

The reset circuit 14 is composed of a detecting penetration current causing logic part 14a, a condition adding part 14b, and a forced logic presenting part 14c, and the forced logic presenting part 14c is identical with the forced logic presenting part 12c in the first preferred embodiment.

However, the detecting penetration current causing logic part 14a lacks the inverter gate G20 of the detecting penetration current causing logic part 12a shown in the first preferred embodiment. That is, it is composed only of the NAND gate G19 having two input ends connected respectively to the connection points N15, N24.

The condition adding part 14b lacks the inverter gate G23 in the condition adding part 12b shown in the first preferred embodiment, and replaces the NAND gate G22 with NOR gate G30. That is, the condition adding part 14b is composed of a delay circuit G21 for delaying the output of the NAND gate G19 of the detecting penetration current causing logic part 14a by delay time τ, and the NOR gate G30 having two input ends for receiving the output of the NAND gate G19 and the output of the delay circuit G21.

The detecting penetrating current causing logic part 14a gives a complementary penetration detection signal to that of the detecting penetration current causing logic part 12a to the condition adding part 14b. Accordingly, the output of the NOR gate G30 gives the same logic as the logic applied by the inverter gate G23 to the connection point N31 in the first preferred embodiment to the connection point N31.

Therefore, the forced logic presenting part 14c changes according to the operation explained in the first preferred embodiment. Hence, in the third preferred embodiment, too, the same effects as in the first preferred embodiment are obtained.

Incidentally, the gate insulation films of the MOS transistors for composing the NOR gate G30 are thicker than the gate insulation film of the MOS transistors for composing the inverter gates G1 to G3 and G6 to G11.

Figure 12:
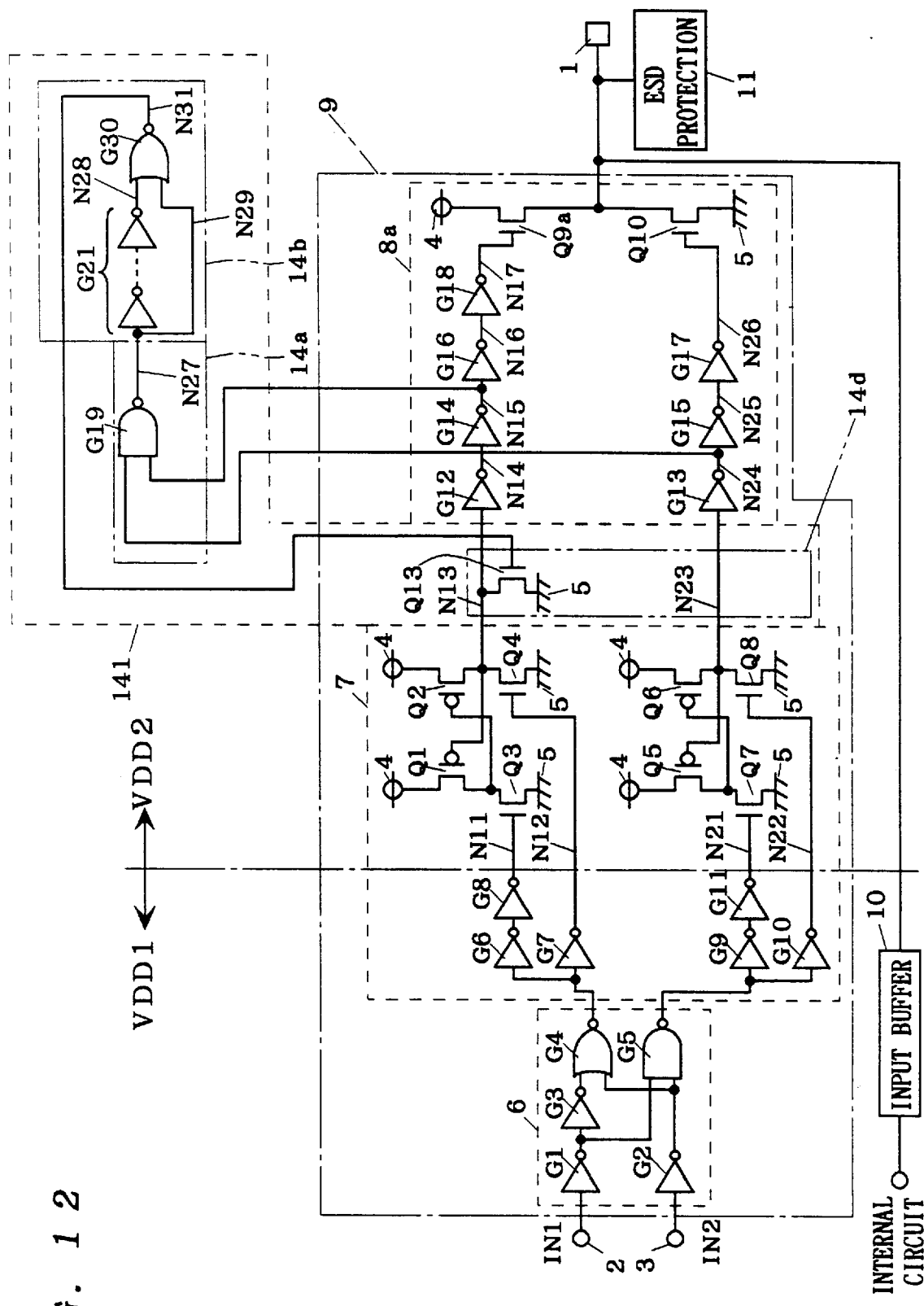
FIGS. 12 and 13 are circuit diagrams showing constitutions of modifications of the third preferred embodiment of the invention.
Figure 13:
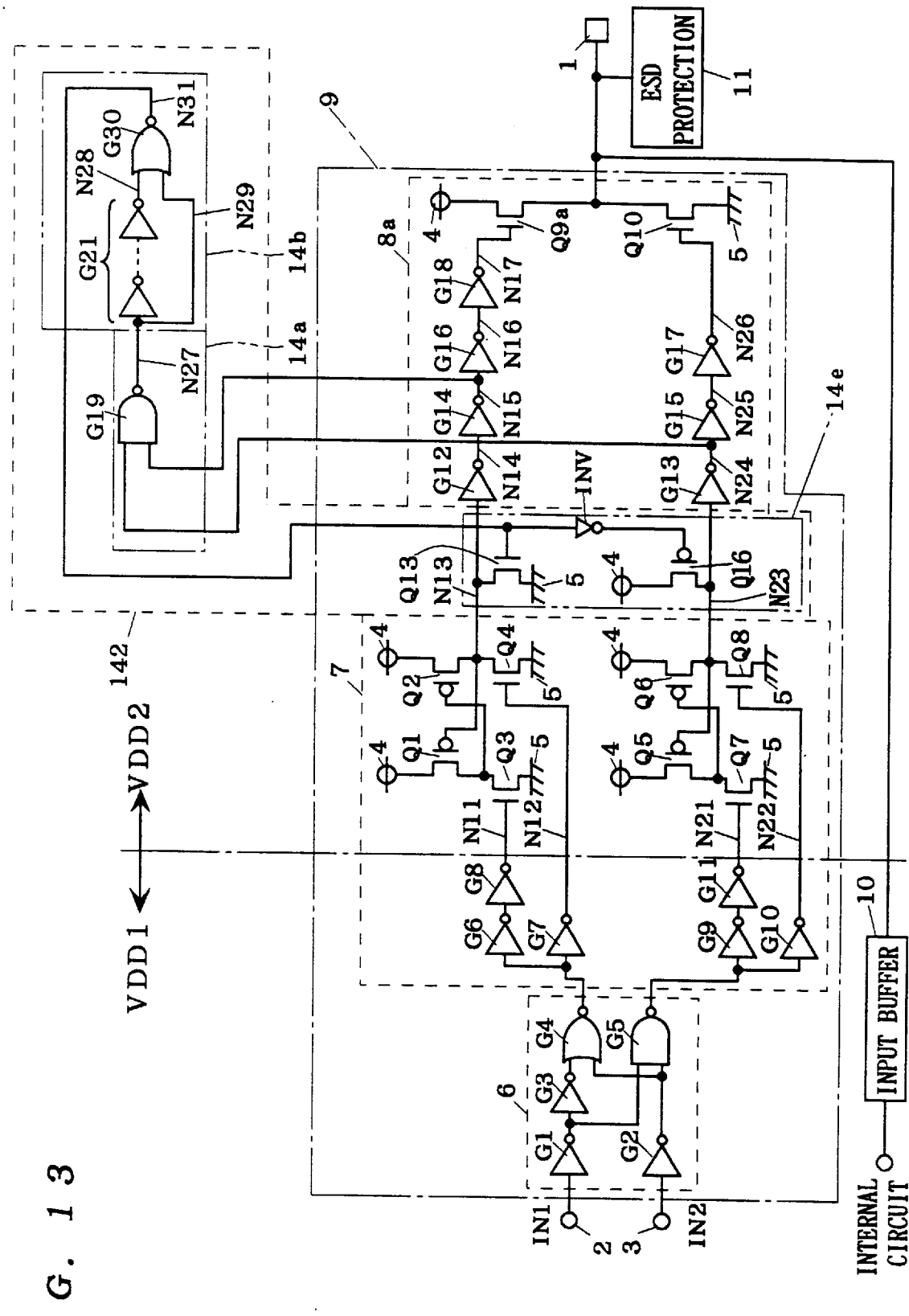

FIG. 12 and FIG. 13 show constitutions of modifications by the same concept as in the modifications shown in FIG. 4 and FIG. 5 executed also in this embodiment.

FIG. 12 shows a constitution in which the reset circuit 14 is replaced by a reset circuit 141, as compared with FIG. 11. The reset circuit 141 has the forced logic presenting part 14d replacing a forced logic presenting part 14c. The forced logic presenting part 14d is composed by omitting the NMOS transistor Q14 from the forced logic presenting part 14c.

FIG. 13 shows a constitution in which the reset circuit 14 is replaced by a reset circuit 142, as compared with FIG. 11. The reset circuit 142 has the forced logic presenting part 14e replacing a forced logic presenting part 14c. The forced logic presenting part 14e is composed by replacing the NMOS transistor Q14 of the forced logic presenting part 14c with a PMOS transistor Q16 and an inverter gate INV.

Hence, in the modified examples of the third preferred embodiment, the same effects as in the modified examples of the first preferred embodiment may be obtained.

Fourth preferred embodiment

Figure 14:
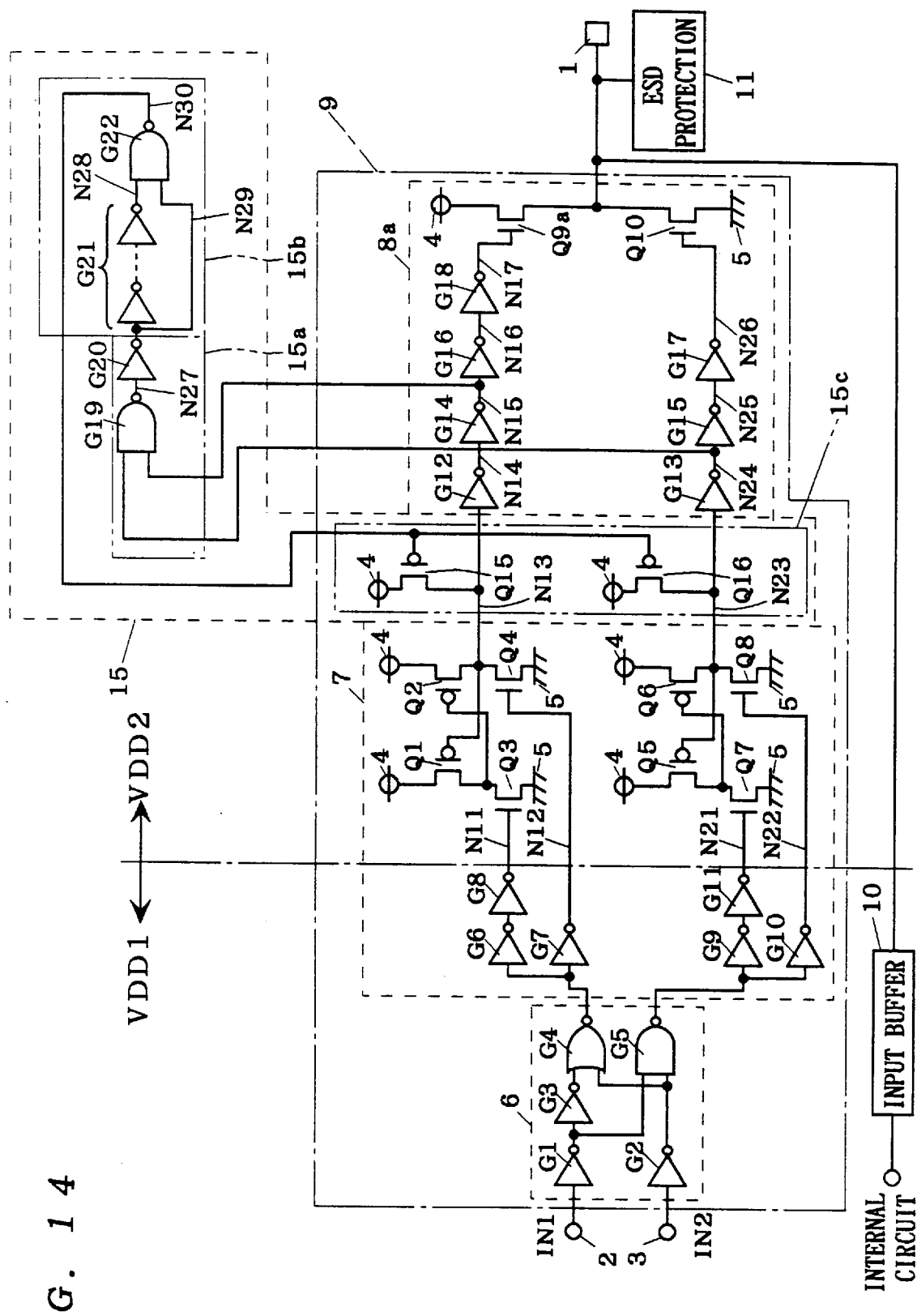
FIG. 14 is a circuit diagram showing a constitution of a fourth preferred embodiment of the invention.

FIG. 14 is a circuit diagram showing the constitution of input and output circuit of a semiconductor integrated circuit device with signal level converting function in a fourth preferred embodiment of the present invention. In the circuit shown herein, the reset circuit 12 shown in the first preferred embodiment is replaced by a reset circuit 15.

The reset circuit 15 is composed of a detecting penetration current causing logic part 15a, a condition adding part 15b, and a forced logic presenting part 15c, and the detecting penetrating current causing logic part 15a is identical with the detecting penetration current causing logic part 12a in the first preferred embodiment.

However, the condition adding part 15b lacks the inverter gate G23 in the condition adding part 12b shown in the first preferred embodiment. That is, the condition adding part 15b is composed of a delay circuit G21 for delaying the output of the inverter gate G20 of the detecting penetration current causing logic part 15a by delay time τ, and a NAND gate G22 having two input ends for receiving the output of the inverter gate G20 and the output of the delay circuit G21.

The forced logic presenting part 15c possesses PMOS transistors Q15, Q16. The PMOS transistor Q15 has its source electrode connected to the supply potential point 4, its gate electrode receives the output of the condition adding part 15b, and its drain electrode is connected to the connection point N13 to which the output of the signal level converting circuit 7 is applied. The PMOS transistor Q16 has its source electrode connected to the supply potential point 4, its gate electrode receives the output of the condition adding part 15b, and its drain electrode is connected to the connection point N23 to which the output of the signal level converting circuit 7 is applied.

The output of the condition adding part 15b is given at the connection point N30, and it is given to the PMOS transistors Q15, Q16. The output of the condition adding part 15b and the turning-on condition of the PMOS transistors Q15, Q16 are in the complementary relation as compared with the first preferred embodiment. Accordingly, the on/off action of the PMOS transistors Q15, Q16 is same as the on/off action of the NMOS transistors Q13, Q14 in the first preferred embodiment.

However, as the PMOS transistors Q15, Q16 are turned on, the second supply potential VDD2 corresponding to the logic H is given to both connection points N13, N23, and therefore, different from the case of the first preferred embodiment, the NMOS transistors Q9a, Q10 are respectively turned on and off, and H level is given to the input and output terminal 1. Of course, penetration current will not flow.

Incidentally, the gate insulation films of the PMOS tranistors Q15, Q16 are thicker than the gate insulation film of the MOS transistors for composing the inverter gates G1 to G3 and G6 to G11.

FIG. 15 is a circuit diagram showing a modified constitution of this embodiment. In the diagram, as compared with FIG. 14, the reset circuit 15 is replaced by a reset circuit 151. The reset circuit 151 has the forced logic presenting part 15d replacing a forced logic presenting part 15c. The forced logic presenting part 15d is composed by omitting the PMOS transistor Q15 from the forced logic presenting part 15c.

The logic presented by the reset circuit 15 to the connection point N13 by force is H, in the case that penetration current would flow, however, the connection point N13 has been already provided with logic H before actuation of the reset circuit 15. Therefore, conduction or non-conduction of the PMOS transistor Q15 has no effect on the operation of the NMOS transistor Q9a, and hence it can be omitted.

Fifth preferred embodiment

Figure 16:
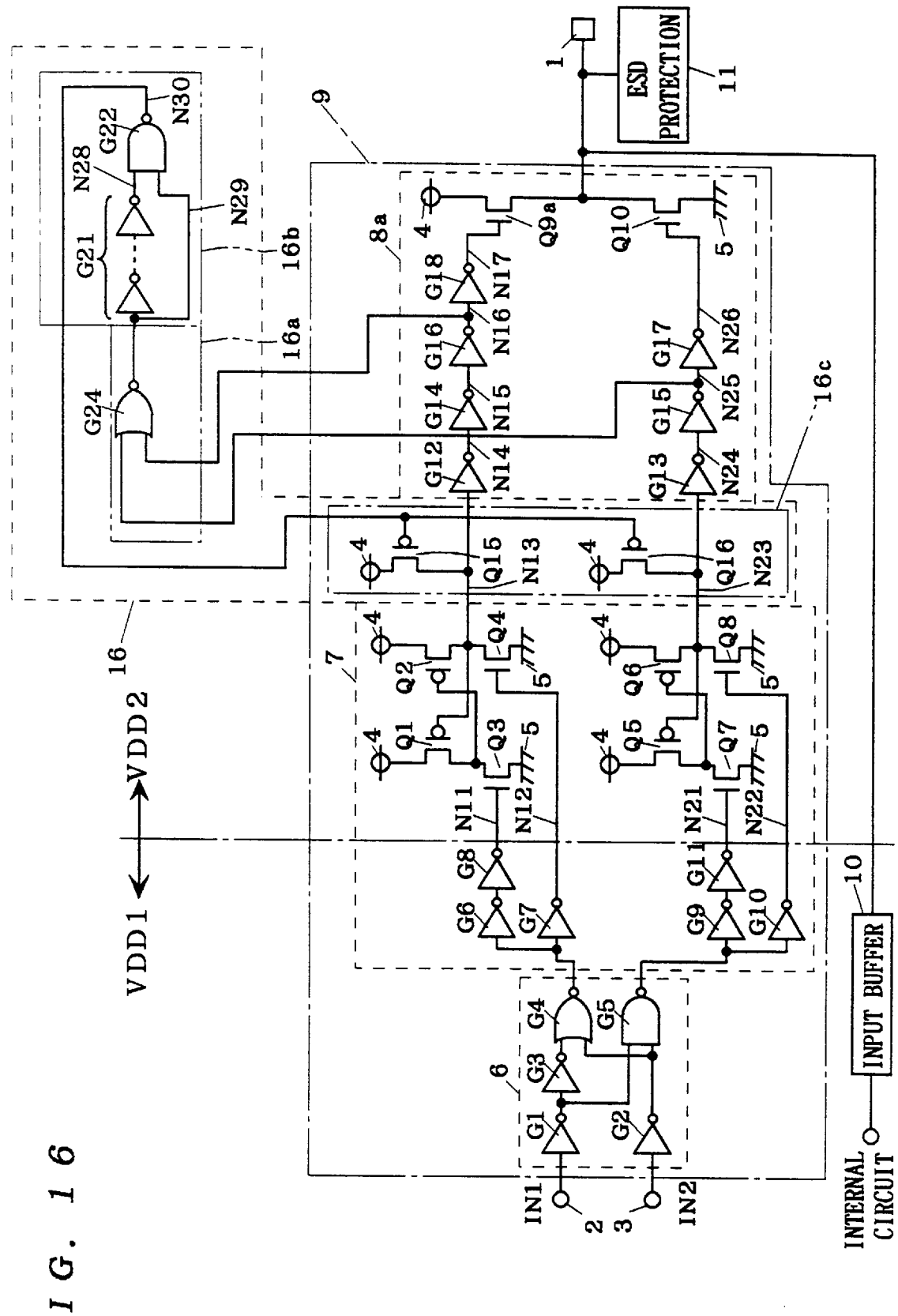
FIG. 16 is a circuit diagram showing a constitution of a fifth preferred embodiment of the invention.

FIG. 16 is a circuit diagram showing the constitution of input and output circuit of a semiconductor integrated circuit device with signal level converting function in a fifth preferred embodiment of the present invention. In the circuit shown herein, the reset circuit 15 shown in the fourth preferred embodiment is replaced by a reset circuit 16.

The reset circuit 16 is composed of a detecting penetration current causing logic part 16a, a condition adding part 16b, and a forced logic presenting part 16c. The detecting penetration current causing logic part 16a is identical with the detecting penetration current causing logic part 13a in the second preferred embodiment, and the NOR gate G24 has two input ends connected respectively to the connection points N16, N25. The condition adding part 16b and forced logic presenting part 16c are identical with the condition adding part 15b and forced logic presenting part 15c shown in the fourth preferred embodiment, respectively.

The detecting penetration current causing logic part 16a receives a complementary logic to that of the detecting penetration current causing logic part 15a, and hence the penetration detection signal given to the condition adding part 16b is same as the penetration detection signal given to the condition adding part 15b in the fourth preferred embodiment. Therefore, the fifth preferred embodiment has the same effects as in the fourth preferred embodiment.

Figure 17:
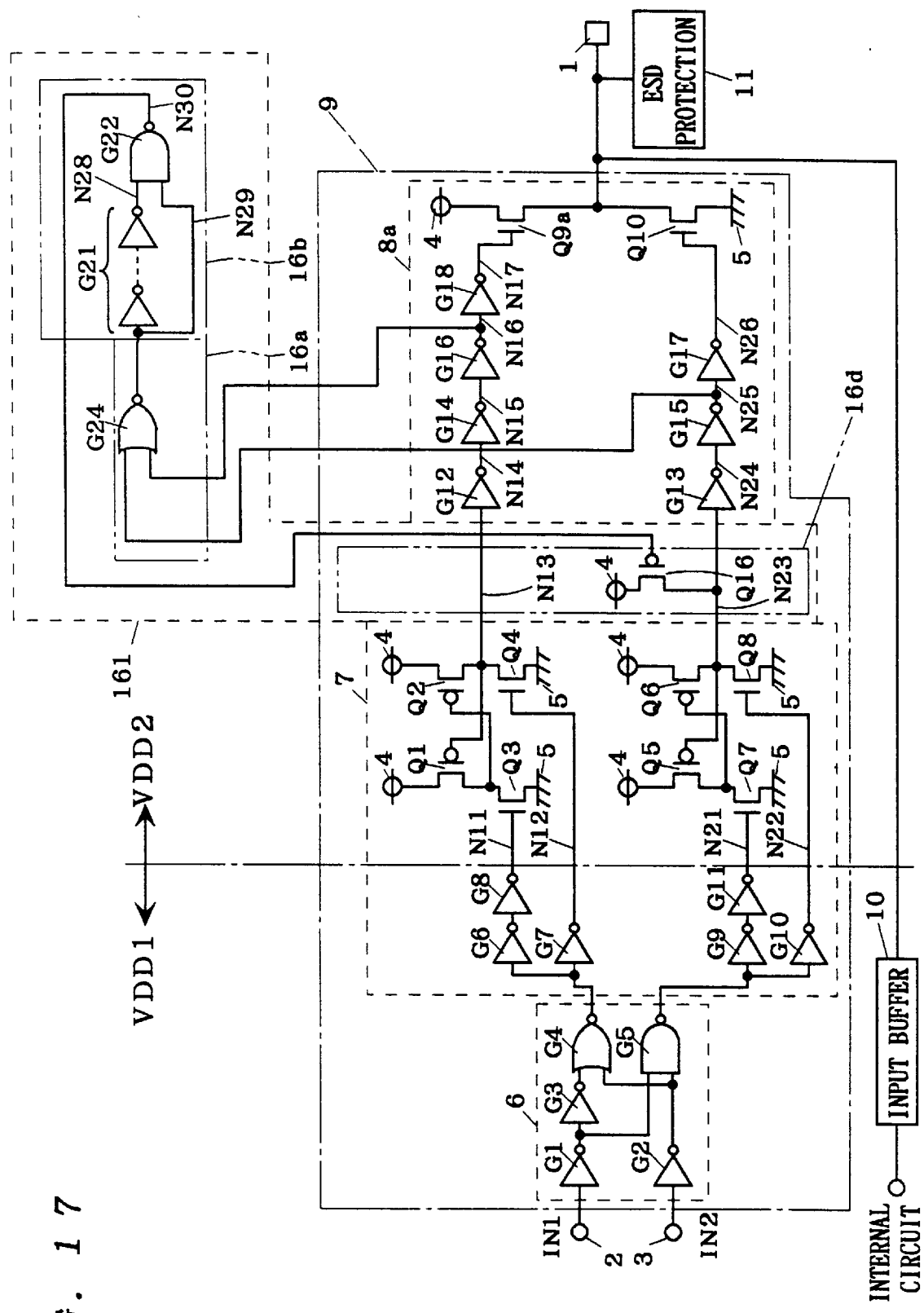
FIG. 17 is a circuit diagram showing a constitution of a modification of the fifth preferred embodiment of the invention.

FIG. 17 shows a constitution of a modification by the same concept as in the modification shown in FIG. 15 executed also in this embodiment. FIG. 17 shows a constitution in which the reset circuit 16 is replaced by a reset circuit 161, as compared with FIG. 16. The reset circuit 161 has the forced logic presenting part 16d replacing a forced logic presenting part 16c. The forced logic presenting part 16d is composed by omitting the PMOS transistor Q15 from the forced logic presenting part 16c.

Hence, in the modified example of the fifth preferred embodiment, the same effects as in the modified example of the fourth preferred embodiment may be obtained.

Sixth preferred embodiment

Figure 18:
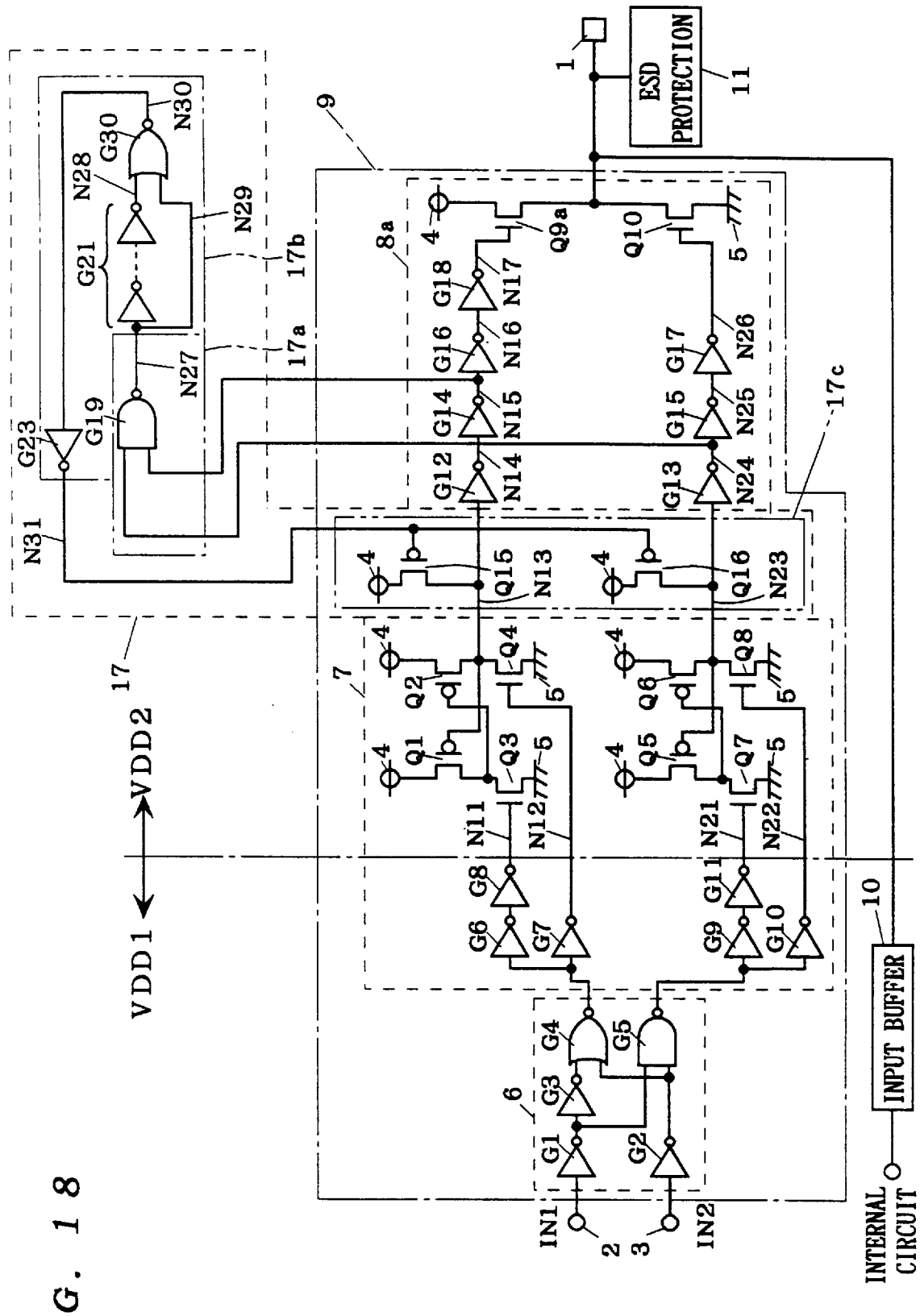
FIG. 18 is a circuit diagram showing a constitution of a sixth preferred embodiment of the invention.

FIG. 18 is a circuit diagram showing the constitution of input and output circuit of a semiconductor integrated circuit device with signal level converting function in a sixth preferred embodiment of the present invention. In the circuit shown herein, the reset circuit 15 shown in the fourth preferred embodiment is replaced by a reset circuit 17.

The reset circuit 17 is composed of a detecting penetration current causing logic part 17a, a condition adding part 17b, and a forced logic presenting part 17c. The detecting penetration current causing logic part 17a is identical with the detecting penetration current causing logic part 14a in the third preferred embodiment, and the condition adding part 17b is composed by adding an inverter gate G23 to the condition adding part 14b in the third preferred embodiment. That is, the output of the inverter gate G30 is inverted by the inverter gate G23, and is given to the forced logic presenting part 17c. The forced logic presenting part 17c is identical with the forced logic presenting part 15c shown in the fourth preferred embodiment.

The forced logic presenting part 17c in the sixth preferred embodiment operates on a complementary logic to that of the forced logic presenting part 14c in the third preferred embodiment. This is because the forced logic presenting part 17c is composed of PMOS transistors Q15, Q16 while the forced logic presenting part 14c is composed of NMOS transistors Q13, Q14.

On the other hand, by the output of the inverter gate G23, the condition adding part 17b outputs a complementary logic to that of the condition adding part 14b in the third preferred embodiment. Therefore, the sixth preferred embodiment also has the same effects as in the fourth preferred embodiment.

Figure 19:
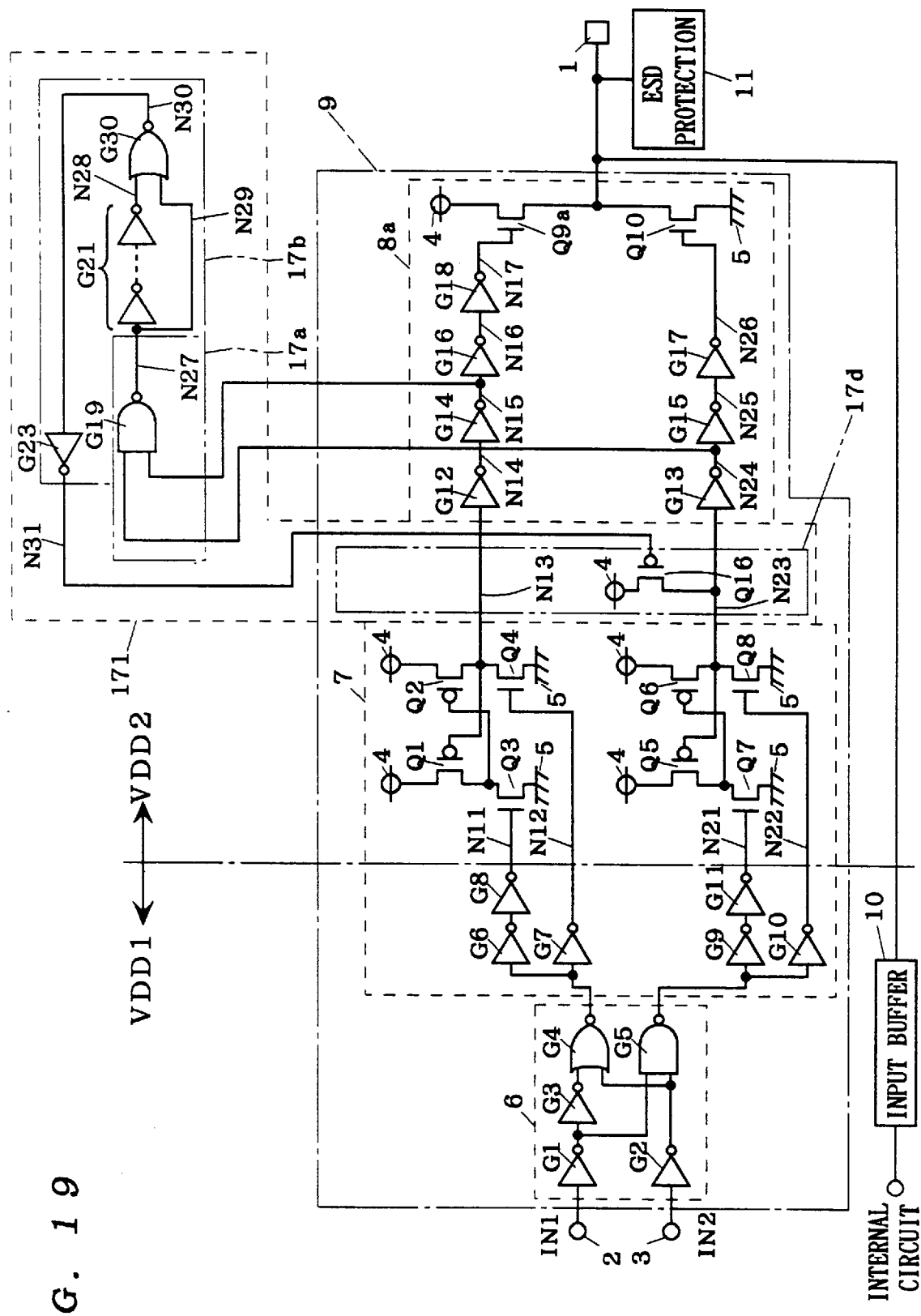
FIG. 19 is a circuit diagram showing a constitution of a modification of the sixth preferred embodiment of the invention.

FIG. 19 shows a constitution of a modification by the same concept as in the modification shown in FIG. 15 executed also in this embodiment. FIG. 19 shows a constitution in which the reset circuit 17 is replaced by a reset circuit 171, as compared with FIG. 18. The reset circuit 171 has the forced logic presenting part 17d replacing a forced logic presenting part 17c. The forced logic presenting part 17d is composed by omitting the PMOS transistor Q15 from the forced logic presenting part 17c.

Hence, in the modified example of the sixth preferred embodiment, the same effects as in the modified example of the fourth preferred embodiment may be obtained.

Seventh preferred embodiment

Figure 20:
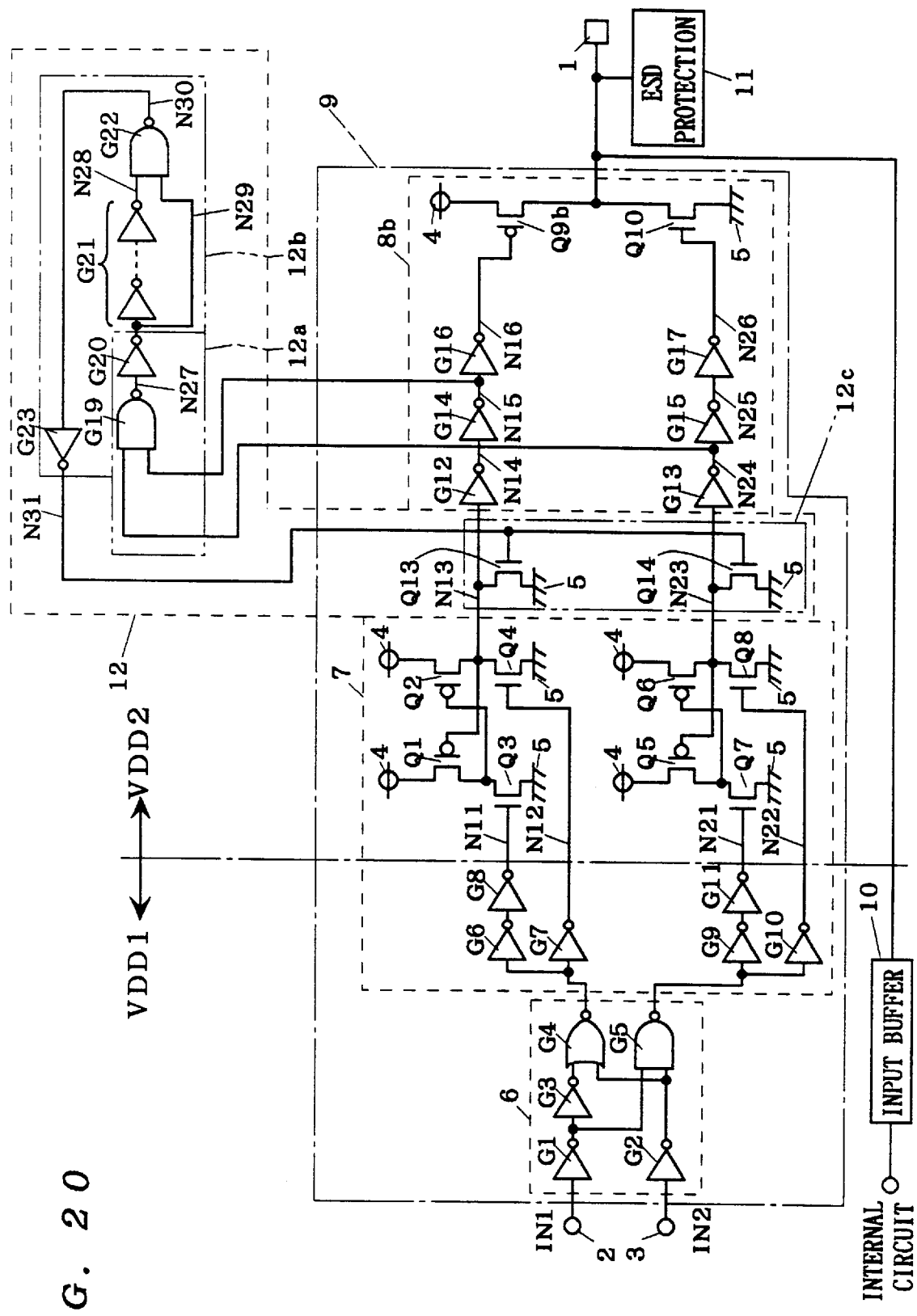
FIG. 20 is a circuit diagram showing a constitution of a seventh preferred embodiment of the invention.

FIG. 20 is a circuit diagram showing the constitution of input and output circuit of a semiconductor integrated circuit device with signal level converting function in a seventh preferred embodiment of the present invention. In the circuit shown herein, the buffer circuit 8a in the first preferred embodiment is replaced by a buffer circuit 8b.

The buffer circuit 8b is similar to the buffer circuit 8a, except that the inverter gate G18 and NMOS transistor Q9a are replaced by PMOS transistor Q9b. Since the logic given to the PMOS transistor Q9b is complementary to the logic given to the NMOS transistor Q9a, the seventh preferred embodiment also has the same effects as the first preferred embodiment.

Figure 21:
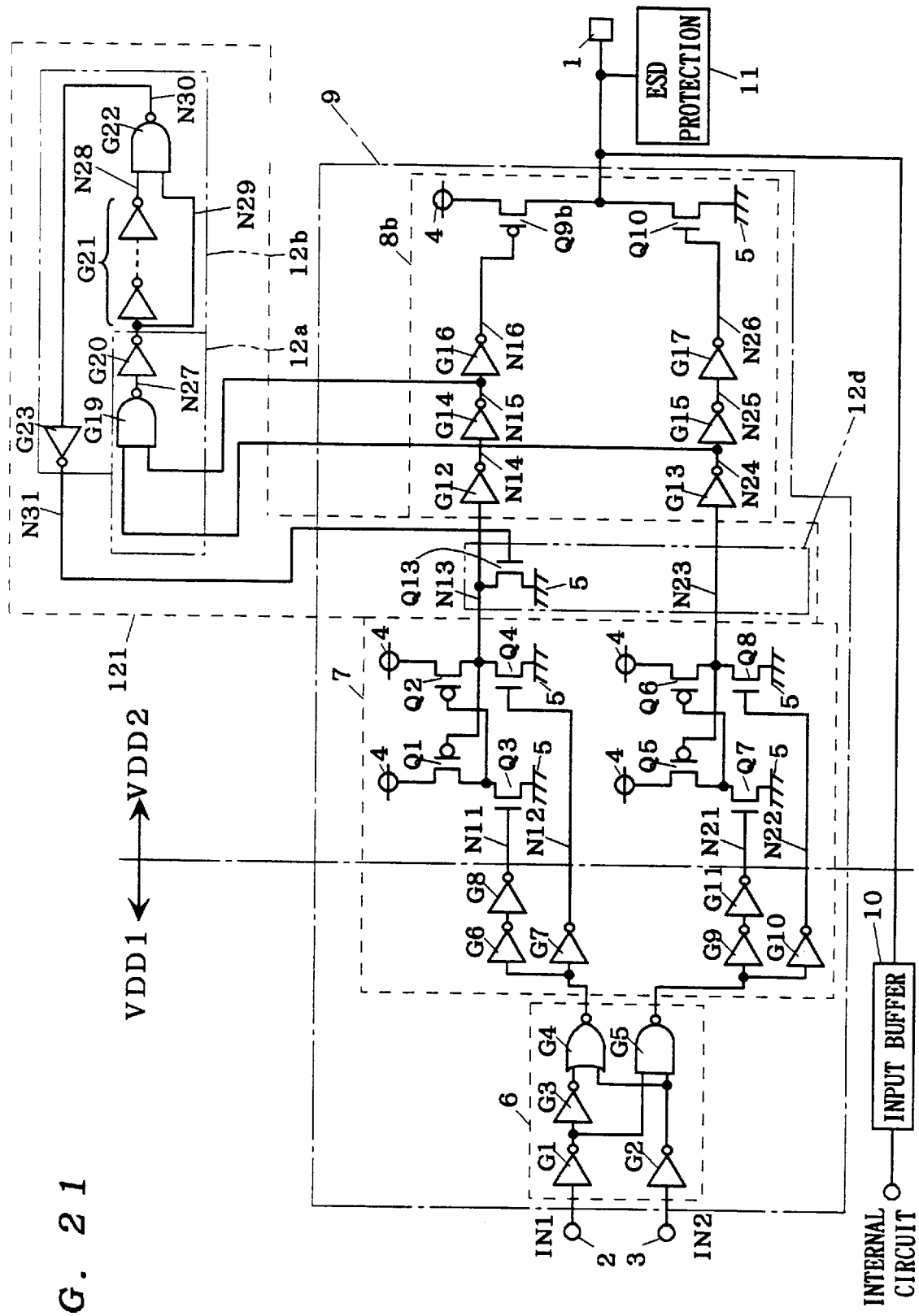
FIGS. 21 to 23 are circuit diagrams showing constitutions of modifications of the seventh preferred embodiment of the invention.
Figure 22:
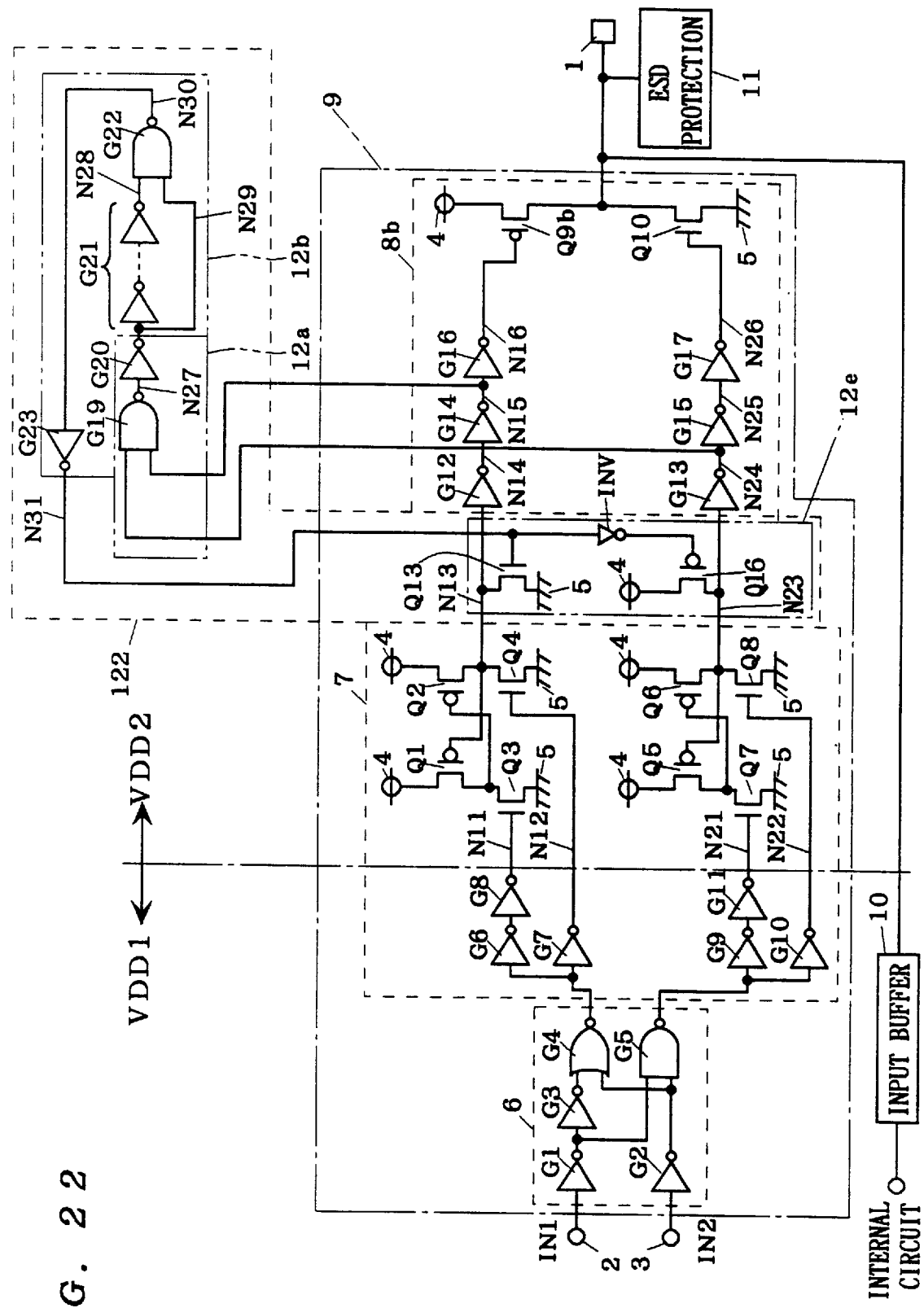
Figure 23:
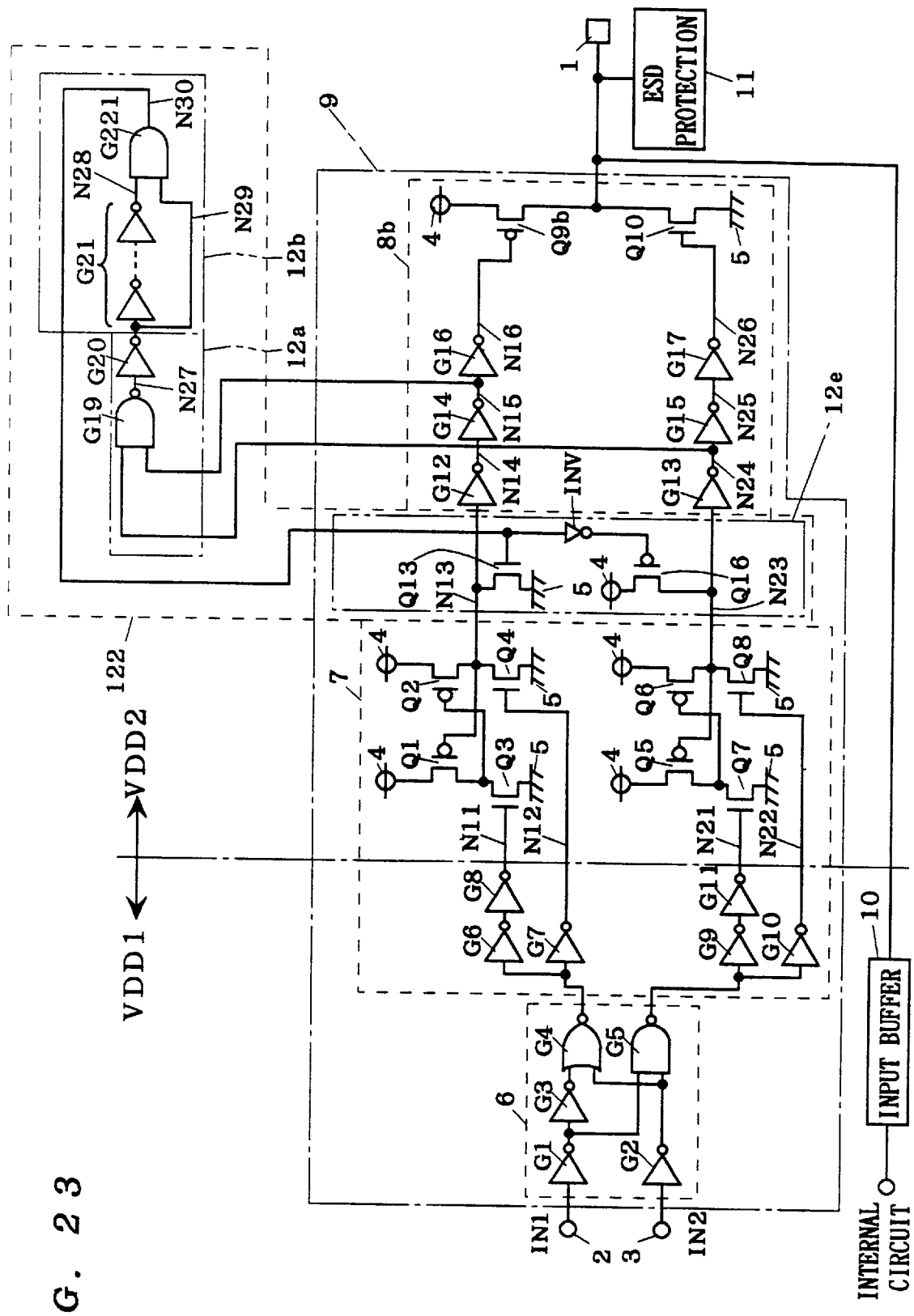

FIG. 21 to FIG. 23 show constitutions of modifications by the same concept as in the modifications shown in FIG. 4 to FIG. 6 executed also in this embodiment.

Hence, in the modified examples of the seventh preferred embodiment, the same effects as in the modified examples of the first preferred embodiment may be obtained.

Eighth preferred embodiment

FIG. 24 is a circuit diagram showing the constitution of input and output circuit of a semiconductor integrated circuit device with signal level converting function in an eighth preferred embodiment of the present invention. In the circuit shown herein, the buffer circuit 8a in the second preferred embodiment is replaced by a buffer circuit 8b. Therefore the eighth preferred embodiment also has the same effects as the second preferred embodiment.

Figure 25:
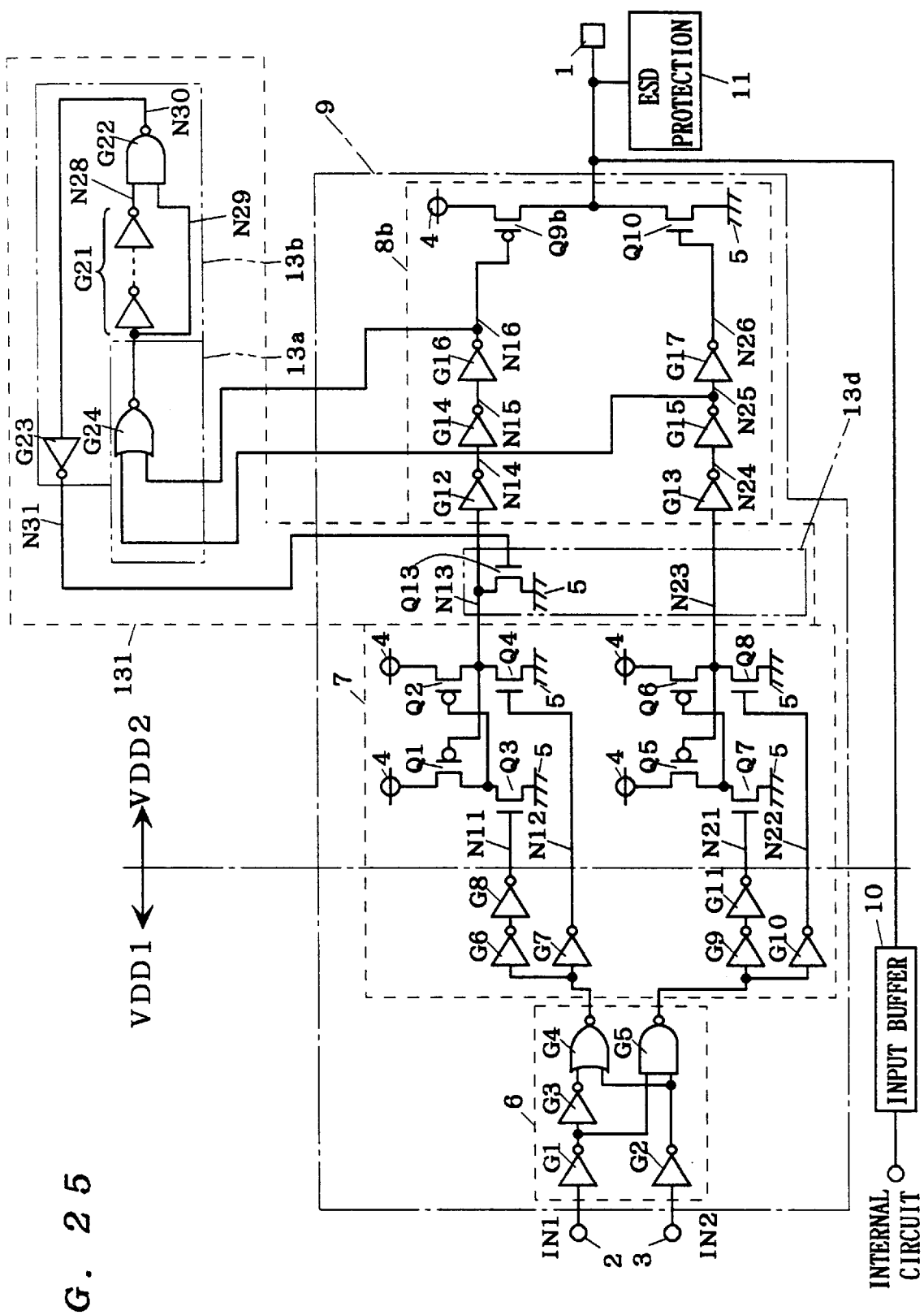
FIGS. 25 to 27 are circuit diagrams showing constitutions of modifications of the eighth preferred embodiment of the invention.
Figure 26:
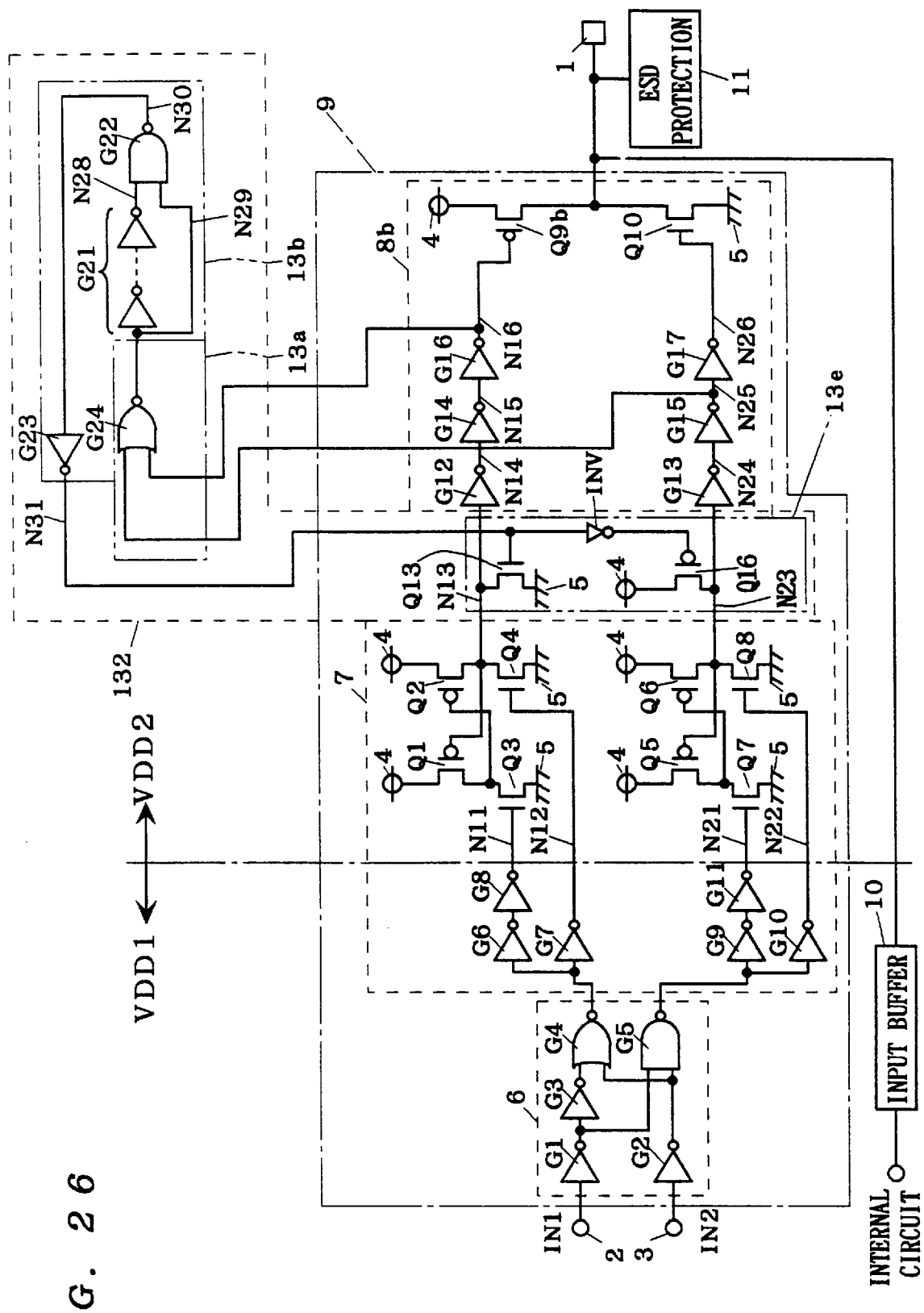
Figure 27:
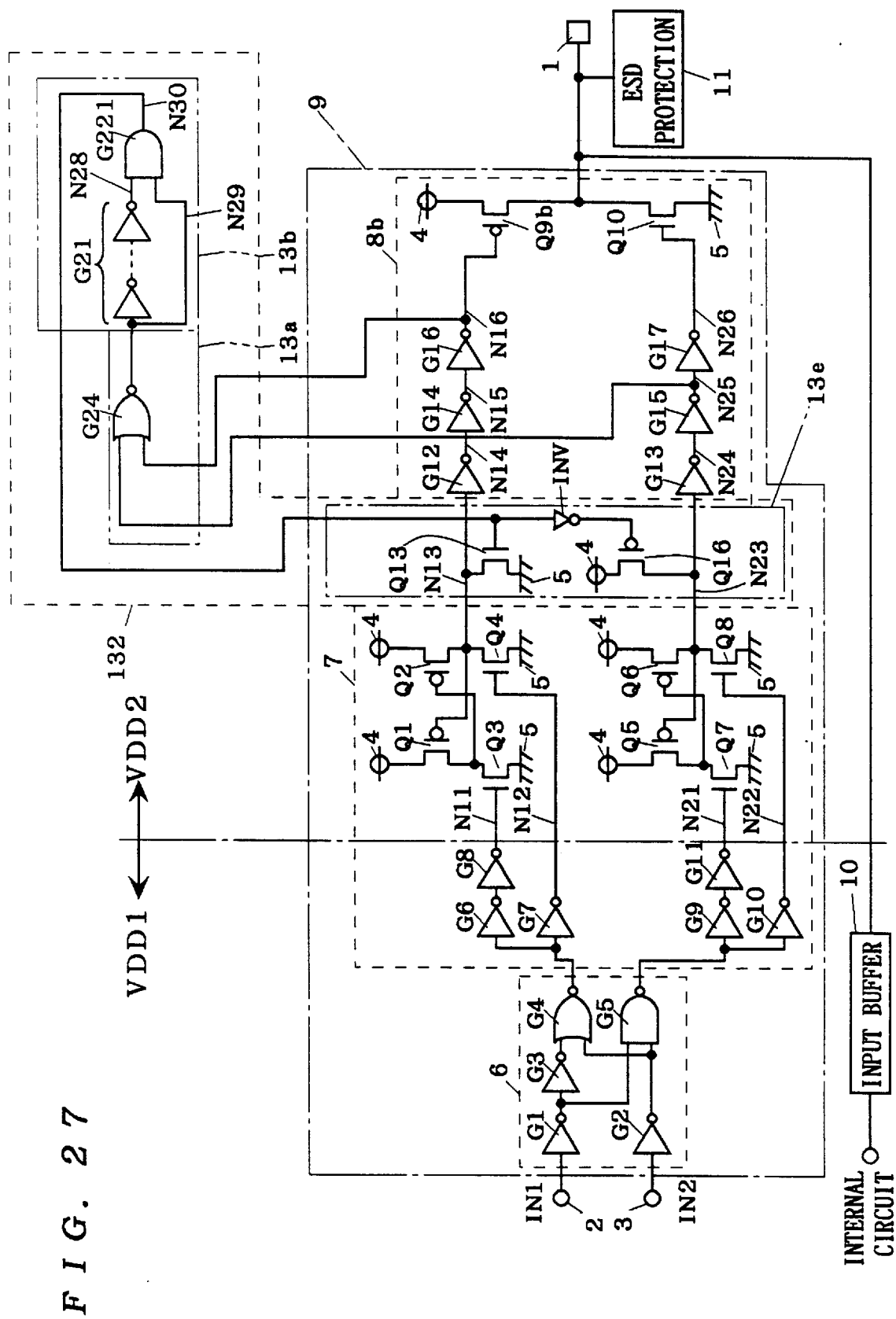

FIG. 25 to FIG. 27 show constitutions of modifications by the same concept as in the modifications shown in FIG. 4 to FIG. 6 executed also in this embodiment.

Hence, in the modified examples of the eighth preferred embodiment, the same effects as in the modified examples of the first preferred embodiment may be obtained.

Ninth preferred embodiment

Figure 28:
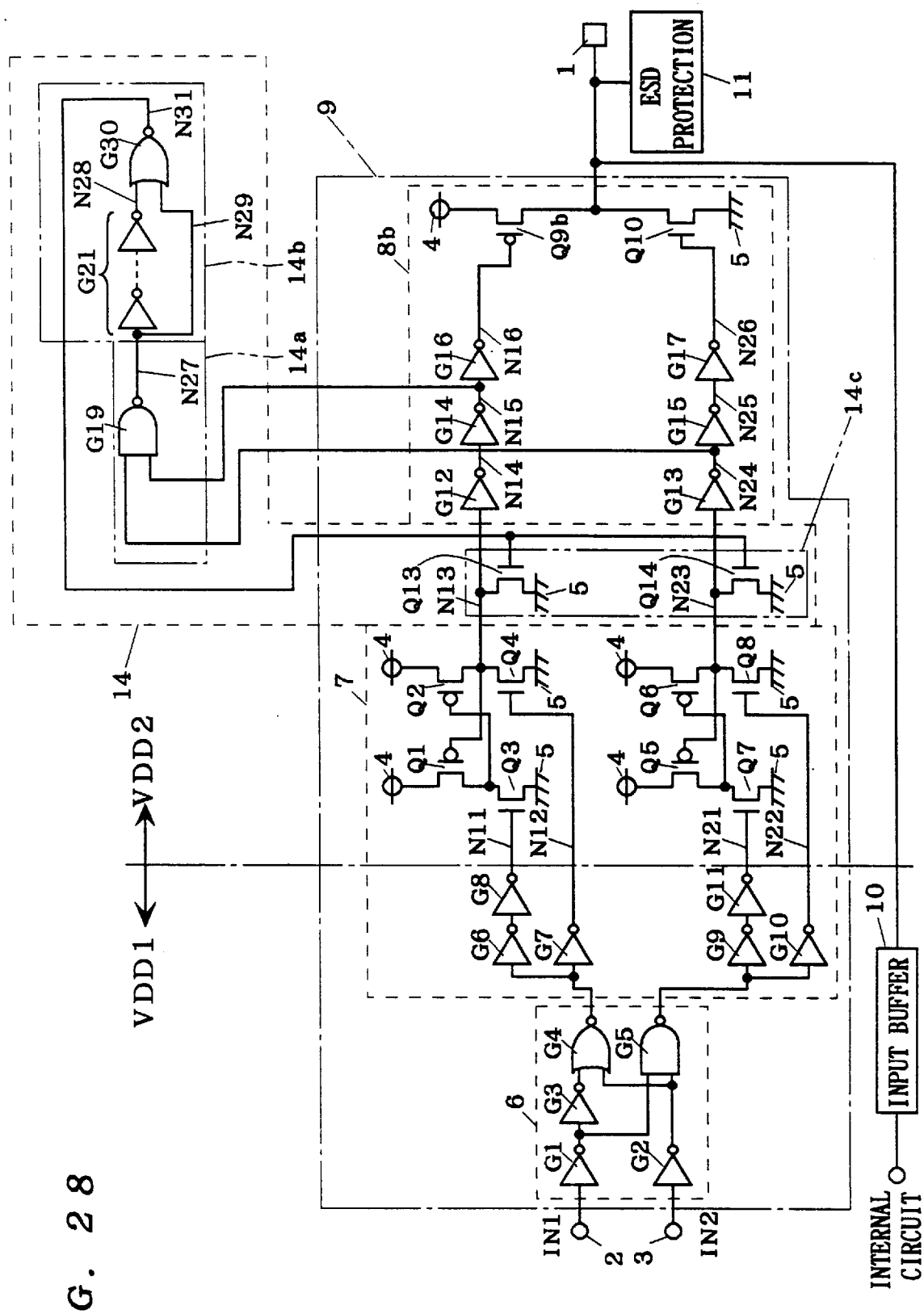
FIG. 28 is a circuit diagram showing a constitution of a ninth preferred embodiment of the invention.

FIG. 28 is a circuit diagram showing the constitution of input and output circuit of a semiconductor integrated circuit device with signal level converting function in a ninth preferred embodiment of the present invention. In the circuit shown herein, the buffer circuit 8a in the third preferred embodiment is replaced by a buffer circuit 8b. Therefore the ninth preferred embodiment also has the same effects as the third preferred embodiment.

Figure 29:
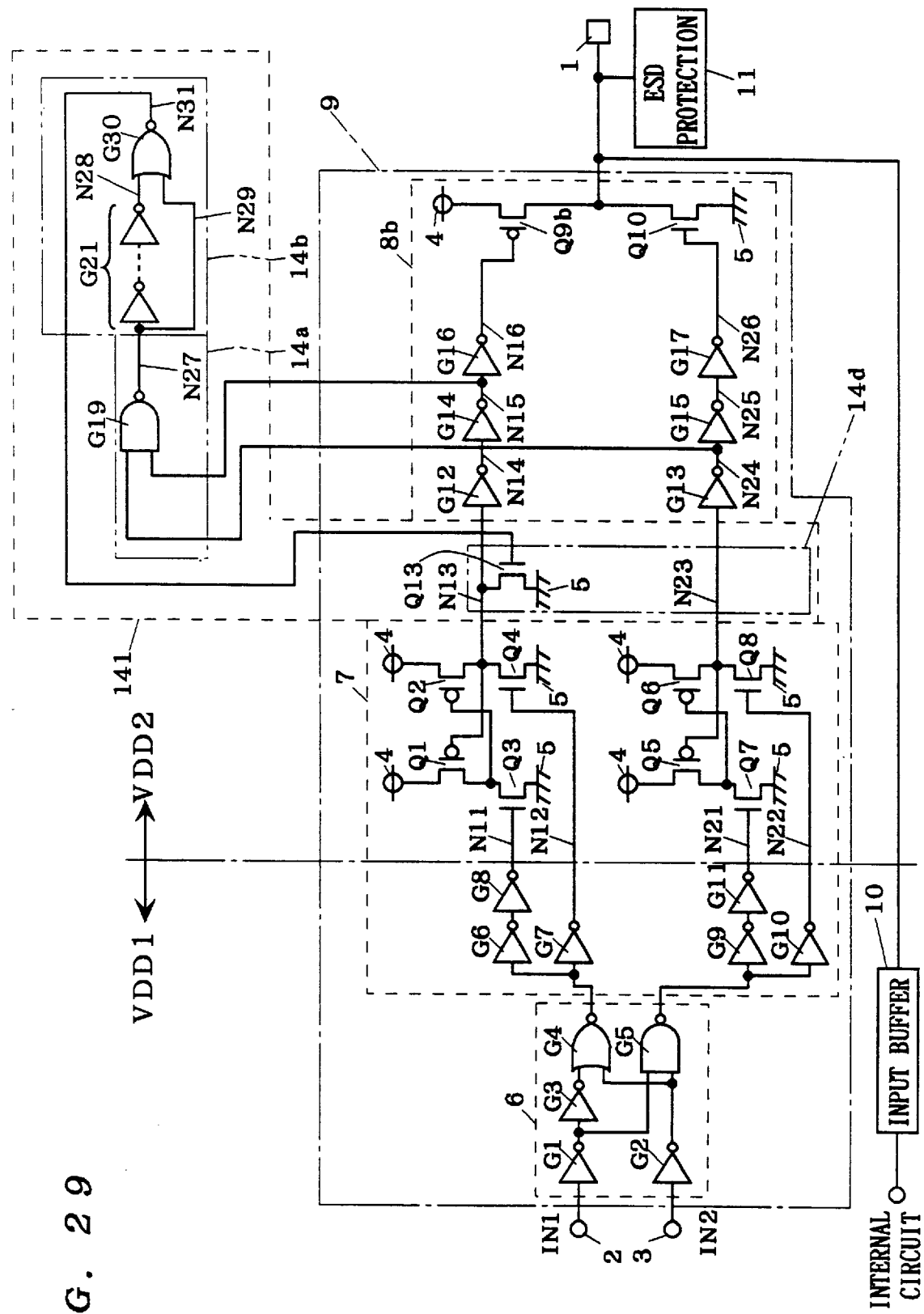
FIGS. 29 and 30 are circuit diagrams showing constitutions of modifications of the ninth preferred embodiment of the invention.
Figure 30:
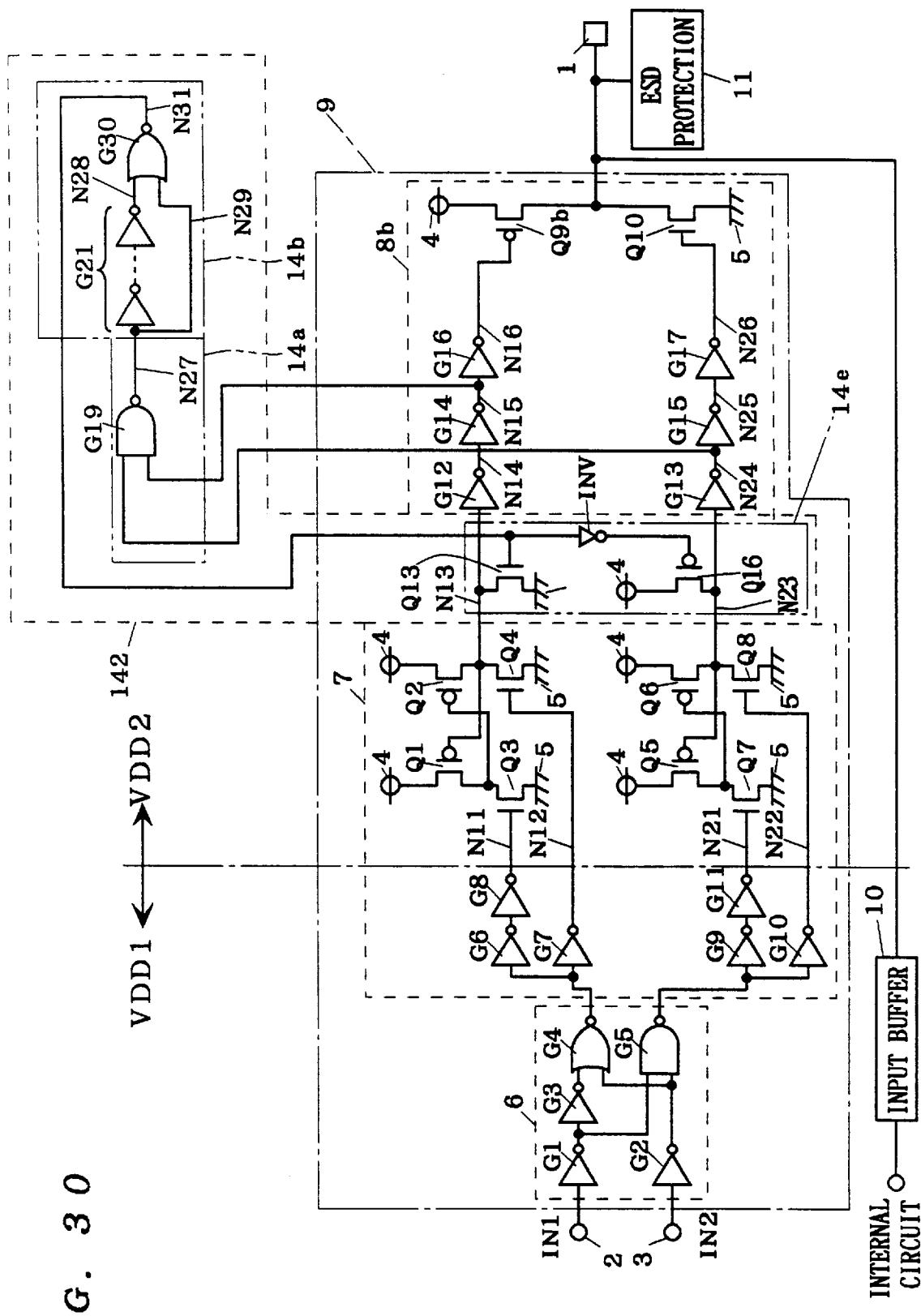

FIG. 29 and FIG. 30 show constitutions of modifications by the same concept as in the modifications shown in FIG. 4 and FIG. 5 executed also in this embodiment.

Hence, in the modified examples of the ninth preferred embodiment, the same effects as in the modified examples of the first preferred embodiment may be obtained.

Tenth preferred embodiment

Figure 31:
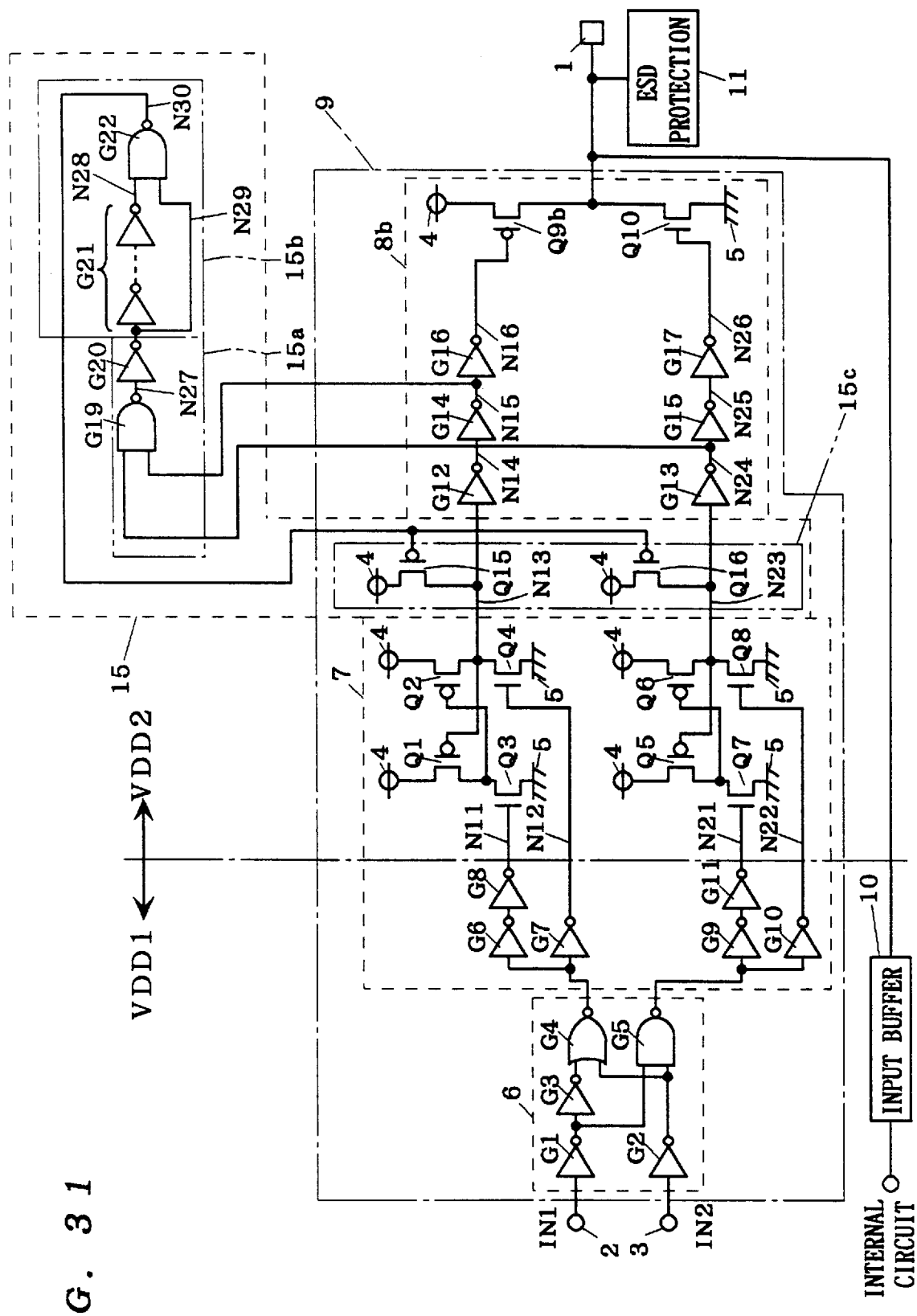
FIG. 31 is a circuit diagram showing a constitution of a tenth preferred embodiment of the invention.

FIG. 31 is a circuit diagram showing the constitution of input and output circuit of a semiconductor integrated circuit device with signal level converting function in a tenth preferred embodiment of the present invention. In the circuit shown herein, the buffer circuit 8a in the fourth preferred embodiment is replaced by a buffer circuit 8b. Therefore the tenth preferred embodiment also has the same effects as the fourth preferred embodiment.

Figure 32:
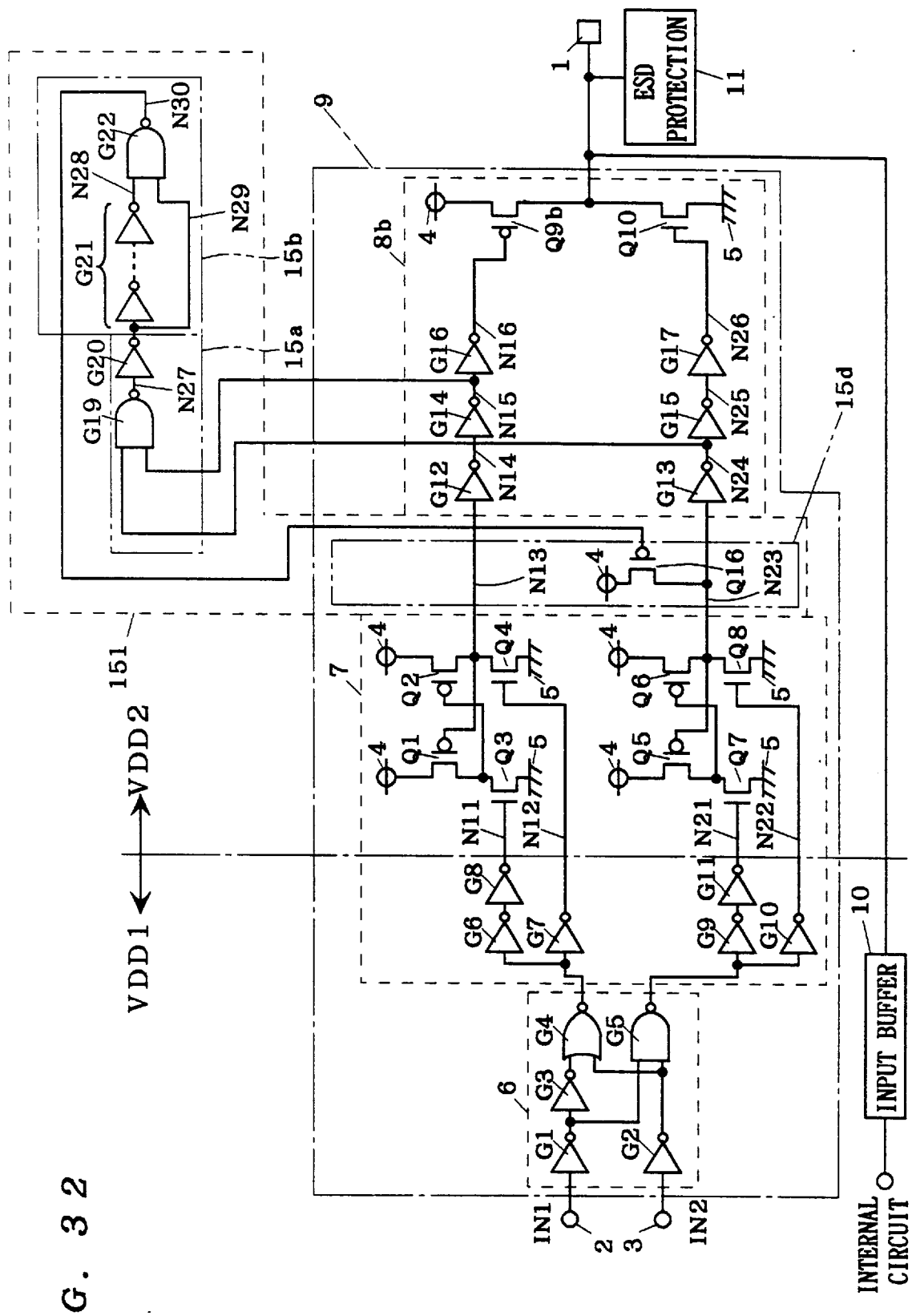
FIG. 32 is a circuit diagram showing a constitution of a modification of the tenth preferred embodiment of the invention.

FIG. 32 shows a constitution of a modification by the same concept as in the modification shown in FIG. 15 executed also in this embodiment.

Hence, in the modified example of the tenth preferred embodiment, the same effects as in the modified example of the fourth preferred embodiment may be obtained.

Eleventh preferred embodiment

Figure 33:
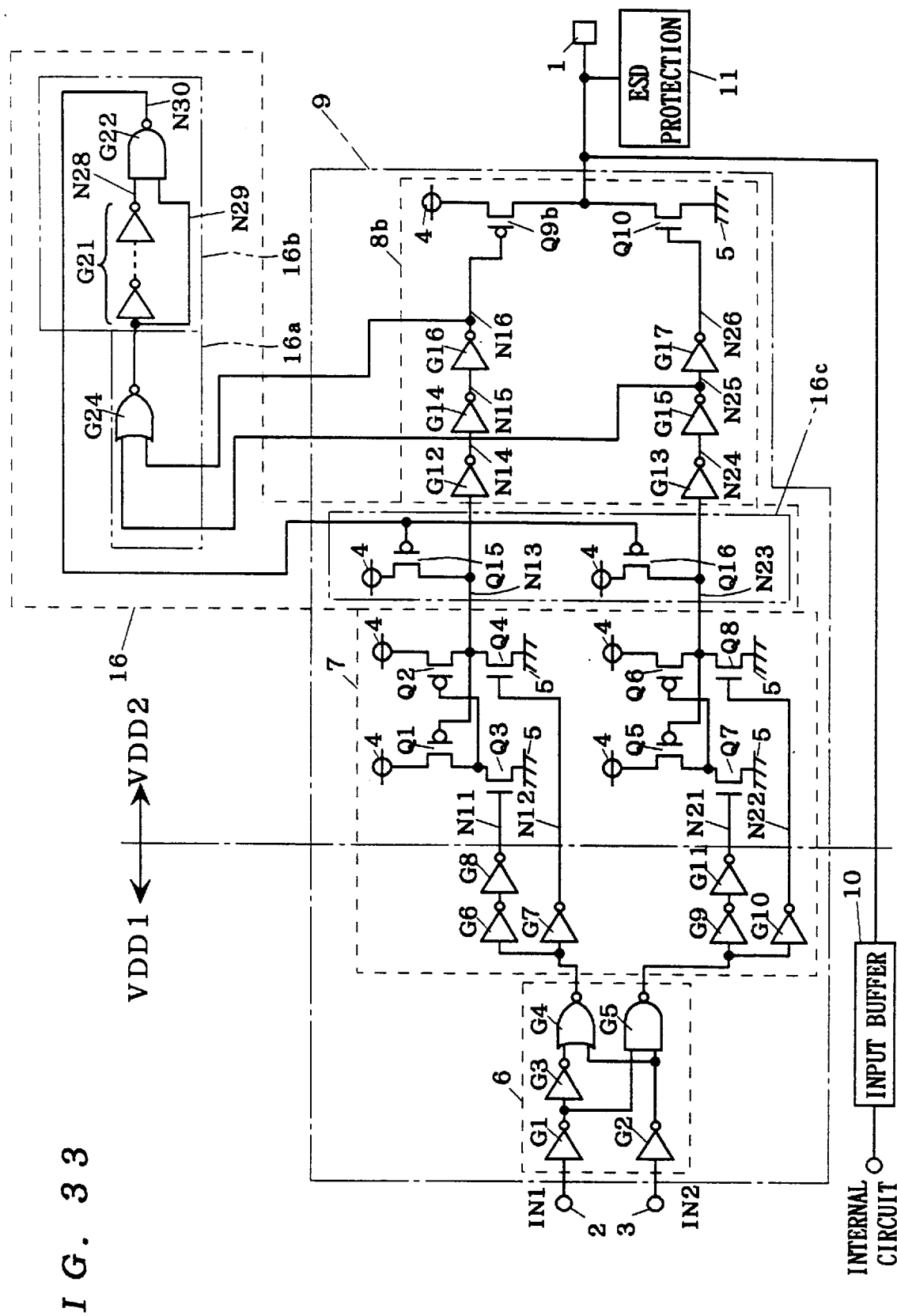
FIG. 33 is a circuit diagram showing a constitution of an eleventh preferred embodiment of the invention.

FIG. 33 is a circuit diagram showing the constitution of input and output circuit of a semiconductor integrated circuit device with signal level converting function in an eleventh preferred embodiment of the present invention. In the circuit shown herein, the buffer circuit 8a in the fifth preferred embodiment is replaced by a buffer circuit 8b. Therefore the eleventh preferred embodiment also has the same effects as the fifth preferred embodiment.

Figure 34:
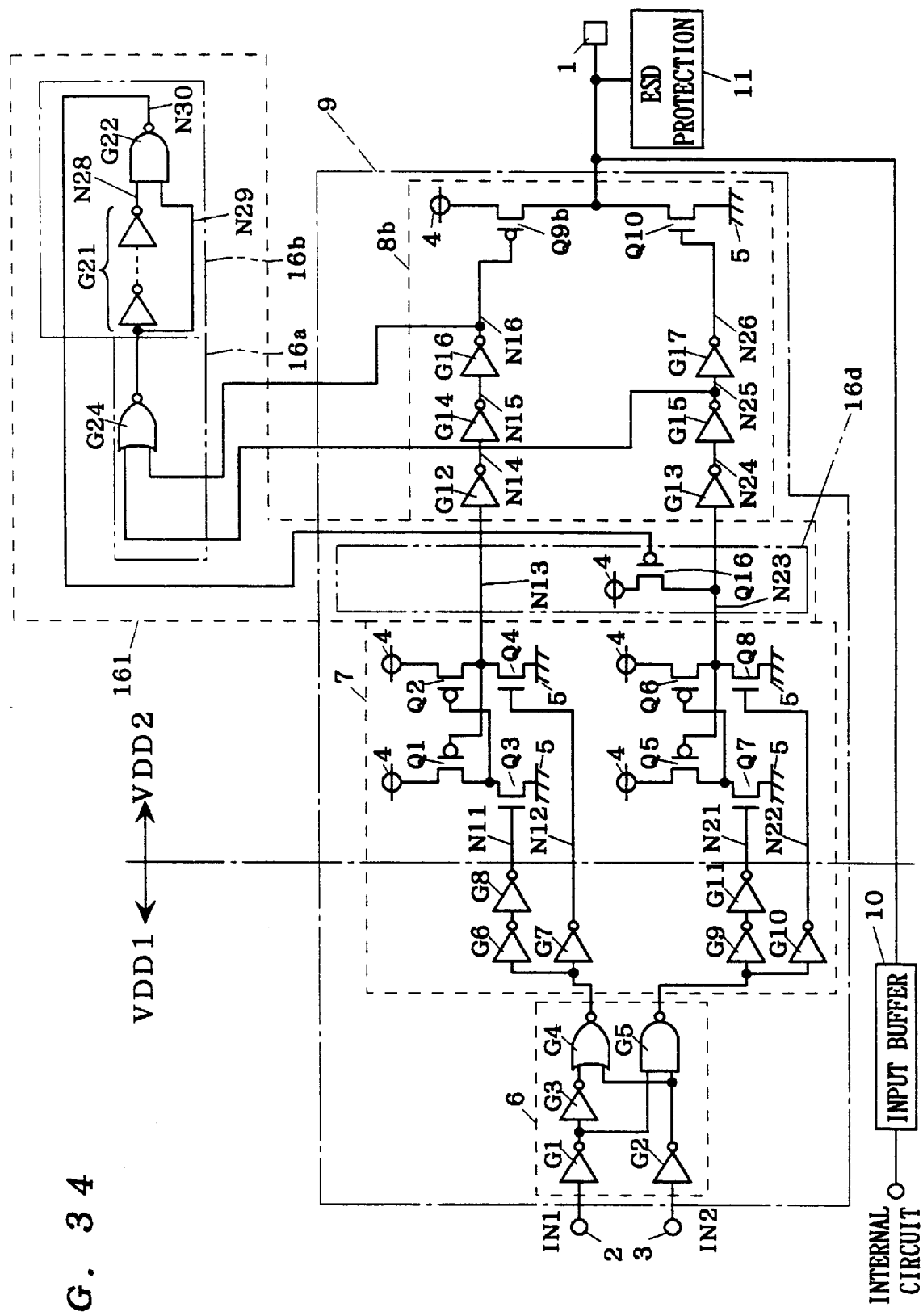
FIG. 34 is a circuit diagram showing a constitution of a modification of the eleventh preferred embodiment of the invention.

FIG. 34 shows a constitution of a modification by the same concept as in the modification shown in FIG. 15 executed also in this embodiment.

Hence, in the modified example of the eleventh preferred embodiment, the same effects as in the modified example of the fourth preferred embodiment may be obtained.

Twelfth preferred embodiment

Figure 35:
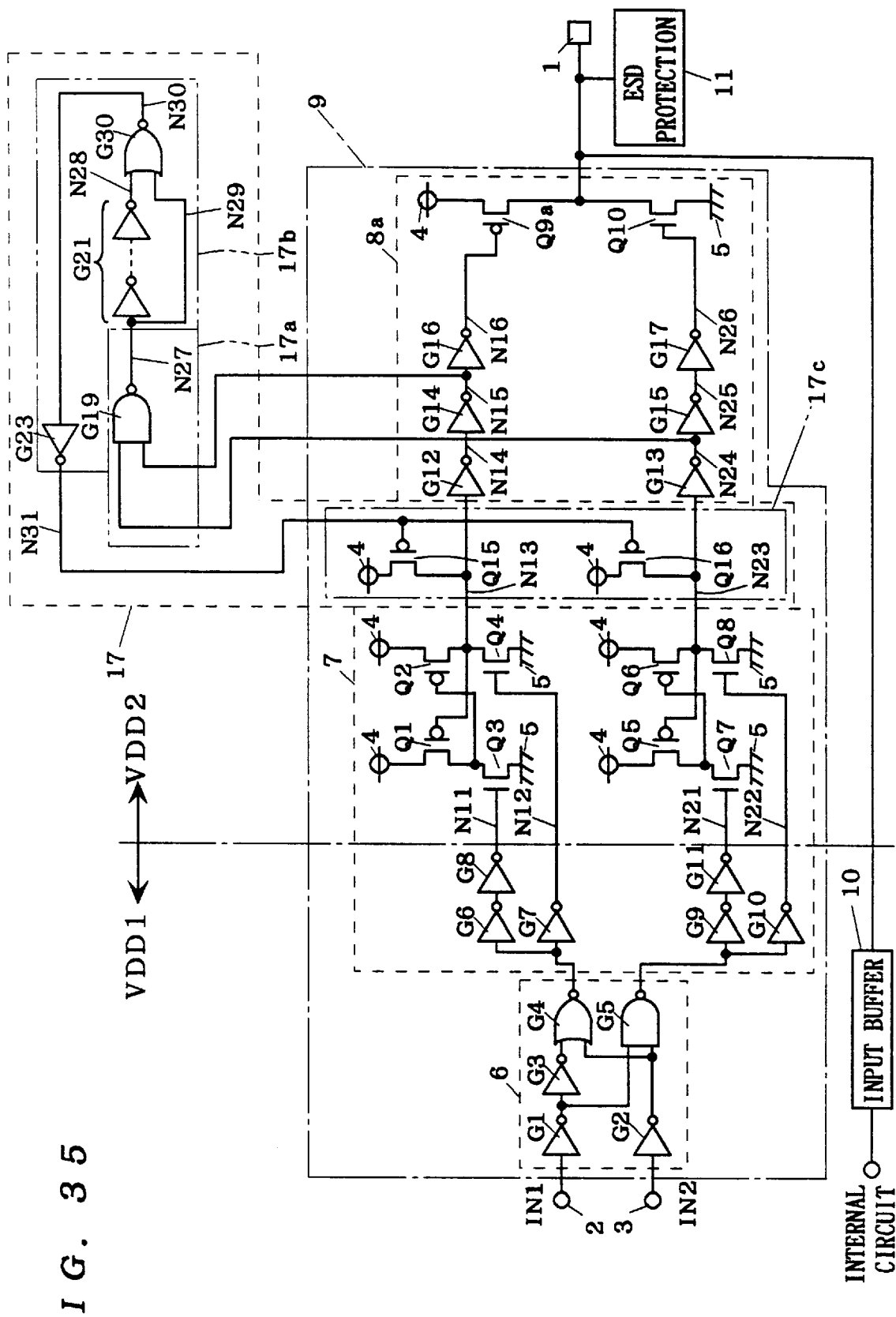
FIG. 35 is a circuit diagram showing a constitution of a twelfth preferred embodiment of the invention.

FIG. 35 is a circuit diagram showing the constitution of input and output circuit of a semiconductor integrated circuit device with signal level converting function in a twelfth preferred embodiment of the present invention. In the circuit shown herein, the buffer circuit 8a in the sixth preferred embodiment is replaced by a buffer circuit 8b. Therefore the twelfth preferred embodiment also has the same effects as the sixth preferred embodiment.

FIG. 36 shows a constitution of a modification by the same concept as in the modification shown in FIG. 15 executed also in this embodiment.

Hence, in the modified example of the twelfth preferred embodiment, the same effects as in the modified example of the fourth preferred embodiment may be obtained.

Thirteenth preferred embodiment

Figure 37:
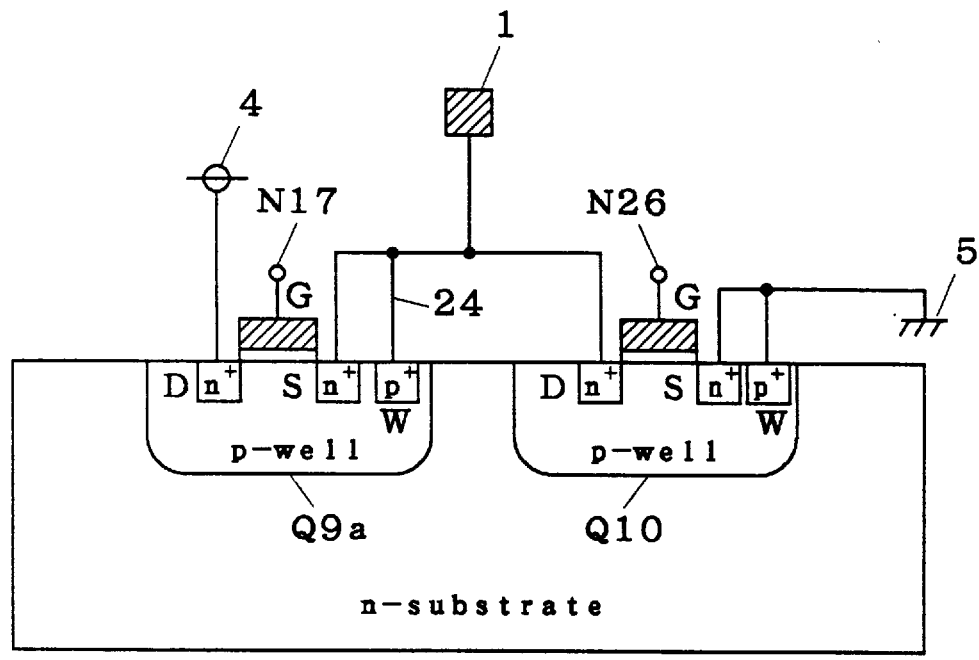
FIG. 37 is a circuit diagram showing a constitution of a thirteenth preferred embodiment of the invention.
Figure 46:
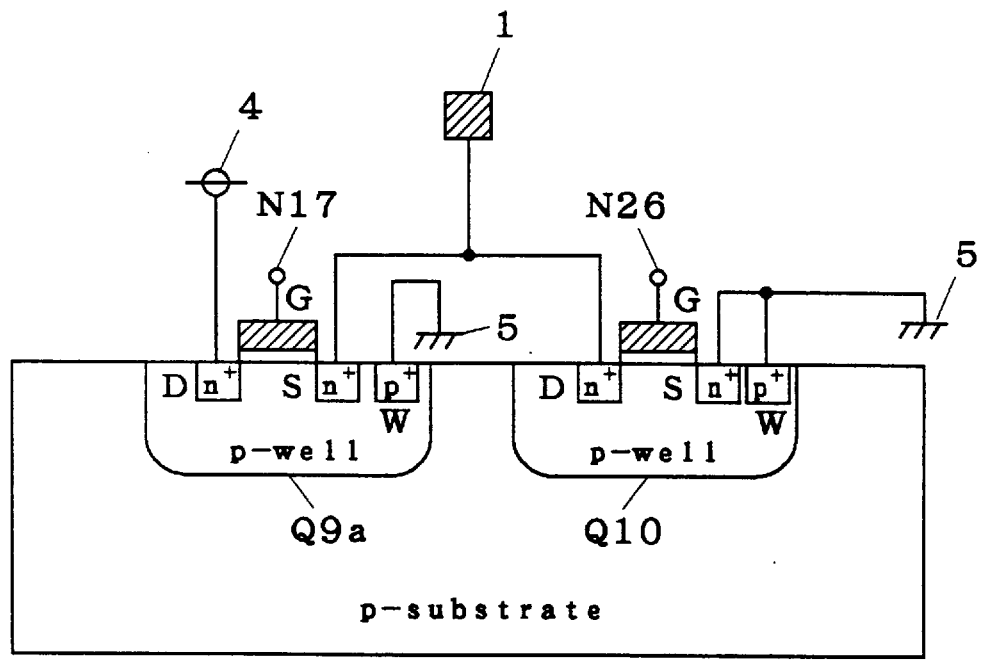
FIGS. 46 and 47 are sectional views showing constitutions of prior arts.
Figure 47:
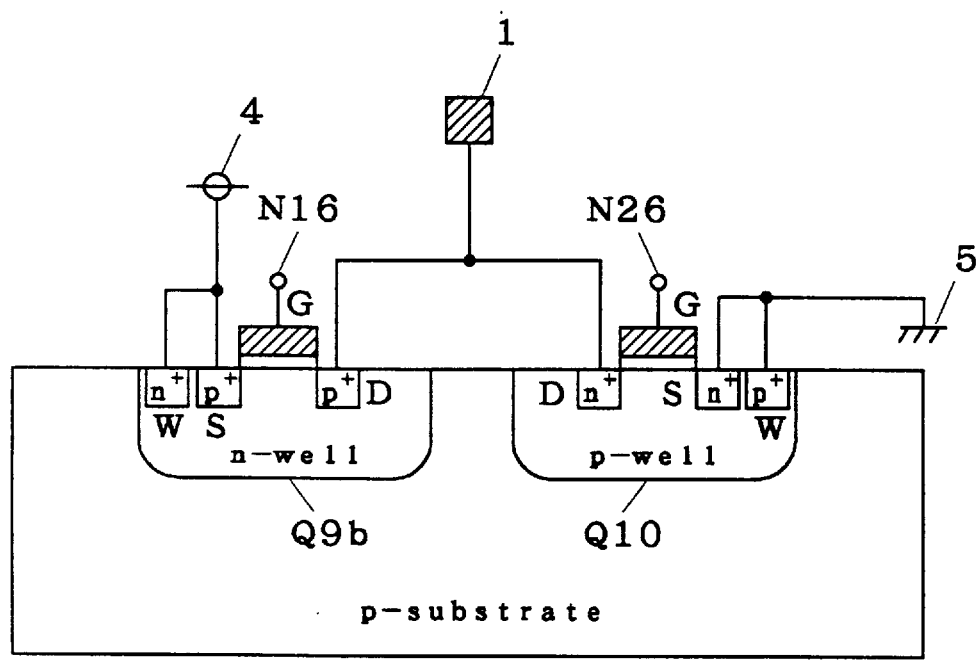

FIG. 37 is a sectional view showing the constitution of an output buffer circuit in a thirteenth preferred embodiment of the present invention, relating to the structure of the NMOS transistors Q9a, Q10 for composing the NMOS push-pull buffer commonly shown in FIG. 46 and in the first to sixth preferred embodiments.

On an n-type semiconductor substrate biased to the first supply potential VDD1, a pair of p-wells in which NMOS transistors Q9a, Q10 respectively provided are formed. In each well, a pair of n+regions to be used as source S and drain D, and a p+ region to be used as well electrode W for determining the well potential of the p-well are provided.

The source S of the NMOS transistor Q9a is connected to the input and output terminal 1, the gate electrode G to the connection point N17, and the drain D to the supply potential point 4, respectively. By a metal wiring 24, the well electrode W and input and output terminal 1 are connected. The source S and well electrode W of the NMOS transistor Q10 are commonly connected to the grounding potential point 5, the gate electrode G to the connection point N26, and the drain D to the input and output terminal 1, respectively.

In the constitution using thus composed NMOS transistors Q9a, Q10, the well potential of the transistor Q9a is held at the same potential as the input and output terminal 1, and therefore a bias voltage is not applied between the source S and p-well. Hence, when outputting H level to the input and output terminal 1, the bias voltage is not applied, the potential at the input and output terminal 1 is (VDD2−VTN) (V), so that the output potential of H level can be higher than in the background art. Therefore, the potential difference corresponding to the complementary logic levels H, L can be expanded.

Fourteenth preferred embodiment

Figure 38:
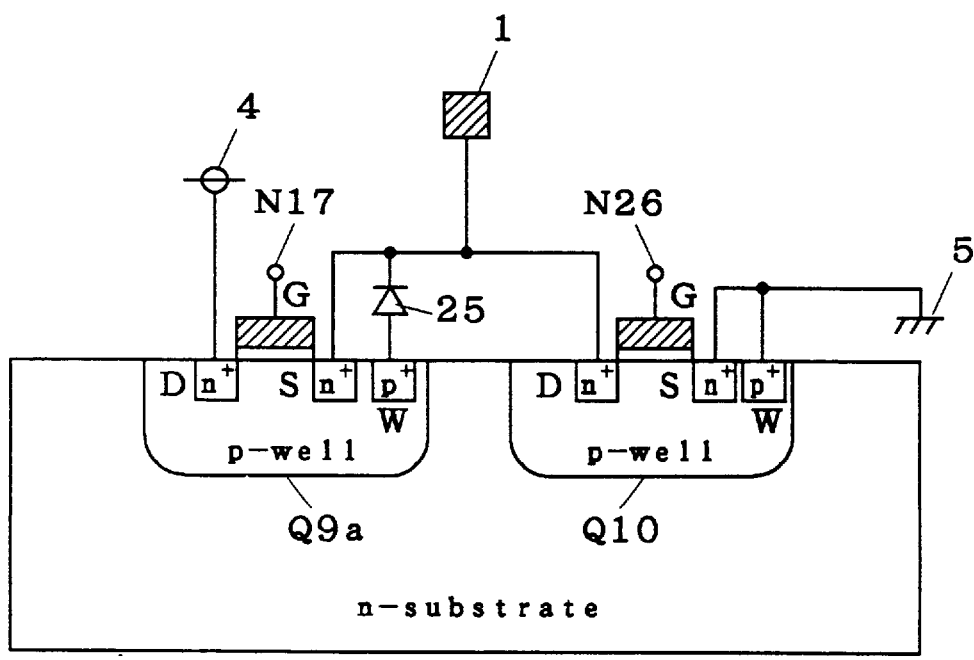
FIG. 38 is a circuit diagram showing a constitution of a fourteenth preferred embodiment of the invention.

FIG. 38 is a sectional view showing the constitution of an output buffer circuit in a fourteenth preferred embodiment of the present invention, in which the metal wiring 24 in the structure of the thirteenth preferred embodiment shown in FIG. 37 is replaced by a diode 25. The anode of the diode 25 is connected to the well electrode W of the NMOS transistor Q9a, and the cathode is connected to the input and output terminal 1.

When the well electrode W of the NMOS transistor Q9a and the input and output terminal 1 are connected with the metal wiring 24 as in the thirteenth embodiment, if a signal more than the potential of the n type semiconductor substrate is given to the input and output terminal 1, the parasitic pn junction between the p-well of the NMOS transistor Q9a and the n type semiconductor substrate is normally biased. Accordingly, for example, in the state of the n type semiconductor substrate biased to the first supply potential VDD1, when the input and output terminal 1 outputs H level which is nearly the second supply potential VDD2, unnecessary current flows toward the power source for giving the first supply potential VDD1 in the sequence of the metal wiring 24, well electrode W, p-well, and n type semiconductor substrate from the input and output terminal 1.

Such current can occur not only when the buffer circuit 8a gives an output signal to the input and output terminal 1, but also when a signal is given from an external device into the input and output terminal 1. That is, when the potential of the signal given from the external device into the input and output terminal 1 is higher than the potential of the n type semiconductor substrate, the pn junction is normally biased, and undesired current flows from the input and output terminal 1 into the n type semiconductor substrate.

According to the fourteenth preferred embodiment, such undesired current can be arrested because the diode 25 is connected so that its forward direction may be directed to the reverse direction of parasitic pn junction.

Fifteenth preferred embodiment

Figure 39:
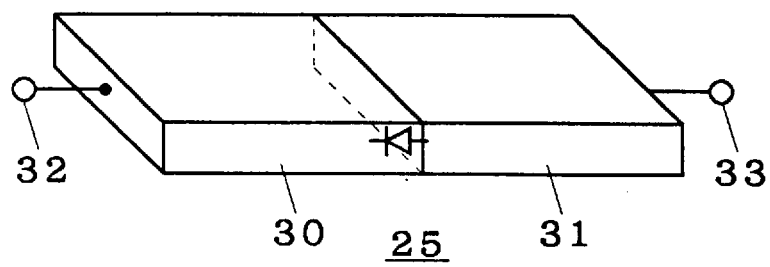
FIG. 39 is a circuit diagram showing a constitution of a fifteenth preferred embodiment of the invention.

FIG. 39 is a conceptual diagram of constitution of a fifteenth preferred embodiment of the present invention, showing the diode 25 provided in the fourteenth preferred embodiment. An n type polysilicon layer 30 and a p type polysilicon layer 31 form a pn junction, and terminals 32, 33 are connected respectively to the n type polysilicon layer 30 and p type polysilicon layer 31, and they function as cathode and anode of the diode 25, respectively.

In this preferred embodiment, an example of forming method of the diode 25 shown in the fourteenth preferred embodiment is presented, and the n type polysilicon layer 30 and p type polysilicon layer 31 are desired to be formed, for example, above, separately from the n type semiconductor substrate shown in FIG. 38. This is because an undesired current pass may be formed in unnecessary forward bias condition when the diode 25 is formed in the n type semiconductor substrate.

Sixteenth preferred embodiment

Figure 40:
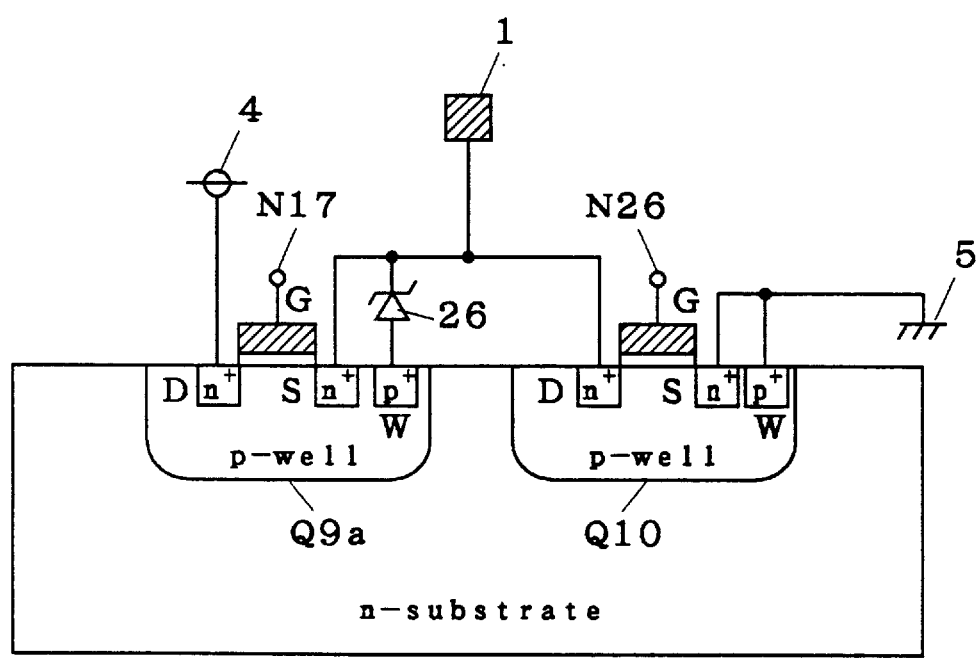
FIG. 40 is a circuit diagram showing a constitution of a sixteenth preferred embodiment of the invention.

FIG. 40 is a sectional view of constitution of an output buffer circuit in a sixteenth preferred embodiment of the present invention, showing the structure similar to the fourteenth preferred embodiment given in FIG. 16, except that the diode 25 is replaced by a zener diode 26. The anode of the zener diode 26 is connected to the well electrode W of the NMOS transistor Q9a, and the cathode is connected to the input and output terminal 1.

By using the zener diode 26 as in this preferred embodiment, since it is connected so that its forward direction may be directed to the reverse direction of the parasitic pn junction, unnecessary current can be blocked.

Seventeenth preferred embodiment

Figure 41:
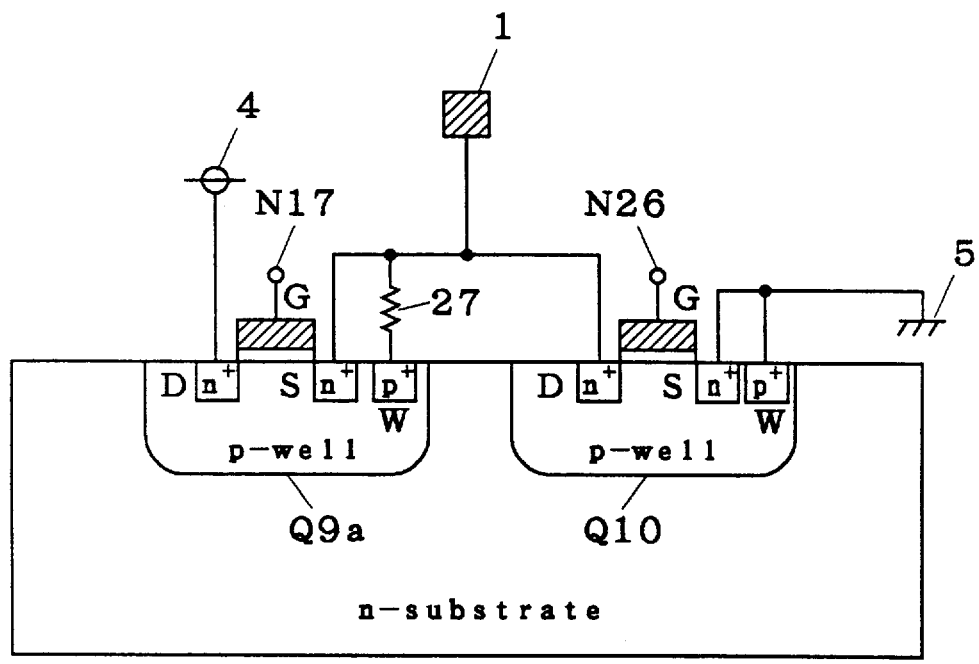
FIG. 41 is a circuit diagram showing a constitution of a seventeenth preferred embodiment of the invention.

FIG. 41 is a sectional view of constitution of an output buffer circuit in a seventeenth preferred embodiment of the present invention, showing the structure similar to the fourteenth preferred embodiment given in FIG. 38, except that the diode 25 is replaced by a resistance 27. That is, the well electrode W of the NMOS transistor Q9a and the input and output terminal 1 are mutually connected through the resistance 27.

When the signal potential at the input and output terminal 1 is higher than the potential of the n type semiconductor substrate, the unnecessary current flowing due to forward biasing of the parasitic pn junction is restricted of its magnitude by the resistance 27.

Eighteenth preferred embodiment

Figure 42:
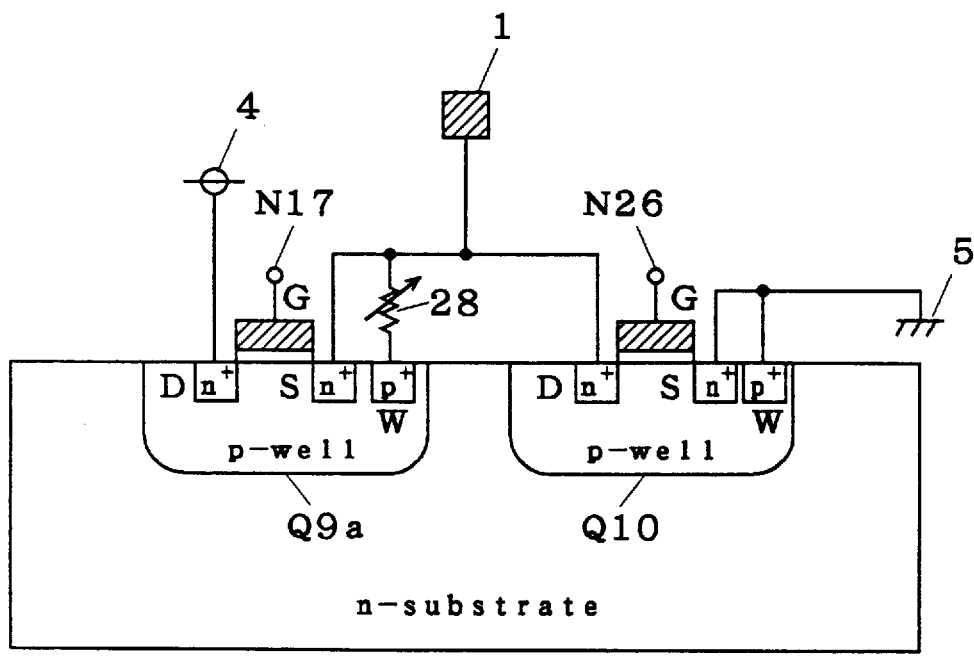
FIG. 42 is a circuit diagram showing a constitution of an eighteenth preferred embodiment of the invention.

FIG. 42 is a sectional view of constitution of an output buffer circuit in an eighteenth preferred embodiment of the present invention, showing the structure similar to the seventeenth preferred embodiment given in FIG. 41, except that the resistance 27 is replaced by a variable resistor 28. Since the current amount flowing from the input and output terminal 1 of the NMOS transistor Q9a into the well electrode W is suppressed by the variable resistor 28, the unnecessary current flowing in the sequence of the metal wiring 24, well electrode W, p-well, and n type semiconductor substrate from the input and output terminal 1 (FIG. 37) can be suppressed.

Nineteenth preferred embodiment

Figure 44:
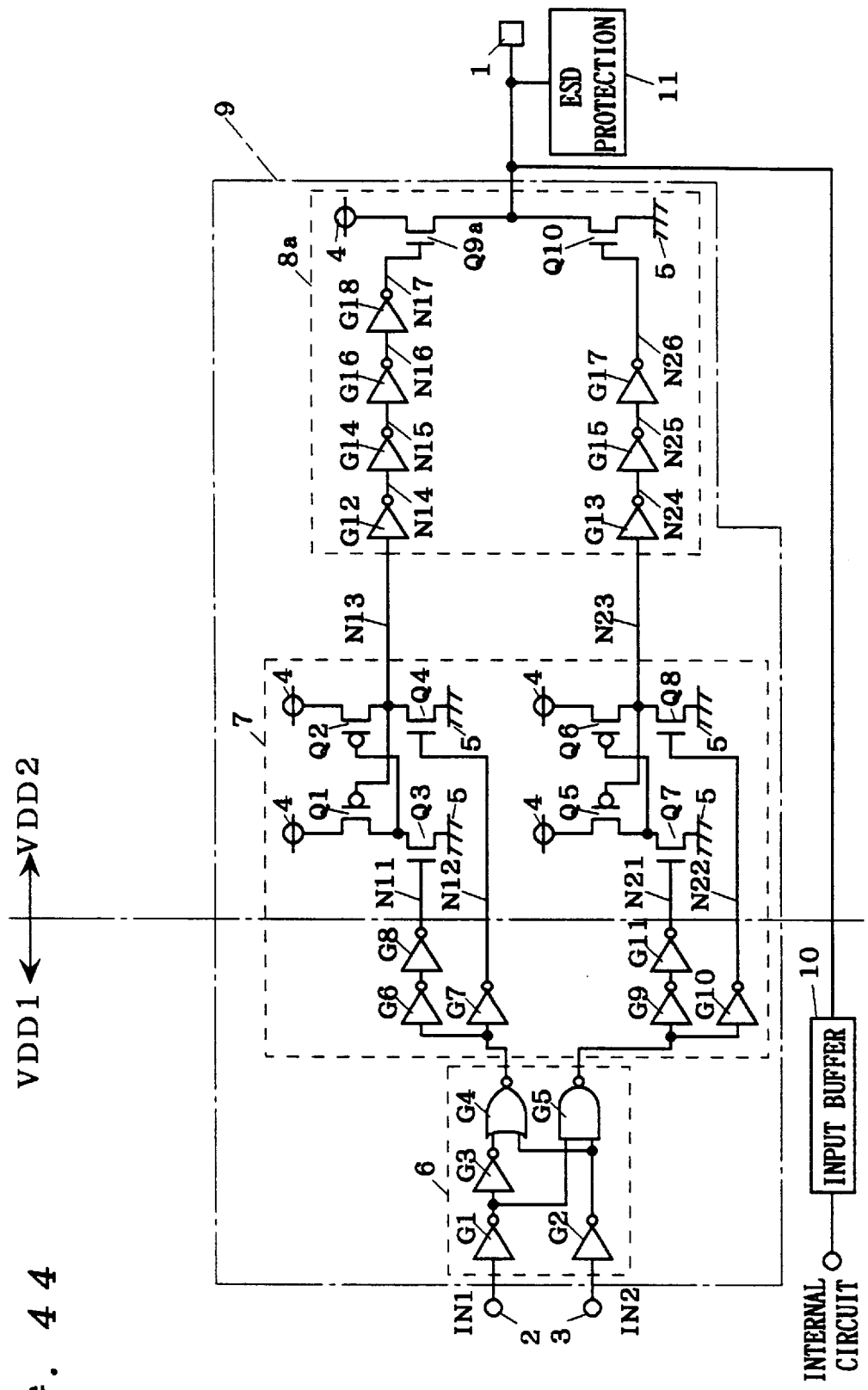
FIG. 44 is a circuit diagram showing an example of a constitution of a prior art.
Figure 45:
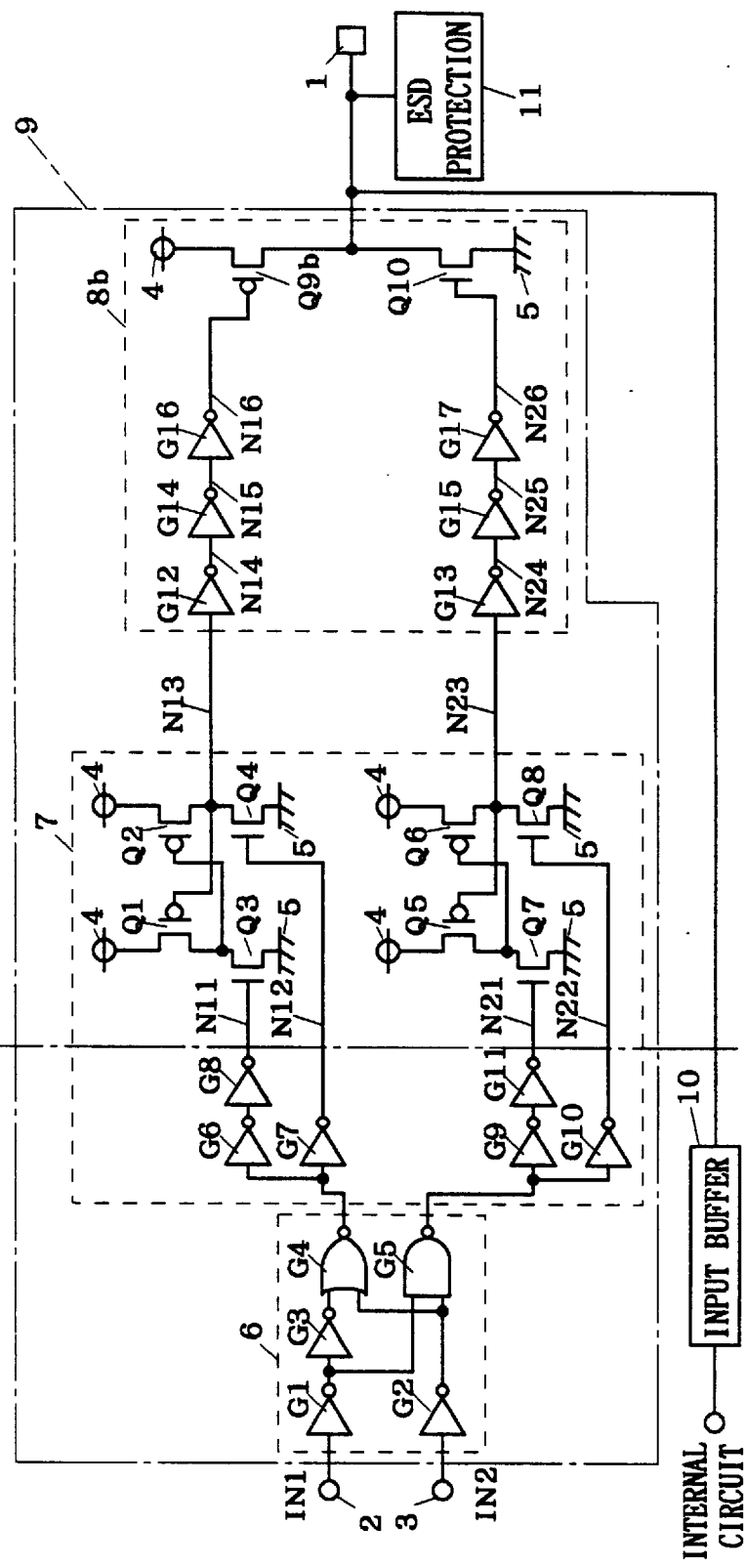
FIG. 45 is a circuit diagram showing other example of a constitution of a prior art.

FIG. 43 is a circuit diagram showing the constitution of an output buffer circuit in a nineteenth preferred embodiment of the present invention. The structure has a variable resistor 29 with a control end added to the background art shown in FIG. 44. However, the portion of the inner circuit side from the rear half of the signal level converting circuit 7 is appropriately omitted in the drawing.

The variable resistor 29 is controlled of its resistance value by the potential given to its control end. The variable resistor 29 is connected between the back gate (corresponding to the p-well in the thirteenth to eighteenth preferred embodiments) of the NMOS transistor Q9a and the input and output terminal 1. The control end of the variable resistor 29 is connected to the connection point N11.

The resistance value of the variable resistor 29 is variable, being controlled by the potential given to its control end. Hence, the resistance value is set low when a potential corresponding to the logic of H level is given, and high when a potential corresponding to the logic of L level is given, so that the potential of the H level given to the input and output terminal 1 is prevented from declining by preventing the bias voltage from being applied between the back gate and source when the NMOS transistor Q9a is turned on, and when the NMOS transistor Q9a is turned off, the current flowing in the parasitic pn junction of the p-well and n type semiconductor substrate is suppressed.

That is, when the input and output circuit is in input state, the resistance value is kept high, and when in output state, the resistance value of the variable resistor 29 is lowered to a desired value, so that effects on the output may be avoided.

Of course, the control end of the variable resistor 29 may be connected not to the connection point N11, but to other position giving the same logic, for example, the connection points N13, N15, N17, and input end of the inverter gate G7.

While the invention has been shown and described in detail, the foregoing description is in all aspects illustrative and not restrictive. It is therefore understood that numerous modifications and variations can be devised without departing from the scope of the invention.

We claim:

1. An output buffer comprising:
   (a) first and second potential points for applying first and second potentials respectively;
   (b) an output point;
   (c) a first conductive control element having a control end given a third potential corresponding to either binary logic, for conducting and not conducting between said first potential point and said output point, when said third potential corresponds to a first logic and its complementary second logic, respectively;
   (d) a second conductive control element having a control end given a fourth potential corresponding to either binary logic, for conducting and not conducting between said second potential and said output point, when said fourth potential corresponds to a third logic and its complementary fourth logic, respectively;
   (e) detecting penetration current causing logic means for outputting a penetration detection signal activated when said third and fourth potentials correspond to said first and third logics, respectively; and
   (f) forced logic presenting means fulfilling at least either one of a first logic presenting function for presenting by force said second logic to said control end of said first conductive control element, and a second logic presenting function for presenting by force said fourth logic to said control end of said second conductive control element, on the basis of activation of said penetration detection signal.

2. An output buffer circuit of claim 1, wherein said first logic and said third logic are in a mutually complementary relation.

3. An output buffer circuit of claim 2, wherein said forced logic presenting means includes:
   (f-1) a first switch having one end connected to said control end of said first conductive control element, and other end provided with a fifth potential corresponding to said second logic, thereby conducting according to the activation of said penetration detection signal.

4. An output buffer circuit of claim 3, wherein said forced logic presenting means further includes:
   (f-2) a second switch having one end connected to said control end of said second conductive control element, and other end provided with said fifth potential, thereby conducting according to the activation of said penetration detection signal.

5. An output buffer circuit of claim 3, wherein said forced logic presenting means further includes:
   (f-2) a second switch having one end connected to said control end of said second conductive control element, and other end provided with a sixth potential corresponding to said fourth logic, thereby conducting according to the activation of said penetration detection signal.

6. An output buffer circuit of claim 2, wherein said forced logic presenting means includes:
   (f-1) a first switch having one end connected to said control end of said second conductive control element, and other end provided with a fifth potential corresponding to said fourth logic, thereby conducting according to the activation of said penetration detection signal.

7. An output buffer circuit of claim 6, wherein said forced logic presenting means further includes:
   (f-2) a second switch having one end connected to said control end of said first conductive control element, and other end provided with said fifth potential, thereby conducting according to the activation of said penetration detection signal.

8. An output buffer circuit of claim 2, wherein said first conductive control element includes:
   (c-1) a first MOS transistor of first conductive type having a gate, and a pair of electrodes connected to said first potential point and output point;
   (c-2) a first number of inverter gates connected in series between said control end of said first conductive control element and said gate of said first MOS transistor,
   said second conductive control element includes:
   (d-1) a second MOS transistor of said first conductive type having a gate, and a pair of electrodes connected to said second potencial point and said output point; and
   (d-2) a second number of inventer gates conneced in series between said control end of said second conductive control element and said gate of said second MOS transistor, and
   said second number has a difference of an odd number from said first number.

9. An output buffer circuit of claim 8, wherein said detecting penetration current causing logic means includes a logic gate for outputting a logical product of a same logic as the logic corresponding to said third potential, and a complementary logic to the logic corresponding to said fourth potential as said penetration detection signal, and
   said forced logic presenting means fulfills said first logic presenting function when receiving the same logic as the logic corresponding to said penetration detection signal.

10. An output buffer circuit of claim 8, wherein said detecting penetration current causing logic means includes a logic gate for outputting the inversion of a logical sum of the logic complementary to the logic corresponding to said third potential, and the same logic as the logic corresponding to said fourth potential as said penetration detection signal, and
    said forced logic presenting means fulfills said first logic presenting function when receiving the same logic as the logic corresponding to said penetration detection signal.

11. An output buffer circuit of claim 8, wherein said detecting penetration current causing logic means includes a logic gate for outputting the inversion of a logical product of the same logic as the logic corresponding to said third potential, and the complementary logic to the logic corresponding to said fourth potential as said detection signal, and
    said forced logic presenting means fulfills said first logic presenting function when receiving the complementary logic to the logic corresponding to said detection signal.

12. An output buffer circuit of claim 8, wherein said detecting penetration current causing logic means includes a logic gate for outputting a logical product of the same logic as the logic corresponding to said third potential, and the complementary logic to the logic corresponding to said fourth potential as said detection signal, and
    said forced logic presenting means fulfills said second logic presenting function when receiving the complementary logic to the logic corresponding to said detection signal.

13. An output buffer circuit of claim 8, wherein said detecting penetration current causing logic means includes a logic gate for outputting an inversion of a logical sum of the complementary logic to the logic corresponding to said third potential, and the same logic as the logic corresponding to said fourth potential as said detection signal, and
    said forced logic presenting means fulfills said second logic presenting function when receiving the complementary logic to the logic corresponding to said detection signal.

14. An output buffer circuit of claim 8, wherein said detecting penetration current causing logic means includes a logic gate for outputting an inversion of a logical product of the same logic as the logic corresponding to said third potential, and the complementary logic to the logic corresponding to said fourth potential as said detection signal, and
    said forced logic presenting means fulfills said second logic presenting function when receiving the same logic as the logic corresponding to said detection signal.

15. An output buffer circuit of claim 2, wherein said first conductive control element includes:

(c-1) a first MOS transistor of first conductive type having a gate, and a pair of electrodes connected to said first potential point and said output point;

(c-2) a first number of inverter gates connected in series between said control end of said first conductive control element and said gate of said first MOS transistor, said second conductive control element includes:

(d-1) a second MOS transistor of a second conductive type complementary to said first conductive type having a gate, and a pair of electrodes connected to said second potential point and said output point; and (d-2) a second number of inverter gates connected in series between said control end of said second conductive control element and said gate of said second MOS transistor, and said second number has a difference of an even number from said first number.

16. An output buffer circuit of claim 15, wherein said detecting penetration current causing logic means includes a logic gate for outputting a logical product of a same logic as the logic corresponding to said third potential, and a complementary logic to the logic corresponding to said fourth potential as said detection signal, and said forced logic presenting means fulfills said first logic presenting function when receiving the same logic as the logic corresponding to said detection signal.

17. An output buffer circuit of claim 15, wherein said detecting penetration current causing logic means includes a logic gate for outputting an inversion of a logical sum of the logic complementary to the logic corresponding to said third potential, and the same logic as the logic corresponding to said fourth potential as said detection signal, and said forced logic presenting means fulfills said first logic presenting function when receiving the same logic as the logic corresponding to said detection signal.

18. An output buffer circuit of claim 15, wherein said detecting penetration current causing logic means includes a logic gate for outputting an inversion of a logical product of the same logic as the logic corresponding to said third potential, and the complementary logic to the logic corresponding to said fourth potential as said detection signal, and said forced logic presenting means fulfills said first logic presenting function when receiving the complementary logic to the logic corresponding to said detection signal.

19. An output buffer circuit of claim 15, wherein said detecting penetration current causing logic means includes a logic gate for outputting a logical product of the same logic as the logic corresponding to said third potential, and the complementary logic to the logic corresponding to said fourth potential as said detection signal, and said forced logic presenting means fulfills said second logic presenting function when receiving the complementary logic to the logic corresponding to said detection signal.

20. An output buffer circuit of claim 15, wherein said detecting penetration current causing logic means includes a logic gate for outputting an inversion of a logical sum of the complementary logic to the logic corresponding to said third potential, and the same logic as the logic corresponding to said fourth potential as said detection signal, and said forced logic presenting means fulfills said second logic presenting function when receiving the complementary logic to the logic corresponding to said detection signal.

21. An output buffer circuit of claim 15, wherein said detecting penetration current causing logic means includes a logic gate for outputting an inversion of a logical product of the same logic as the logic corresponding to said third potential, and the complementary logic to the logic corresponding to said fourth potential as said detection signal, and said forced logic presenting means fulfills said second logic presenting function when receiving the same logic as the logic corresponding to said detection signal.

22. An output buffer circuit of claim 1, further comprising:

(g) a signal level converting circuit for applying said third and fourth potentials on the basis of at least one first signal taking a binary logic in a first power source level system, wherein said first to fourth potentials correspond to any of binary logic in a second power source level system different from said first power source level system.

23. An output buffer circuit of claim 22, further comprising:

(h) an output control unit for receiving a pair of second signals for taking binary logic in said first power source level system, and outputting said first signal, wherein the pair of said third and fourth potentials correspond to, by said second signals, the pair of said first and fourth logics, the pair of said second and third logics, or the pair of said second and fourth logics.

24. An output buffer circuit of claim 22, wherein said signal level converting circuit includes:

(g-1) a front half for performing a logic processing of said first signal, being composed of plural MOS transistors; and (g-2) a rear half for applying said third and fourth potentials, being composed of plural MOS transistors, said second power source level system is larger in potential difference than said first power source level system, and the gate insulation films of said MOS transistors for composing said rear half are thicker than the gate insulation films of said MOS transistors composing said front half.

25. An output buffer circuit of claim 1, further comprising:

(g) an input buffer connected to said output point.

26. An output buffer circuit of claim 1, further comprising:

(g) an electrostatic protective circuit connected to said output point.

27. An output buffer circuit of claim 1, further comprising:

(g) condition adding means for fulfilling a function of said forced logic presenting means only when said detection circuit is activated for more than a specific time.

28. An output buffer circuit of claim 27, wherein said condition adding means includes:
- (g-1) a delay element for delaying said detection signal by said specified time, and outputting a delayed detection signal;
- (g-2) a logic gate for activating when both logic corresponding to said detection signal, and logic corresponding to said delayed detection signal are in a specific logic.

29. An output buffer circuit of claim 28, wherein said delay element is composed of an even number of inverter gates.

* * * * *